US012813118B2

(12) United States Patent
Yamazaki et al.

(10) Patent No.: US 12,813,118 B2
(45) Date of Patent: Nov. 24, 2026

(54) DISPLAY APPARATUS AND MANUFACTURING METHOD OF DISPLAY APPARATUS

(71) Applicant: Semiconductor Energy Laboratory Co., Ltd., Kanagawa-ken (JP)

(72) Inventors: Shunpei Yamazaki, Tokyo (JP); Hiroki Adachi, Tochigi (JP); Satoru Idojiri, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 787 days.

(21) Appl. No.: 17/750,570

(22) Filed: May 23, 2022

(65) Prior Publication Data

US 2022/0384398 A1 Dec. 1, 2022

(30) Foreign Application Priority Data

May 27, 2021 (JP) ................................ 2021-089418

(51) Int. Cl.
*H10K 59/18* (2023.01)
*H10H 20/852* (2025.01)
(Continued)

(52) U.S. Cl.
CPC ........... *H10K 59/18* (2023.02); *H10H 20/852* (2025.01); *H10K 59/35* (2023.02); *H10K 71/00* (2023.02);
(Continued)

(58) Field of Classification Search
CPC ........ H10K 59/18; H10K 59/35; H10K 59/19; H10K 59/12; H10K 59/86; H10K 59/80;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-036385 A 2/2000
JP 2003-059663 A 2/2003
(Continued)

OTHER PUBLICATIONS

Zakhidov, A. et al., "Orthogonal processing: A new strategy for organic electronics," Chem. Sci. (Chemical Science), Apr. 7, 2011, vol. 2, No. 6, pp. 1178-1182.
(Continued)

*Primary Examiner* — Jessica S Manno
*Assistant Examiner* — Sandra Milena Rodriguez Villanu
(74) *Attorney, Agent, or Firm* — Husch Blackwell LLP

(57) ABSTRACT

A novel display apparatus that is highly convenient or reliable is provided. Alternatively, a novel input/output device that is highly convenient or reliable is provided. The display apparatus is configured in the following manner: the periphery of end surfaces of a plurality of display panels is processed by laser light and the display panels are joined together so that unevenness is not generated at a boundary between the adjacent display panels and the outermost surface of the display apparatus is flat.

5 Claims, 28 Drawing Sheets

(51) Int. Cl.

| | |
|---|---|
| ***H10K 59/35*** | (2023.01) |
| ***H10K 71/00*** | (2023.01) |
| ***H10W 90/00*** | (2026.01) |
| *G09G 3/00* | (2006.01) |
| *G09G 3/32* | (2016.01) |
| *H10K 59/65* | (2023.01) |

(52) U.S. Cl.

CPC ............ *H10W 90/00* (2026.01); *G09G 3/035* (2020.08); *G09G 3/32* (2013.01); *G09G 2300/0426* (2013.01); *G09G 2300/0809* (2013.01); *G09G 2320/0626* (2013.01); *H10K 59/65* (2023.02)

(58) Field of Classification Search

CPC .. H10K 71/00; H10K 2102/311; H10K 50/00; H10K 50/10; H10K 50/11; H10K 77/10; G09G 3/035; G09G 3/32; G09G 2300/0809; G09G 2300/04; G09G 2300/08; G09G 2320/0626; G09F 9/30; H01L 25/0753; H01L 25/167; H10H 29/012; H10H 29/30; H10H 29/832; H10H 20/80; F21Y 2115/10; F21Y 2115/15; H10F 77/40

See application file for complete search history.

(56) References Cited

U.S. PATENT DOCUMENTS

| | | | | |
|---|---|---|---|---|
| 7,282,385 | B2 | 10/2007 | Gyoda et al. | |
| 7,335,573 | B2 | 2/2008 | Takayama et al. | |
| 7,598,927 | B2 | 10/2009 | Yamazaki et al. | |
| 8,456,382 | B2 | 6/2013 | Yamazaki et al. | |
| 8,791,878 | B2 | 7/2014 | Yamazaki et al. | |
| 9,493,119 | B2 | 11/2016 | Takayama et al. | |
| 9,614,022 | B2 | 4/2017 | Miyake et al. | |
| 9,755,167 | B2 | 9/2017 | Yamazaki et al. | |
| 9,768,201 | B2 | 9/2017 | Nakamura et al. | |
| 9,854,629 | B2 | 12/2017 | Ikeda et al. | |
| 9,858,028 | B2 | 1/2018 | Ikeda et al. | |
| 9,940,086 | B2 | 4/2018 | Yoshizumi et al. | |
| 10,133,531 | B2 | 11/2018 | Yoshitani et al. | |
| 10,159,135 | B2 | 12/2018 | Ikeda et al. | |
| 10,170,662 | B2 | 1/2019 | Aoyama et al. | |
| 10,198,235 | B2 | 2/2019 | Yoshizumi et al. | |
| 10,325,940 | B2 | 6/2019 | Takayama et al. | |
| 10,359,810 | B2 | 7/2019 | Miyake et al. | |
| 10,572,211 | B2 | 2/2020 | Yoshizumi et al. | |
| 10,629,637 | B2 | 4/2020 | Takayama et al. | |
| 10,768,883 | B2 | 9/2020 | Jeong | |
| 10,957,723 | B2 | 3/2021 | Takayama et al. | |
| 11,093,204 | B2 | 8/2021 | Yoshizumi et al. | |
| 11,380,218 | B2 | 7/2022 | Tsukamoto et al. | |
| 11,567,724 | B2 | 1/2023 | Yoshizumi et al. | |
| 11,922,091 | B2 | 3/2024 | Yoshizumi et al. | |
| 11,928,988 | B2 | 3/2024 | Tsukamoto et al. | |
| 12,321,655 | B2 | 6/2025 | Yoshizumi et al. | |
| 2002/0072139 | A1 | 6/2002 | Kashiwabara | |
| 2008/0049437 | A1 | 2/2008 | Takayama et al. | |
| 2011/0148290 | A1 | 6/2011 | Oota | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0014882 | A1* | 1/2016 | Jongman | H10K 59/18 156/247 |
| 2016/0044751 | A1* | 2/2016 | Ikeda | G06F 1/1652 362/227 |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2020/0043381 | A1* | 2/2020 | Tsukamoto | H10K 59/18 |
| 2020/0203662 | A1 | 6/2020 | Mollard et al. | |
| 2021/0407974 | A1* | 12/2021 | Jiang | H10K 59/18 |
| 2025/0278232 | A1 | 9/2025 | Yoshizumi et al. | |

FOREIGN PATENT DOCUMENTS

| | | | |
|---|---|---|---|
| JP | 2003-229548 | A | 8/2003 |
| JP | 2005-067367 | A | 3/2005 |
| JP | 2006-047945 | A | 2/2006 |
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2014-017204 | A | 1/2014 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2015-207556 | A | 11/2015 |
| JP | 2016-197494 | A | 11/2016 |
| JP | 2019-179696 | A | 10/2019 |
| JP | 2020-160305 | A | 10/2020 |
| JP | 2021-073504 | A | 5/2021 |
| KR | 2017-0015773 | A | 2/2017 |
| WO | WO-2018/158660 | | 9/2018 |

OTHER PUBLICATIONS

Malinowski, P. et al., "High resolution photolithography for direct view active matrix organic light-emitting diode augmented reality displays," J. Soc. Inf. Display (Journal of the Society for Information Display), Apr. 2, 2018, vol. 26, No. 3, pp. 128-136.

Malinowski, P. et al., "Photolithographic patterning of organic photodetectors with a non-fluorinated photoresist system," Organic Electronics, Jul. 12, 2014, vol. 15, No. 10, pp. 2355-2359.

Malinowski, P. et al., "Multicolor 1250 ppi OLED Arrays Patterened by Photolithography," SID Digest '16: SID International Symposium Digest of Technical Papers, May 22, 2016, vol. 47, No. 1, pp. 1009-1012.

Papadopoulos, N. et al., "AMOLED Displays with In-Pixel Photodetector," Liquid Crystals and Display Technology, Jul. 9, 2020, pp. 1-19.

Ke, T. et al., "Technology Developments in High-Resolution FMM-free OLED and BEOL IGZO TFTs for Power-Efficient Microdisplays," SID Digest '21: SID International Symposium Digest of Technical Papers, May 1, 2021, vol. 52, No. 1, pp. 127-130.

Malinowski, P. et al., "Integration of additional functionalities into the frontplane of AMOLED displays," SID Digest '20: SID International Symposium Digest of Technical Papers, Aug. 1, 2020, vol. 51, No. 1, pp. 646-649.

Malinowski, P. et al., "Organic photolithography for displays with integrated fingerprint scanner," SID Digest '19: SID International Symposium Digest of Technical Papers, May 29, 2019, vol. 50, No. 1, pp. 1007-1010.

Ke, T. et al., "Island and Hole Fabrication on OLED Stack for High-Resolution Sensor in Display Application," IDW '20: Proceedings of the 27th International Display Workshops, Dec. 9, 2020, vol. 27, pp. 902-905.

Gather, M. et al., "Solution-Processed Full-Color Polymer-OLED Displays Fabricated by Direct Photolithography," SID Digest '06: SID International Symposium Digest of Technical Papers, Jun. 1, 2006, vol. 37, No. 1, pp. 909-911.

Malinowski, P. et al., "Photolithography as Enabler of AMOLED Displays Beyond 1000 ppi," SID Digest '17: SID International

(56) References Cited

OTHER PUBLICATIONS

Symposium Digest of Technical Papers, May 1, 2017, vol. 48, No. 1, pp. 623-626.

* cited by examiner

400

DISPLAY APPARATUS AND MANUFACTURING METHOD OF DISPLAY APPARATUS

BACKGROUND OF THE INVENTION

1. Field of the Invention

One embodiment of the present invention relates to a display apparatus, an electronic device, or a semiconductor device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Specifically, examples of the technical field of one embodiment of the present invention disclosed in this specification include a semiconductor device, a display apparatus, a light-emitting apparatus, a power storage device, a memory device, a method for driving any of them, and a method for manufacturing any of them.

Note that in this specification, a semiconductor device generally means a device that can function by utilizing semiconductor characteristics. An electrooptic device, a semiconductor circuit, and an electronic device are all semiconductor devices.

2. Description of the Related Art

Development is advanced so that a measuring instrument in a car or the like is partly replaced with a liquid crystal display apparatus. Development of a measuring instrument partly using an organic light-emitting display apparatus is also advanced. Approaches to supporting a driver at a vehicle such as a car by displaying more information (e.g., information on the situation, traffic information, and geographic information around the car) have been taken.

In the future, there is a possibility that a large number of cameras or sensors will be provided inside and outside a car and thus a large number of displays will be needed.

Patent Document 1 discloses a structure in which a display portion is provided around a driver's seat of a car and a structure in which a display panel having a curved surface is provided in a car.

Patent Document 2 discloses a structure in which a display panel having a curved portion is provided using a plurality of light-emitting panels.

Patent Document 3 discloses a dual-emission display apparatus that is installed in a car.

REFERENCES

[Patent Document 1] Japanese Published Patent Application No. 2003-229548

[Patent Document 2] Japanese Published Patent Application No. 2015-207556

[Patent Document 3] Japanese Published Patent Application No. 2005-67367

SUMMARY OF THE INVENTION

An object of one embodiment of the present invention is to provide a novel light-emitting apparatus that is highly convenient and/or reliable. Another object is to provide a novel display apparatus that is highly convenient and/or reliable. Another object is to provide a novel input/output device that is highly convenient or reliable. Another object is to provide a novel light-emitting apparatus, a novel display apparatus, a novel input/output device, or a novel semiconductor device.

Light-emitting devices utilizing electroluminescence (hereinafter referred to as EL; such devices are also referred to as EL devices or EL elements) that are used for organic light-emitting display apparatuses have features such as ease of reduction in thickness and weight, high-speed response to input signals, and driving with constant DC voltage.

Note that the description of these objects does not preclude the existence of other objects. One embodiment of the present invention does not need to achieve all the objects listed above. Other objects will be apparent from and can be derived from the description of the specification, the drawings, the claims, and the like.

In order to form a large display region, a display apparatus is configured in the following manner: the periphery of end surfaces of a plurality of display panels is processed by laser light and the display panels are joined together so that unevenness is not generated at a boundary between the adjacent display panels and the outermost surface of the display apparatus is flat.

When end portions of display panels are cut using a physical blade and the display panels are made to overlap with each other, a boundary between the display panels overlapping with each other is noticeable. When end portions of display panels are cut by laser processing and the display panels are made to overlap with each other, a boundary between the display panels overlapping with each other can be less noticeable. When cutting with laser light is employed for outline processing of display panels as described above, a high-resolution display apparatus can be obtained without degradation of display quality due to a seam (a region including a boundary line) between the display panels. A plurality of display panels whose end portions are processed by laser light are prepared and arranged in a tiled pattern, whereby a display apparatus including one display surface can be manufactured.

Furthermore, display panels are partly cut by adjusting a depth of a position to be irradiated with laser light, a projection is formed at an end portion of one of the display panels, a portion to overlap with the projection is formed at an end portion of another display panel, and the display panels are made to overlap with each other. A portion where the display panels overlap with each other is also part of a display region.

As the laser light, intense light such as continuous wave laser light or pulsed laser light can be used. In particular, the pulsed laser light is preferable because pulsed laser light with high energy can be emitted instantaneously. As a pulsed laser light, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, or a gold vapor laser can be used, for example. The wavelength of the laser light is preferably 200 nm to 20 μm. For example, as the laser light, a $CO_2$ laser with the wavelength of 10.6 μm can be used. The $CO_2$ laser can process a film or a glass substrate made of an organic material or an inorganic material. In the case of the pulsed laser light used as the laser light, the pulse width is preferably 10 ps (picoseconds) to 10 μs (microseconds), further preferably 10 ps to 1 μs, and still further preferably 10 ps to 1 ns (nanosecond). For example, pulsed laser light with the wavelength of 532 nm and the pulse width of 1 ns or less is used.

FIG. 1 shows an example of a cross section of a display apparatus in which display panels that have been processed by laser light overlap with each other.

FIG. 1 illustrates a periphery of an end surface of a first display panel that includes a driver circuit portion 20*b* over a first film 21*a* and a light-emitting element layer 22*a* (an OLED or a μLED) over the driver circuit portion 20*b*. A second display panel includes a driver circuit portion 20*c* and a light-emitting element layer 22*b* (an OLED or a μLED) over the driver circuit portion 20*c*. A projection is formed on part of the end surface of the first display panel, and is provided with a driver circuit portion 20*a*. An FET or the like connected to a light-emitting device of the light-emitting element layer 22*b* is provided over the driver circuit portion 20*a*. A layer including the driver circuit portion 20*a* and the driver circuit portion 20*b* is referred to as an element layer. The structure in which the element layer and the light-emitting element layers 22*a* and 22*b* are bonded to each other with a first film 21*a* and a second film 21*b* (films having a light-transmitting property) is shown as an example.

A structure of the invention disclosed in this specification is a display apparatus including a first element layer; a first light-emitting element layer over the first element layer; a second element layer; a second light-emitting element layer over the second element layer; and a driver circuit portion in an end portion of the first element layer. A boundary surface between the first element layer and the second element layer is a first boundary surface in the depth direction. A boundary surface between the first element layer and the second light-emitting element layer is a second boundary surface in the width direction. The first boundary surface and the second boundary surface are in contact with each other. The second light-emitting element layer overlaps with the driver circuit portion.

In the above structure, a boundary surface between the first light-emitting element layer and the second light-emitting element layer is a third boundary surface in the depth direction. The first boundary surface and the second boundary surface that are in contact with each other and the second boundary surface and the third boundary surface that are in contact with each other form a step-like shape. When seen from the above, the first boundary surface and the third boundary surface are not aligned and are substantially parallel to each other.

In the above structure, the first element layer, the second element layer, the first light-emitting element layer, and the second light-emitting element layer are sandwiched between a pair of light-transmitting films.

Furthermore, when the display apparatus includes a polarizing film (or a polarizing plate or a circular polarizing plate) that overlaps with the first light-emitting element layer and the second light-emitting element layer, a boundary surface is less noticeable while display is performed on a pixel region.

In the above structure, the display apparatus can be fixed to a member having a curved surface.

The total thickness of the element layers and the light-emitting element layers is preferably small, and thus is made as small as possible by forming each layer to have a small thickness or performing polishing or etching.

After a plurality of display panels are arranged in a tiled pattern or made to overlap with each other and then arranged, a film is bonded thereto. After the bonding of the film, heating is performed in an autoclave at a high pressure of 0.1 MPa or higher, whereby the display apparatus can be manufactured without generating air bubbles at a bonding surface between the film and the display panels.

The film and an adhesive layer used for the bonding preferably have substantially the same refractive index, which makes the boundary less noticeable.

A method for obtaining the above-described structure is also one embodiment of the present invention. The method for manufacturing a display apparatus includes the steps of forming a first element layer over a first substrate; forming a first light-emitting element layer over the first element layer; processing the first substrate, the first element layer, or the first light-emitting element layer by irradiation of first laser light to form a first end surface; forming a second element layer over a second substrate; forming a second light-emitting element layer over the second element layer; processing the second substrate, the second element layer, or the second light-emitting element layer by irradiation of second laser light to form a second end surface; and making the first end surface and the second end surface in contact with each other.

In the above structure, the first end surface can have a step-like shape. A projection is formed by laser processing on an end surface of a panel and then made to overlap with a projection formed on an end surface of another panel, whereby a seam can be less noticeable. When the portions formed by laser processing are made to overlap with each other, the outermost surface of the panel can be made smooth. The outermost surface of the panel is preferably made smooth, in which case an optical film can be bonded to the outermost surface without causing unevenness.

Furthermore, the use of a polarizing film (or a polarizing plate or a circular polarizing plate) as an optical film can make the boundary between the panels less noticeable.

It is preferable that a third substrate be further bonded to the first substrate or the first light-emitting element layer and then heating be performed in a high-pressure atmosphere because no air bubbles are generated at the interface between the third substrate and the first substrate or the first light-emitting element layer.

Note that in FIG. 1, the light-emitting element layer includes an organic EL element (also referred to an OLED) or a micro LED (also referred to as a μLED).

Note that an emission color of the LED chip that can be used in the method for manufacturing a display apparatus of one embodiment of the present invention is not particularly limited. For example, application to an LED chip emitting white light is possible. In addition, for example, application to an LED chip emitting light with a wavelength region of visible light of red, green, or blue is possible. Furthermore, for example, application to an LED chip emitting light with a wavelength region of near infrared light or infrared light is possible.

In this embodiment, in particular, an example in which a micro LED is used as a light-emitting diode is described. A micro LED having a double heterojunction is described in this embodiment. Note that there is no particular limitation on the light-emitting diode, and for example, a micro LED having a quantum well junction or a nanocolumn LED may be used.

The area of a light-emitting region of the light-emitting diode is preferably less than or equal to 1 $mm^2$, further preferably less than or equal to 10000 $\mu m^2$, still further preferably less than or equal to 3000 $\mu m^2$, even further preferably less than or equal to 700 $\mu m^2$. The area of the region is preferably greater than or equal to 1 $\mu m^2$, further preferably greater than or equal to 10 $\mu m^2$, and still further preferably greater than or equal to 100 $\mu m^2$. Note that in this specification and the like, a light-emitting diode including a light-emitting region whose area is less than or equal to 10000 $\mu m^2$ is referred to as a micro LED in some cases.

Note that an LED that can be used for a display apparatus of one embodiment of the present invention is not limited to the above-described micro LED. For example, a light-emitting diode having a light-emitting area of greater than 10000 $\mu m^2$ (also referred to as a mini LED) may be used.

A display apparatus of one embodiment of the present invention preferably includes a transistor including a channel formation region in a metal oxide layer. A transistor containing metal oxide consumes less power. Thus, a combination with a micro LED can achieve a display unit with extremely reduced power consumption.

A plurality of display panels are combined to obtain a display apparatus including a large display region in which a boundary between the display panels can be less noticeable. In addition, one embodiment of the present invention can provide a relatively large display apparatus including a display surface having a curved surface.

Note that the description of these effects does not preclude the existence of other effects. One embodiment of the present invention does not need to have all the effects listed above. Other effects will be apparent from and can be derived from the description of the specification, the drawings, the claims, and the like.

DETAILED DESCRIPTION OF THE INVENTION

Figure 1:
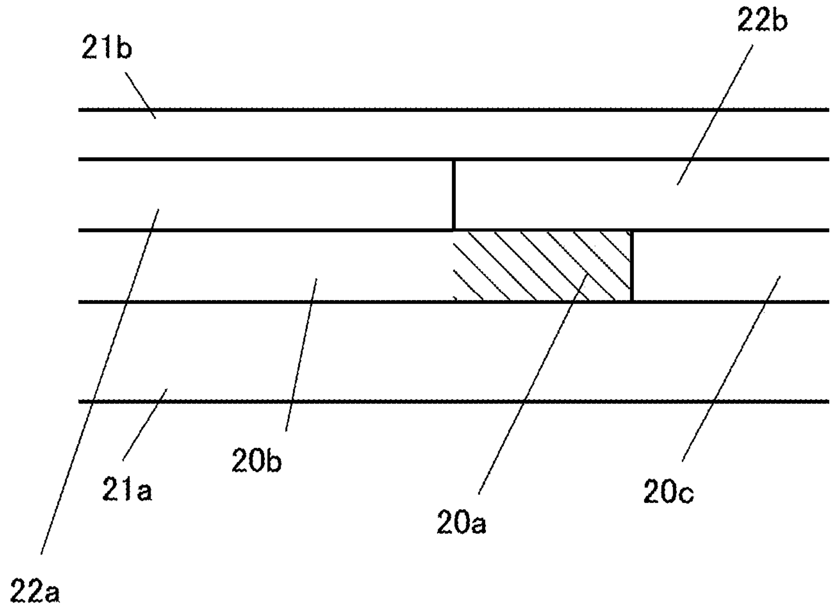
FIG. 1 is a cross-sectional view showing a structure example of one embodiment of the present invention.

In this specification and the like, a description "X and Y are connected" means that X and Y are electrically connected, X and Y are functionally connected, and X and Y are directly connected. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow(s) electrical connection between X and Y (e.g., a switch, a transistor, a capacitor element, an inductor, a resistor element, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether a current flows or not.

For example, in the case where X and Y are functionally connected, one or more circuits that allow(s) functional connection between X and Y (e.g., a logic circuit (an inverter, a NAND circuit, a NOR circuit, or the like); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of a current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected when a signal output from X is transmitted to Y.

Note that an explicit description, X and Y are electrically connected, includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

In this specification and the like, a transistor includes three terminals called a gate, a source, and a drain. The gate is a control terminal for controlling the on/off state of the transistor. The two terminals functioning as the source and the drain are input/output terminals of the transistor. Functions of the two input/output terminals of the transistor depend on the conductivity type (n-channel type or p-channel type) of the transistor and the levels of potentials applied to the three terminals of the transistor, and one of the two terminals serves as a source and the other serves as a drain. Therefore, the terms "source" and "drain" can be sometimes used interchangeably in this specification and the like. In this specification and the like, the terms "one of a source and a drain" (or a first electrode or a first terminal) and "the other of the source and the drain" (or a second electrode or a second terminal) are used to describe the connection relation of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

Unless otherwise specified, off-state current in this specification and the like refers to a drain current of a transistor in an off state (also referred to as a non-conducting state or a cutoff state). Unless otherwise specified, the off state of an n-channel transistor means that the voltage between a gate and a source ($V_{gs}$) is lower than the threshold voltage ($V_{th}$), and the off state of a p-channel transistor means that $V_{gs}$ is higher than $V_{th}$.

In this specification and the like, a metal oxide means an oxide of metal in a broad sense. Metal oxides are classified into an oxide insulator, an oxide conductor (including a transparent oxide conductor), an oxide semiconductor (also simply referred to as OS), and the like. For example, a metal oxide used in an active layer of a transistor is referred to as an oxide semiconductor in some cases. That is, an OS transistor can also be referred to as a transistor including a metal oxide or an oxide semiconductor.

Ordinal numbers such as "first", "second", and "third" in this specification and the like are used in order to avoid confusion among components. Thus, the terms do not limit the number of components. The terms do not limit the order of components, either. For example, a "first" component in one embodiment in this specification and the like can be referred to as a "second" component in other embodiments or claims. For another example, a "first" component in one embodiment in this specification and the like can be omitted in other embodiments or claims.

In this specification and the like, terms for describing arrangement, such as "over", "above", "under", and "below", are sometimes used for convenience to describe the positional relation between components with reference to drawings. The positional relation between components is changed as appropriate in accordance with the direction from which each component is described. Thus, the positional relation is not limited to that described with a term used in this specification and the like and can be explained with another term as appropriate depending on the situation. For example, the expression "an insulator over (on) a top surface of a conductor" can be replaced with the expression "an insulator on a bottom surface of a conductor" when the direction of a diagram showing these components is rotated by 180°.

The term such as "over", "above", "under", or "below" does not necessarily mean that a component is placed directly on or under and directly in contact with another component. For example, the expression "electrode B over insulating layer A" does not necessarily mean that the electrode B is on and in direct contact with the insulating layer A, and can mean the case where another component is provided between the insulating layer A and the electrode B.

In this specification and the like, the terms "film" and "layer" can be interchanged with each other depending on circumstances. For example, the term "conductive layer" can be changed to the term "conductive film" in some cases. Moreover, the term "insulating film" can be changed into the term "insulating layer" in some cases. Moreover, such terms can be replaced with a word not including the term "film" or "layer" depending on the case or circumstances. For example, the term "conductive layer" or "conductive film" can be changed into the term "conductor" in some cases. For example, in some cases, the term "insulating layer" or "insulating film" can be changed into the term "insulator" in some cases.

Hereinafter, embodiments of the present invention will be described in detail with reference to the drawings. Note that the present invention is not limited to the description below, and it is easily understood by those skilled in the art that modes and details of the present invention can be modified in various ways. In addition, the present invention should not be construed as being limited to the description in the following embodiments.

Embodiment 1

In this embodiment, an example of manufacturing a display apparatus is described below. The display apparatus includes a plurality of flexible substrates, a pixel regions formed over the flexible substrates, and a display surface having a curved surface.

Figure 3A:
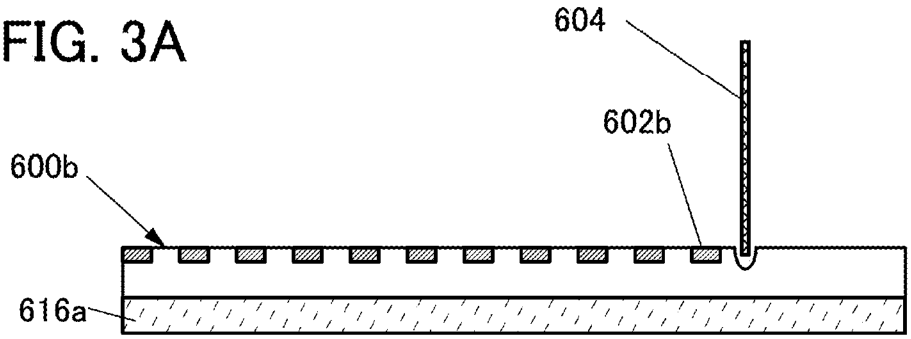
FIGS. 3A to 3D are cross-sectional views showing an example of a manufacturing process of a display apparatus of one embodiment of the present invention.

FIG. 3A illustrates a second display panel 600*b* in which, over a second element layer 616*a*, a light-emitting element layer is formed and a black matrix 602*b* is placed. FIG. 3A is a cross-sectional view illustrating a state where laser processing is being performed by irradiation of laser light 604.

Figure 3B:
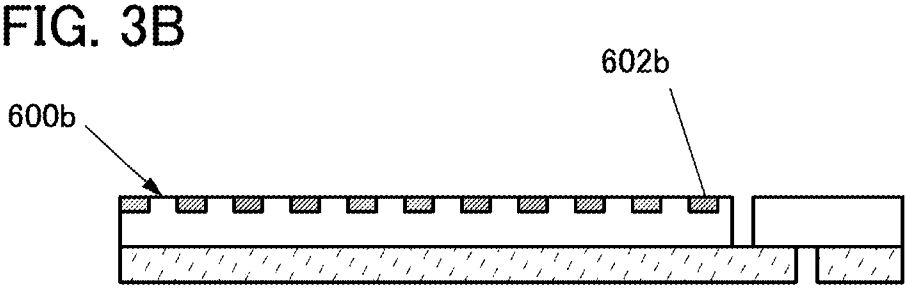

FIG. 3B illustrates a cross section after the laser processing. Laser light is controlled in the depth direction so that the position of a groove on the side provided with the black matrix 602*b* is different from the position of a groove provided in the second element layer 616*a*. Note that the black matrix 602*b* is provided in a film for sealing a light-emitting element or in the light-emitting element layer.

Figure 3C:
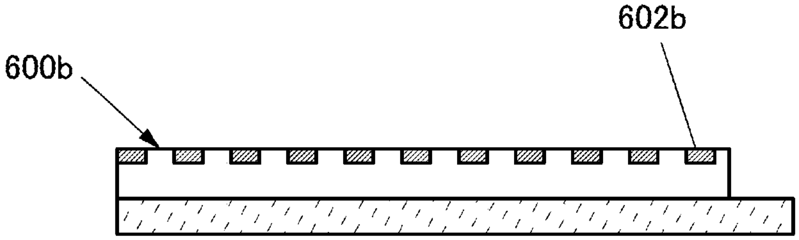

FIG. 3C illustrates a state where the second display panel 600*b* is partly cut, and there is a projection that is the second element layer 616*a* projecting outward from an end surface of the second display panel 600*b*.

Figure 3D:
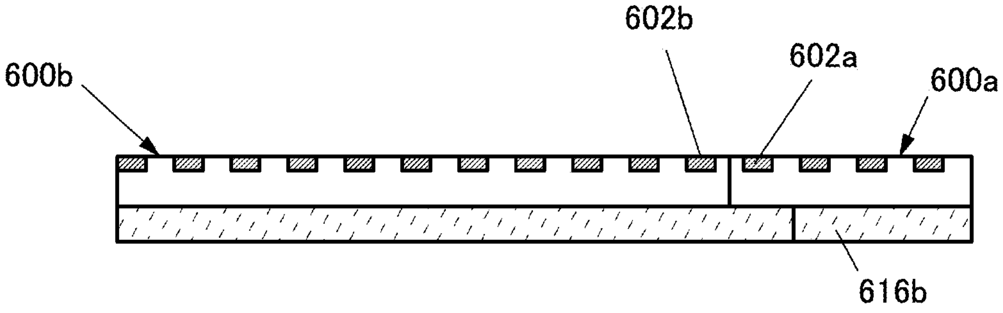

A first display panel 600*a* is prepared in advance, and is placed so that a projection of the first display panel 600*a* overlaps with the projection of the second element layer 616*a*. FIG. 3D illustrates a state where a display apparatus is manufactured by bringing an end portion of the first display panel 600*a* into contact with an end portion of the second display panel 600*b* so that parts of the black matrix 602*b* and parts of black matrix 602*a* are arranged at regular intervals. Accordingly, as illustrated in FIG. 3D, a boundary between a first element layer 616*b* and the second element layer 616*a* (a boundary line in a top view) and a boundary between the black matrix 602*b* and the black matrix 602*a* (a boundary line in a top view) are not aligned with each other. A first boundary surface between the first element layer 616*b* and the second element layer 616*a* extends in the depth direction, a second boundary surface between the second element layer 616*a* and a first light-emitting element layer extends in the width direction, and a third boundary surface between the second light-emitting element layer and a first light-emitting element layer extends in the depth direction.

Note that an end portion of the first display panel 600*a* is also subjected to laser processing, whereby a projection is formed on an end surface of the first display panel 600*a*. By making the projections on the end surfaces overlap with each other, the black matrix 602*b* and the black matrix 602*a* can be arranged on substantially the same plane.

FIGS. 3A to 3D show an example in which the first display panel 600*a* is in contact with the second display panel 600*b*, and FIGS. 2A to 2D illustrate a process in which a wiring layer 12 is provided over a support 10 having a curved surface and display panels are sequentially stacked.

First, a plurality of pixels arranged in a matrix and a driver circuit portion are formed over a substrate having flexibility. A substrate having flexibility is also referred to as a flexible substrate. A method in which a transistor or a light-emitting element is directly formed on a flexible substrate may be employed, or a method in which a transistor or a light-emitting element is formed over a glass substrate or the like, separated from the glass substrate, and then bonded to a flexible substrate with an adhesive layer may be employed. Although there are various kinds of separation methods and transfer methods, there is no particular limitation and a known technique is employed as appropriate.

In the case where a glass substrate is used, a glass substrate having any of the following sizes or a larger size can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm). To a glass substrate, heat treatment temperature that is higher than or equal to that in the case of forming a transistor or the like directly on a flexible substrate can be applied; thus, a glass substrate is suitable for the case where temperature in the manufacturing process of a transistor is high.

Examples of materials of the flexible substrate include polyester resins such as PET and PEN, a polyacrylonitrile resin, an acrylic resin, a polyimide resin, a polymethyl methacrylate resin, a PC resin, a PES resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a PTFE resin, and an ABS resin. In particular, a material with a low coefficient of linear expansion is preferred, and for example, a polyamide imide resin, a polyimide resin, a polyamide resin, or PET can be suitably used. A substrate in which a fibrous body is impregnated with a resin, a substrate whose coefficient of linear expansion is reduced by mixing an inorganic filler with a resin, or the like can also be used.

Alternatively, a metal film can be used as the flexible substrate. As a metal film, stainless steel, aluminum, or the like can be used. Note that a metal film has a light-blocking property, and thus is used in consideration of the light-emitting direction of a light-emitting element to be used.

The flexible substrate may have a stacked-layer structure in which at least one of a hard coat layer (e.g., a silicon nitride layer) by which a surface of the device is protected from damage, a layer for dispersing pressure (e.g., an aramid resin layer), and the like is stacked over a layer of any of the above-mentioned materials.

For the adhesive layer, various curable adhesives such as a photocurable adhesive (e.g., an ultraviolet curable adhesive), a reactive curable adhesive, a thermosetting adhesive, and an anaerobic adhesive can be used. Alternatively, an adhesive tape, an adhesive sheet, or the like may be used.

Figure 2A:
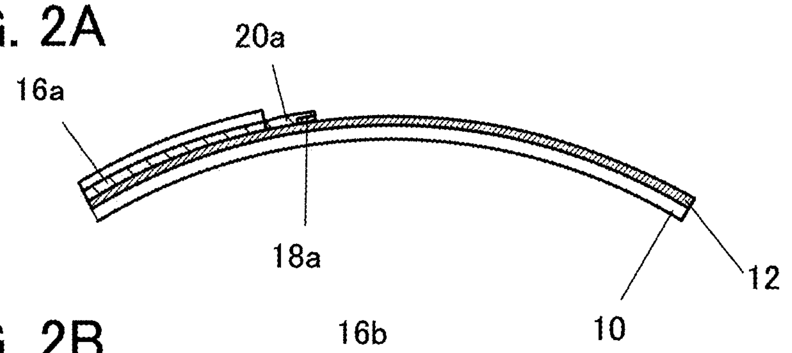
FIGS. 2A to 2D are cross-sectional views showing an example of a manufacturing process of a display apparatus of one embodiment of the present invention.

Then, employing a known technique, a pixel region of a first light-emitting device 16*a* and the driver circuit portion 20*a* are formed over the flexible substrate. Then, an opening is formed in the flexible substrate and an electrode 18*a* is formed, and when the flexible substrate is fixed to the support 10 having a curved surface, the wiring layer 12 over the support 10 is electrically connected to the electrode 18*a* as illustrated in FIG. 2A. The electrode 18*a* is electrically connected to a wiring of the driver circuit portion 20*a* through the opening provided in the flexible substrate, and thus is also referred to as a through electrode in some cases.

Figure 2B:
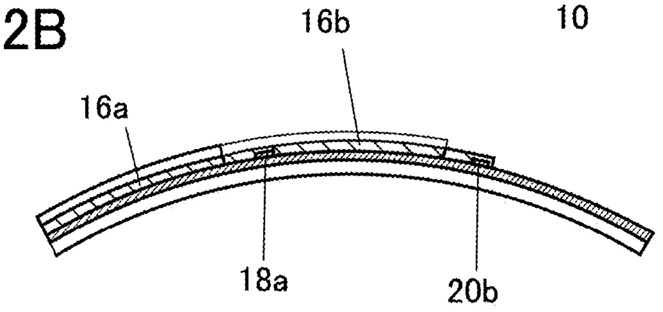

Next, as illustrated in FIG. 2B, a second light-emitting device 16*b* is fixed so that its end portion overlaps with the driver circuit portion 20*a*. The driver circuit portion 20*a* is not a pixel region and thus cannot perform display. Thus, when a pixel region of the second light-emitting device 16*b* overlaps with the driver circuit portion 20*a*, a vertical stripe or a horizontal stripe that might be generated in the vicinity of a boundary between the first light-emitting device 16*a* and the second light-emitting device 16*b* can be less noticeable.

Figure 2C:
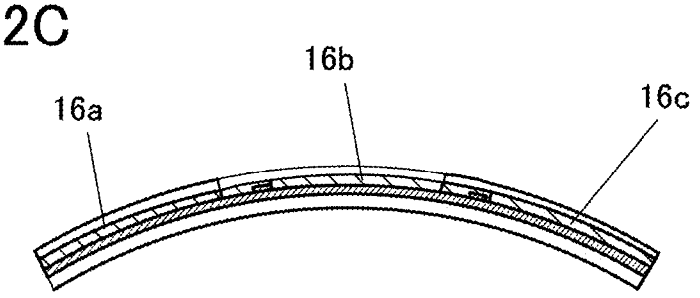

Next, as illustrated in FIG. 2C, a third light-emitting device 16*c* is fixed so that its end portion overlaps with the driver circuit portion 20*b*. The driver circuit portion 20*b* is not a pixel region and thus cannot perform display. Thus, when a pixel region of the third light-emitting device 16*c* overlaps with the driver circuit portion 20*b*, a vertical stripe or a horizontal stripe that might be generated in the vicinity of a boundary between the second light-emitting device 16*b* and the third light-emitting device 16*c* can be less noticeable.

Figure 2D:
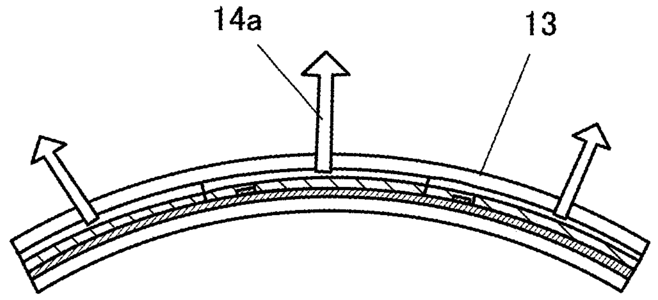

Next, as illustrated in FIG. 2D, a cover member 13 covers the light-emitting devices and is fixed with a resin. When the cover member 13 covers the light-emitting devices, a step generated by an end portion of the second light-emitting device 16*b* overlapping with the driver circuit portion 20*a* can be reduced. In order to make a vertical stripe or a horizontal stripe less noticeable, the refractive indexes of the cover member 13 and the resin are selected as appropriate. As a material used as the resin, a resin with a high visible-light transmitting property is preferable; for example, an organic resin film of an epoxy resin, an aramid resin, an acrylic resin, a polyimide resin, a polyamide resin, a polyamide-imide resin, or the like can be used.

The arrow in FIG. 2D indicates a light-emitting direction 14*a* of the second light-emitting device 16*b*, and the cover member 13 and the resin have a light-transmitting property. Adjustment of the refractive index of the resin or the cover member 13 can make a vertical stripe or a horizontal stripe that might be generated in the vicinity of a boundary between pixel regions provided over different substrates less noticeable.

A difference in refractive indexes between the cover member 13 and the resin is preferably less than or equal to 20%, further preferably less than or equal to 10%, and still further preferably less than or equal to 5%. Note that a refractive index refers to an average refractive index with respect to visible light, specifically, light with a wavelength in the range from 400 nm to 750 nm. The average refractive index is a value obtained by dividing, by the number of measurement points, the sum of measured refractive indexes with respect to light with wavelengths in the above range. Note that the refractive index of the air is 1.

Through the above-described process, a plurality of light-emitting devices (also referred to as a plurality of light-emitting panels or a plurality of display panels) are arranged to partly overlap with each other as appropriate, whereby a display apparatus in which regions arranged seamlessly on a curved surface serve as one display region can be manufactured. Furthermore, only portions processed by laser light form an overlapping portion, so that the overlapping portion can be narrower than the conventional one.

At least part of this embodiment can be implemented in combination with any of the other embodiments described in this specification, as appropriate.

Embodiment 2

Embodiment 1 describes an example in which a projection is formed by laser processing. In this embodiment, an example of a manufacturing method of a display apparatus is described in which end surfaces of a plurality of display panels are formed by laser processing and aligned by a tiling method so that the display panels are arranged seamlessly to form one display region.

Figure 4A:
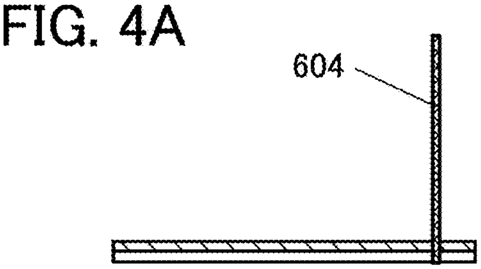
FIGS. 4A to 4E are cross-sectional views showing an example of a manufacturing process of a display apparatus of one embodiment of the present invention.

First, after a first display panel 616*d* is formed, its end portion is cut by the laser light 604 as illustrated in FIG. 4A. In this embodiment, a YAG laser with a wavelength of 266 nm is used. Although the irradiation conditions of the laser light 604 depend on a material to be cut, reciprocal scanning is preferably performed 10 or more times at low power.

Figure 4B:
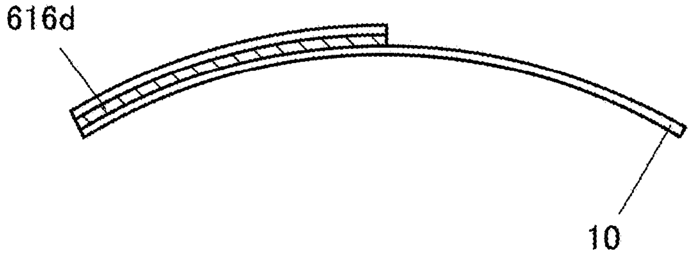

Next, as illustrated in FIG. 4B, the first display panel 616*d* whose end portion is cut is fixed onto the support 10 having a curved surface.

Figure 4C:
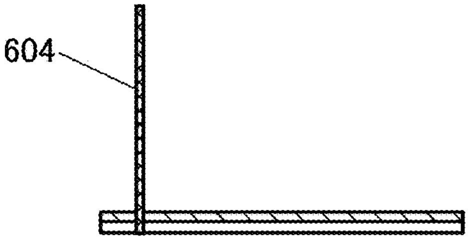

Next, after a second display panel 616*e* is formed, its end portion is cut by the laser light 604 as illustrated in FIG. 4C.

Figure 4D:
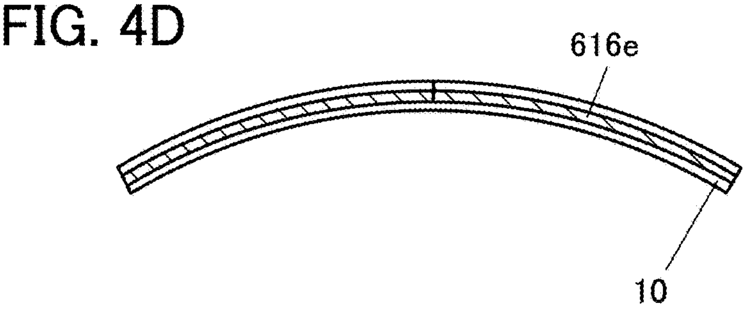

Next, as illustrated in FIG. 4D, an end portion of the second display panel 616*e* is fixed so as to be in contact with an end portion of the first display panel 616*d* over the support 10 having a curved surface. Such a fixing method is referred to as a tiling method.

Figure 4E:
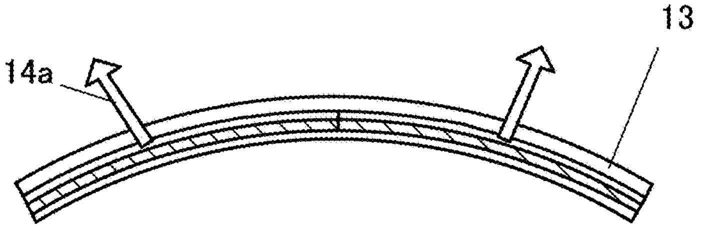

Then, the cover member 13 is bonded onto the display panels as illustrated in FIG. 4E. Since the end surfaces are aligned with each other, the outermost surfaces of the first display panel and the second display panel are substantially aligned with each other; therefore, the cover member 13 can be bonded onto the first display panel and the second display panel to cover them.

In this embodiment, the end portion of the first display panel is cut using laser light, whereby a boundary between the panels can be less noticeable than in the case of using a physical blade (e.g., a cutter). Adjustment of the refractive index of the cover member 13 can make a vertical stripe or a horizontal stripe that might be generated in the vicinity of the boundary between the panels less noticeable.

At least part of this embodiment can be implemented in combination with any of the other embodiments described in this specification, as appropriate.

Embodiment 3

Figure 5A:
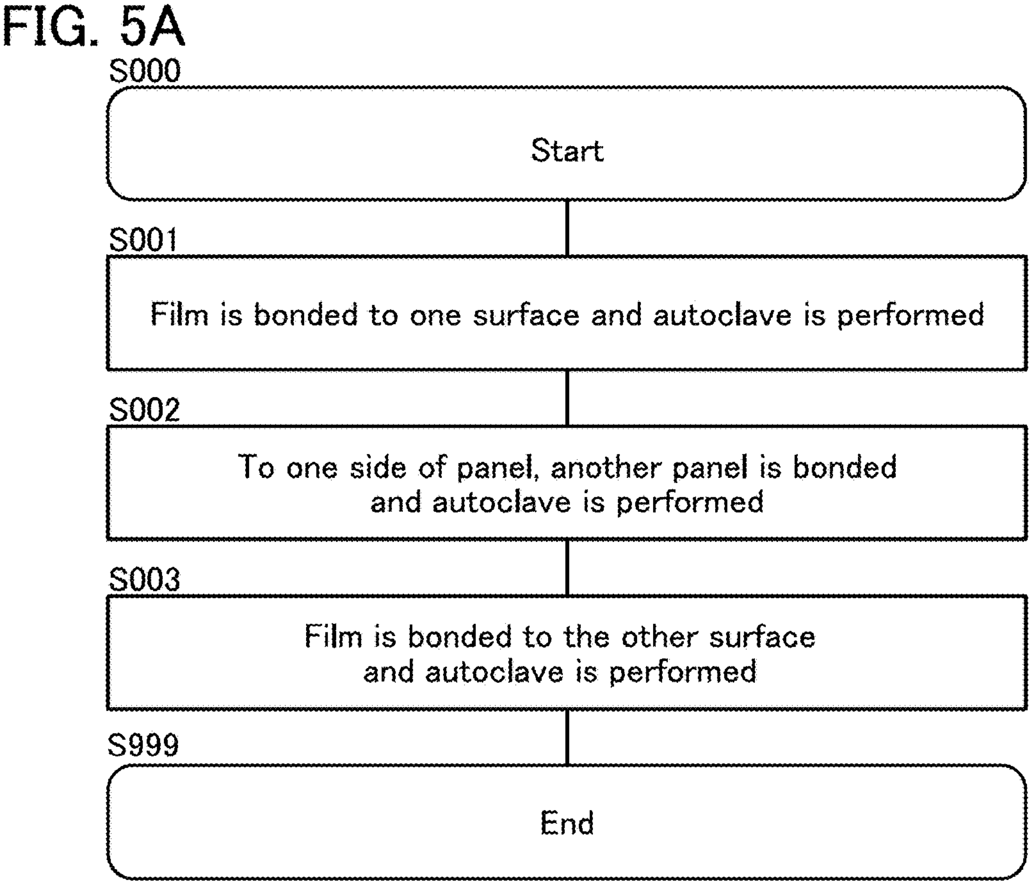
FIGS. 5A and 5B are flow charts each showing a manufacturing process.

In this embodiment, description is made with reference to FIG. 5A on steps in which a plurality of display panels are joined together, and then a cover member (in this embodiment, a film) is bonded without generation of air bubbles in a resin or at an interface between the cover member and the resin.

A first display panel and a second display panel are prepared in advance, and two films used for bonding are prepared. FIG. 5A shows an example of a flow chart showing a manufacturing process.

In Step S000, bonding starts.

In Step S001, one of the films is bonded to one surface of the first display panel, and then high-pressure heating is performed in an autoclave.

The heating in the autoclave is performed at a temperature of 50° C. or higher and 110° C. or lower under a pressure of 0.1 MPa or higher and 1 MPa or lower for 20 minutes or longer and 2 hours or shorter.

Next, in Step S002, after the first display panel and the second display panel are arranged and bonded to each other so that one side of the first display panel and one side of the second display panel overlap with each other, high-pressure heating is performed in the autoclave.

Next, in Step S003, the other of the films is bonded to the other surface of the first display panel, and then high-pressure heating is performed in the autoclave.

Then, in Step S999, the processing ends. Through the above steps, the plurality of panels can be sandwiched between the two films.

Although the above-described process is an example in which the two panels are bonded to each other, Step S002 is repeated (n−1) times to bond n panels.

Figure 5B:
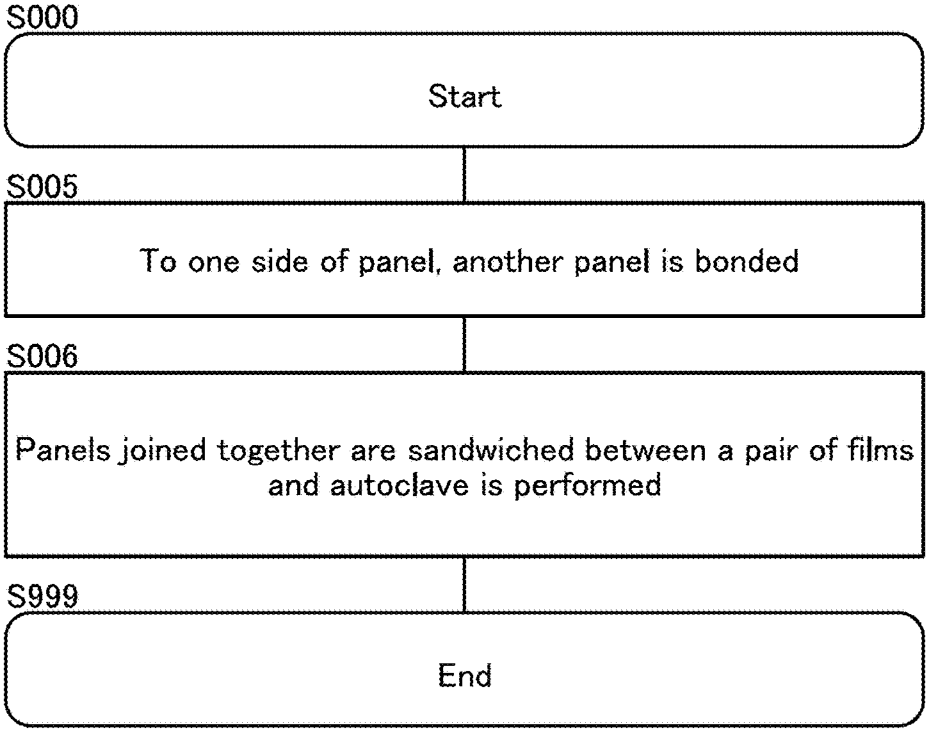

FIG. 5B is a flow chart showing a process different from the above-described process. In order to reduce the number of heatings in an autoclave compared to the case shown in FIG. 5A, first, one panel is bonded to one side of another panel in Step S005. Next, in Step S006, the panels joined together are sandwiched between a pair of films, and then high-pressure heating is performed in the autoclave. Then, in Step S999, the processing ends.

In FIG. 5B, when bonding of n panels is performed, Step S005 is repeated (n−1) times.

In the case where reduced-pressure heating is performed as a comparative example, a larger number of larger air bubbles are generated, resulting in unevenness on the bonding surface. Therefore, it can be said that high-pressure heating allows films to be bonded uniformly compared to the case of performing reduced-pressure heating.

Embodiment 4

In this embodiment, specific structures of the display region in any one of Embodiments 1 to 3 are shown below.

Figure 6A:
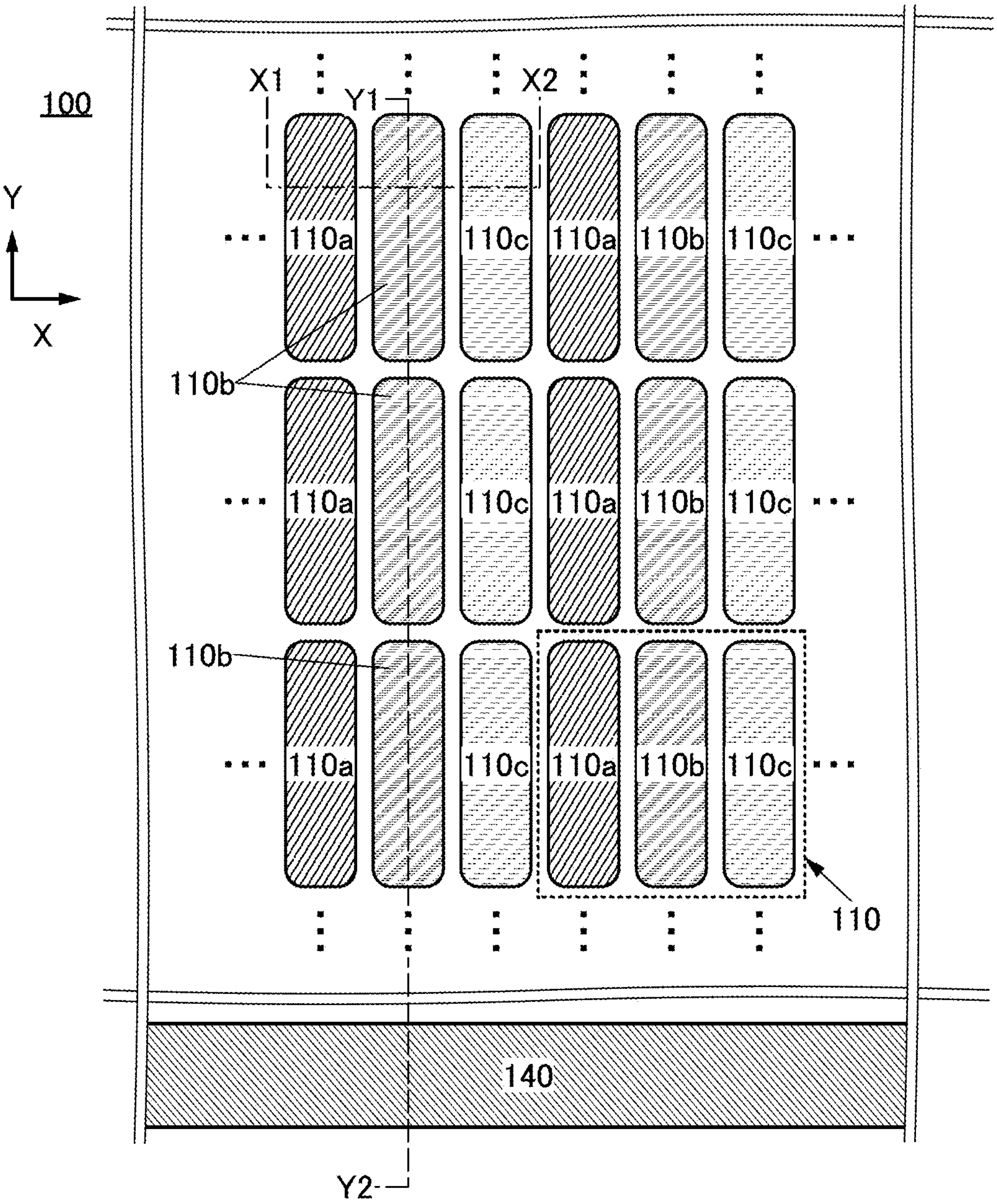
FIG. 6A is a top view showing an example of a display region 100.

FIG. 6A is a top view of a display region 100. The display region 100 includes a pixel portion in which a plurality of pixels 110 are arranged in a matrix, and a connection portion 140 outside the pixel portion. A region between the pixels and the connection portion 140 do not emit light, but are included in the display region 100.

The pixel 110 illustrated in FIG. 6A employs stripe arrangement. The pixel 110 illustrated in FIG. 6A consists of three subpixels 110*a*, 110*b*, and 110*c*. The subpixels 110*a*, 110*b*, and 110*c* include light-emitting devices that emit light of different colors. The three subpixels 110*a*, 110*b*, and 110*c* can be of three colors of red (R), green (G), and blue (B) or of three colors of yellow (Y), cyan (C), and magenta (M), for example.

FIG. 6A shows an example where subpixels of different colors are arranged in the X direction and subpixels of the same color are arranged in the Y direction. Note that subpixels of different colors may be arranged in the Y direction, and subpixels of the same color may be arranged in the X direction.

Although FIG. 6A shows an example where the connection portion 140 is positioned on the bottom side of the pixel portion in the top view, one embodiment of the present invention is not particular limited. The connection portion 140 only needs to be provided on at least one of the top, right, left, and bottom sides of the pixel portion in the top view. Moreover, one connection portion 140 or a plurality of connection portions 140 can be provided.

Figure 6B:
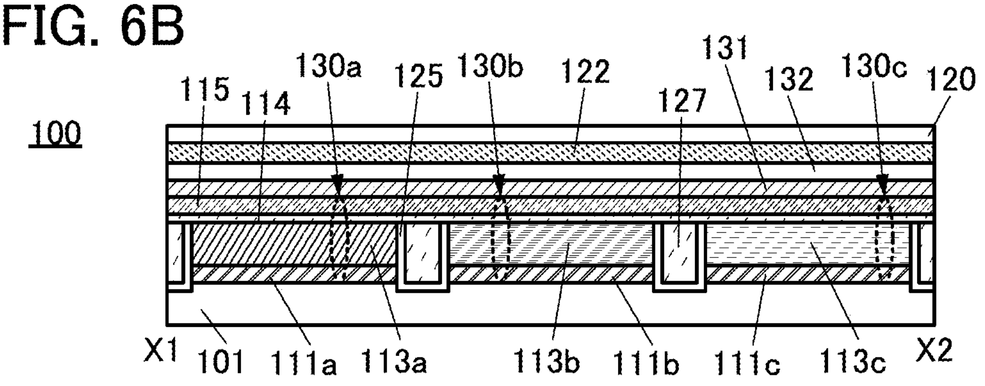
FIG. 6B is a cross-sectional view showing an example of the display region 100.

FIG. 6B is a cross-sectional view along the dashed-dotted line X1-X2 in FIG. 6A.

As illustrated in FIG. 6B, the display region 100 includes the light-emitting devices 130*a*, 130*b*, and 130*c* over a layer 101 including transistors (not illustrated), and insulating layers 131 and 132 provided to cover these light-emitting devices. A substrate 120 is attached above the insulating layer 132 with a resin layer 122. In a region between the adjacent light-emitting devices, an insulating layer 125 and an insulating layer 127 on the insulating layer 125 are provided.

The display region of one embodiment of the present invention can have any of the following structures: a top-emission structure in which light is emitted in a direction opposite to the substrate where the light-emitting devices are formed, a bottom-emission structure in which light is emitted toward the substrate where the light-emitting devices are formed, and a dual-emission structure in which light is emitted toward both surfaces.

The layer 101 including transistors can have a stacked-layer structure in which a plurality of transistors (not illustrated) are provided over a substrate and an insulating layer is provided to cover these transistors, for example. The layer 101 including transistors may have a recess portion between adjacent light-emitting devices. For example, an insulating layer positioned on the outermost surface of the layer 101 including transistors may have a recess portion. Structure examples of the layer 101 including transistors will be described later.

The light-emitting devices 130*a*, 130*b*, and 130*c* preferably emit light of different colors. The light-emitting devices 130*a*, 130*b*, and 130*c* preferably emit light of three colors, i.e., red (R) light, green (G) light, and blue (B) light in combination.

As the light-emitting devices 130*a*, 130*b*, and 130*c*, EL devices such as organic light emitting diodes (OLEDs) or quantum-dot light emitting diodes (QLEDs) are preferably used. Examples of light-emitting substances included in EL devices include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). As a TADF material, a material that is in thermal equilibrium between a singlet excited state and a triplet excited state may be used. Such a TADF material has a shorter light emission lifetime (excitation lifetime) and thus can inhibit a reduction in efficiency of the light-emitting device in a high-luminance region.

The light-emitting device includes an EL layer between a pair of electrodes. In this specification and the like, one of the pair of electrodes may be referred to as a pixel electrode and the other may be referred to as a common electrode.

One of the pair of electrodes of the light-emitting device functions as an anode, and the other electrode functions as a cathode. The case where the pixel electrode functions as an anode and the common electrode functions as a cathode will be described below as an example.

The light-emitting device 130*a* includes a pixel electrode 111*a* over the layer 101 including transistors, an island-shaped first organic layer 113*a* over the pixel electrode 111*a*, a fourth organic layer 114 over the island-shaped first organic layer 113*a*, and a common electrode 115 over the fourth organic layer 114. In the light-emitting device 130*a*, the first organic layer 113*a* and the fourth organic layer 114 can be collectively referred to as an EL layer.

There is no particular limitation on the structure of the light-emitting device in this embodiment, and the light-emitting device can have a single structure or a tandem structure. Note that structure examples of the light-emitting device will be described later in Embodiment 7.

The light-emitting device 130*b* includes a pixel electrode 111*b* over the layer 101 including transistors, an island-shaped second organic layer 113*b* over the pixel electrode 111*b*, the fourth organic layer 114 over the island-shaped second organic layer 113*b*, and the common electrode 115 over the fourth organic layer 114. In the light-emitting device 130*b*, the second organic layer 113*b* and the fourth organic layer 114 can be collectively referred to as an EL layer.

The light-emitting device 130*c* includes a pixel electrode 111*c* over the layer 101 including transistors, an island-shaped third organic layer 113*c* over the pixel electrode 111*c*, the fourth organic layer 114 over the island-shaped third organic layer 113*c*, and the common electrode 115 over the fourth organic layer 114. In the light-emitting device 130*c*, the third organic layer 113*c* and the fourth organic layer 114 can be collectively referred to as an EL layer.

The light-emitting devices of different colors share one film serving as the common electrode. The common electrode shared by the light-emitting devices of different colors is electrically connected to a conductive layer provided in the connection portion 140.

A conductive film that transmits visible light is used as the electrode through which light is extracted, which is either the pixel electrode or the common electrode. A conductive film that reflects visible light is preferably used as the electrode through which light is not extracted.

For the pair of electrodes (the pixel electrode and the common electrode) of the light-emitting device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy)

such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), magnesium (Mg), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device preferably employs a microcavity structure. Therefore, one of the pair of electrodes of the light-emitting device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light at wavelengths greater than or equal to 400 nm and less than 750 nm) transmittance higher than or equal to 40% is preferably used in the light-emitting device. The visible light reflectivity of the transflective electrode is higher than or equal to 10% and less than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower.

The first organic layer 113*a*, the second organic layer 113*b*, and the third organic layer 113*c* are each provided in an island shape. The first organic layer 113*a*, the second organic layer 113*b*, and the third organic layer 113*c* each include a light-emitting layer. The first organic layer 113*a*, the second organic layer 113*b*, and the third organic layer 113*c* preferably include light-emitting layers that emit different colors.

The light-emitting layer contains a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by exciplex-triplet energy transfer (ExTET), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, the first organic layer 113*a*, the second organic layer 113*b*, and the third organic layer 113*c* may also include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), and the like.

Either a low molecular compound or a high molecular compound can be used in the light-emitting device, and an inorganic compound may also be included. Each layer included in the light-emitting device can be formed by any of the following methods: an evaporation method (including a vacuum evaporation method), a transfer method, a printing method, an inkjet method, a coating method, and the like.

For example, the first organic layer 113*a*, the second organic layer 113*b*, and the third organic layer 113*c* may each include one or more of a hole-injection layer, a hole-transport layer, a hole-blocking layer, an electron-blocking layer, an electron-transport layer, and an electron-injection layer. A hole-injection layer, a hole-transport layer, a hole-blocking layer, an electron-blocking layer, an electron-transport layer, and an electron-injection layer are referred to as functional layers in some cases.

In the EL layer, one or more of a hole-injection layer, a hole-transport layer, a hole-blocking layer, an electron-blocking layer, an electron-transport layer, and an electron-injection layer can be formed as a layer common to the light-emitting devices of different colors. For example, a carrier-injection layer (a hole-injection layer or an electron-injection layer) may be formed as the fourth organic layer 114. Note that all the layers in the EL layer may be separately formed from those in light-emitting devices of different colors. That is, the EL layer does not necessarily include a layer common to light-emitting devices of different colors.

The first organic layer 113a, the second organic layer 113b, and the third organic layer 113c each preferably include a light-emitting layer and a carrier-transport layer over the light-emitting layer. Accordingly, the light-emitting layer is prevented from being exposed on the outermost surface in the process of manufacturing the display region 100, so that damage to the light-emitting layer can be reduced. Thus, the reliability of the light-emitting device can be increased.

The hole-injection layer is a functional layer that injects holes from the anode to the hole-transport layer and contains a material with a high hole-injection property. Examples of a material with a high hole-injection property include an aromatic amine compound and a composite material containing a hole-transport material and an acceptor material (electron-accepting material).

The hole-transport layer is a functional layer that transports holes injected from the anode by the hole-injection layer, to the light-emitting layer. The hole-transport layer contains a hole-transport material. The hole-transport material preferably has a hole mobility of $1\times10^{-6}$ $cm^2/Vs$ or higher. Note that other substances can also be used as long as the substances have a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-transport layer is a functional layer that transports electrons injected from the cathode by the electron-injection layer, to the light-emitting layer. The electron-transport layer contains an electron-transport material. The electron-transport material preferably has an electron mobility of $1\times10^{-6}$ $cm^2/Vs$ or higher. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer is a functional layer that injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, ytterbium, lithium fluoride (LiF), cesium fluoride (CsF), calcium fluoride ($CaF_x$, where x is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide ($LiO_x$), or cesium carbonate, for example. The electron-injection layer may have a stacked-layer structure of two or more layers. In the stacked-layer structure, for example, lithium fluoride can be used for the first layer and ytterbium can be used for the second layer.

Alternatively, the electron-injection layer may be formed using an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, and a pyridazine ring), and a triazine ring.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

In the case of manufacturing a tandem light-emitting device, an intermediate layer is provided between two light-emitting units. The intermediate layer has a function of injecting electrons into one of the two light-emitting units and injecting holes to the other when voltage is applied between the pair of electrodes.

For example, the intermediate layer can be favorably formed using a material that can be used for the electron-injection layer, such as lithium. As another example, the intermediate layer can be favorably formed using a material that can be used for the hole-injection layer. Moreover, the intermediate layer can be a layer containing a hole-transport material and an acceptor material (electron-accepting material). The intermediate layer can be a layer containing an electron-transport material and a donor material. Forming the intermediate layer including such a layer can suppress an increase in the driving voltage that would be caused when the light-emitting units are stacked.

Side surfaces of the pixel electrodes 111a, 111b, and 111c, the first organic layer 113a, the second organic layer 113b, and the third organic layer 113c are covered with the insulating layer 125 and the insulating layer 127. Thus, the fourth organic layer 114 (or the common electrode 115) can be prevented from being in contact with the side surface of any of the pixel electrodes 111a, 111b, and 111c, the first organic layer 113a, the second organic layer 113b, and the third organic layer 113c, whereby a short circuit of the light-emitting device can be prevented.

The insulating layer 125 preferably covers at least the side surfaces of the pixel electrodes 111a, 111b, and 111c. Furthermore, the insulating layer 125 preferably covers the side surfaces of the first organic layer 113*a*, the second organic layer 113*b*, and the third organic layer 113*c*. The insulating layer 125 can be in contact with the side surfaces of the pixel electrodes 111*a*, 111*b*, and 111*c*, the first organic layer 113*a*, the second organic layer 113*b*, and the third organic layer 113*c*.

The insulating layer 127 is provided over the insulating layer 125 to fill a recess portion formed by the insulating layer 125. The insulating layer 127 can overlap with the side surfaces of the pixel electrodes 111*a*, 111*b*, and 111*c*, the first organic layer 113*a*, the second organic layer 113*b*, and the third organic layer 113*c*, with the insulating layer 125 therebetween.

Note that one of the insulating layer 125 and the insulating layer 127 is not necessarily provided. For example, in the case where the insulating layer 125 is not provided, the insulating layer 127 can be in contact with the side surfaces of the first organic layer 113*a*, the second organic layer 113*b*, and the third organic layer 113*c*. The insulating layer 127 can be provided to fill gaps between the EL layers of the light-emitting devices.

The fourth organic layer 114 and the common electrode 115 are provided over the first organic layer 113*a*, the second organic layer 113*b*, the third organic layer 113*c*, the insulating layer 125, and the insulating layer 127. At the stage before the insulating layer 125 and the insulating layer 127 are provided, a level difference due to a region where the pixel electrode and the EL layer are provided and a region where the pixel electrode and the EL layer are not provided (a region between the light-emitting devices) is caused. The display region of one embodiment of the present invention can eliminate the level difference by including the insulating layers 125 and 127, whereby the coverage with the fourth organic layer 114 and the common electrode 115 can be improved. Consequently, it is possible to inhibit a connection defect due to disconnection. Alternatively, it is possible to inhibit an increase in electric resistance due to local thinning of the common electrode 115 by the level difference.

In order to improve the planarity of the formation surfaces of the fourth organic layer 114 and the common electrode 115, the height of the top surface of the insulating layer 125 and the height of the top surface of the insulating layer 127 are each preferably equal to or substantially equal to the height of the top surface of at least one of the first organic layer 113*a*, the second organic layer 113*b*, and the third organic layer 113*c*. The top surface of the insulating layer 127 is preferably flat and may have a projection or a depression.

The insulating layer 125 includes regions in contact with the side surfaces of the first organic layer 113*a*, the second organic layer 113*b*, and the third organic layer 113*c* and functions as a protective insulating layer for the first organic layer 113*a*, the second organic layer 113*b*, and the third organic layer 113*c*. Providing the insulating layer 125 can prevent impurities (e.g., oxygen and moisture) from entering the first organic layer 113*a*, the second organic layer 113*b*, and the third organic layer 113*c* through their side surfaces, resulting in a highly reliable display region.

When the width (thickness) of the insulating layer 125 in the regions in contact with the side surfaces of the first organic layer 113*a*, the second organic layer 113*b*, and the third organic layer 113*c* is large in the cross-sectional view, the intervals between the first to third layers 113*a* to 113*c* increase, so that the aperture ratio may be reduced. Meanwhile, when the width (thickness) of the insulating layer 125 is small, the effect of preventing impurities from entering the first organic layer 113*a*, the second organic layer 113*b*, and the third organic layer 113*c* through their side surfaces may be weakened. The width (thickness) of the insulating layer 125 in the regions in contact with the side surfaces of the first organic layer 113*a*, the second organic layer 113*b*, and the third organic layer 113*c* is preferably greater than or equal to 3 nm and less than or equal to 200 nm, further preferably greater than or equal to 3 nm and less than or equal to 150 nm, further preferably greater than or equal to 5 nm and less than or equal to 150 nm, still further preferably greater than or equal to 5 nm and less than or equal to 100 nm, still further preferably greater than or equal to 10 nm and less than or equal to 100 nm, yet further preferably greater than or equal to 10 nm and less than or equal to 50 nm. When the width (thickness) of the insulating layer 125 is within the above range, the display region can have both a high aperture ratio and high reliability.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. Aluminum oxide is particularly preferable because it has high etching selectivity with the EL layer and has a function of protecting the EL layer during formation of the insulating layer 127 described later. In particular, when an inorganic insulating film such as an aluminum oxide film, a hafnium oxide film, or a silicon oxide film formed by an atomic layer deposition (ALD) method is used as the insulating layer 125, the insulating layer 125 has a small number of pin holes and excels in a function of protecting the EL layer.

Note that in this specification and the like, oxynitride refers to a material that contains more oxygen than nitrogen, and nitride oxide refers to a material that contains more nitrogen than oxygen. For example, a silicon oxynitride refers to a material that contains oxygen at a higher proportion than nitrogen, and a silicon nitride oxide refers to a material that contains nitrogen at a higher proportion than oxygen.

The insulating layer 125 can be formed by a sputtering method, a chemical vapor deposition (CVD) method, a pulsed laser deposition (PLD) method, an ALD method, or the like. The insulating layer 125 is preferably formed by an ALD method achieving good coverage.

The insulating layer 127 provided over the insulating layer 125 has a function of filling the recess portion of the insulating layer 125, which is formed between the adjacent light-emitting devices. In other words, the insulating layer 127 has an effect of improving the planarity of the formation surface of the common electrode 115. As the insulating layer 127, an insulating layer containing an organic material can be favorably used. For example, the insulating layer 127 can be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The insulating layer 127 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. Moreover, the insulating layer 127 can be formed using a photosensitive resin. A photoresist may be used as the photosensitive resin. The photosensitive resin can be of positive or negative type.

The difference between the height of the top surface of the insulating layer 127 and the height of the top surface of one of the first organic layer 113*a*, the second organic layer 113*b*, and the third organic layer 113*c* is preferably less than or equal to 0.5 times, further preferably less than or equal to 0.3 times the thickness of the insulating layer 127, for example. As another example, the insulating layer 127 may be provided so that the height of the top surface of one of the first organic layer 113*a*, the second organic layer 113*b*, and the third organic layer 113*c* is greater than the height of the top surface of the insulating layer 127. As another example, the insulating layer 127 may be provided so that the height of the top surface of the insulating layer 127 is greater than the height of the top surface of the light-emitting layer included in the first organic layer 113*a*, the second organic layer 113*b*, or the third organic layer 113*c*.

The insulating layers 131 and 132 are preferably provided over the light-emitting devices 130*a*, 130*b*, and 130*c*. Providing the insulating layers 131 and 132 can improve the reliability of the light-emitting devices.

There is no limitation on the conductivity of the insulating layers 131 and 132. As the insulating layers 131 and 132, at least one type of insulating films, semiconductor films, and conductive films can be used.

The insulating layers 131 and 132 including inorganic films can suppress deterioration of the light-emitting devices by preventing oxidation of the common electrode 115 and inhibiting entry of impurities (e.g., moisture and oxygen) into the light-emitting devices 130*a*, 130*b*, and 130*c*, for example; thus, the reliability of the display region can be improved.

As the insulating layers 131 and 132, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

Each of the insulating layers 131 and 132 preferably includes a nitride insulating film or a nitride oxide insulating film, and further preferably includes a nitride insulating film.

As the insulating layers 131 and 132, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the insulating layers 131 and 132, the insulating layers 131 and 132 preferably have a high visible-light-transmitting property. For example, ITO, IGZO, and aluminum oxide are preferable because they are inorganic materials having a high visible-light-transmitting property.

The insulating layers 131 and 132 can be, for example, a stack of an aluminum oxide film and a silicon nitride film over the aluminum oxide film, or a stack of an aluminum oxide film and an IGZO film over the aluminum oxide film. Such a stacked-layer structure can suppress entry of impurities (e.g., water and oxygen) into the EL layer.

Furthermore, the insulating layers 131 and 132 may include an organic film. For example, the insulating layer 132 may include both an organic film and an inorganic film.

The insulating layer 131 and the insulating layer 132 may be formed by different deposition methods. Specifically, the insulating layer 131 may be formed by an ALD method, and the insulating layer 132 may be formed by a sputtering method.

Upper end portions of the pixel electrodes 111*a*, 111*b*, and 111*c* are not covered with an insulating layer. Thus, the distance between adjacent light-emitting devices can be extremely shortened. Accordingly, the display region can have high resolution or high definition.

In the display region 100 of this embodiment, the distance between the light-emitting devices can be narrowed. Specifically, the distance between the light-emitting devices, the distance between the EL layers, or the distance between the pixel electrodes can be less than 10 μm, 5 μm or less, 3 μm or less, 2 μm or less, 1 μm or less, 500 nm or less, 200 nm or less, 100 nm or less, 90 nm or less, 70 nm or less, 50 nm or less, 30 nm or less, 20 nm or less, 15 nm or less, or 10 nm or less. In other words, the display apparatus includes a region where the distance between the side surface of the first organic layer 113*a* and the side surface of the second organic layer 113*b* or the distance between the side surface of the second organic layer 113*b* and the side surface of the third organic layer 113*c* is 1 μm or less, preferably 0.5 μm (500 nm) or less, further preferably 100 nm or less.

A light-blocking layer may be provided on the surface of the substrate 120 on the resin layer 122 side. Moreover, a variety of optical members can be provided on the outer side of the substrate 120. Examples of optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be provided on the outer surface of the substrate 120.

For the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as the substrate 120.

In the case where a circularly polarizing plate overlaps with the display region, a highly optically isotropic substrate is preferably used as the substrate included in the display apparatus. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of films having high optical isotropy include a triacetyl cellulose (TAC, also referred to as cellulose triacetate) film, a cycloolefin polymer (COP) film, a cycloolefin copolymer (COC) film, and an acrylic resin film.

When a film used as the substrate absorbs water, the shape of the display panel might be changed, e.g., creases might be caused. Thus, as the substrate, a film with a low water absorption rate is preferably used. For example, the water absorption rate of the film is preferably 1% or lower, further preferably 0.1% or lower, still further preferably 0.01% or lower.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As materials for a gate, a source, and a drain of a transistor and conductive layers functioning as wirings and electrodes included in the display panel, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, stacked films of any of the above materials can be used for the conductive layers. For example, stacked films of indium tin oxide and an alloy of silver and magnesium are preferably used, in which case the conductivity can be increased. These materials can also be used for conductive layers such as wirings and electrodes included in the display panel, and conductive layers (e.g., a conductive layer functioning as the pixel electrode or the common electrode) included in the light-emitting device.

Examples of insulating materials that can be used for insulating layers include resins such as an acrylic resin and an epoxy resin, and inorganic insulating materials such as silicon oxide, silicon oxynitride, silicon nitride oxide, silicon nitride, and aluminum oxide.

[Pixel Layout]

Next, pixel layouts different from that in FIG. 6A will be described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting device.

Figure 7A:
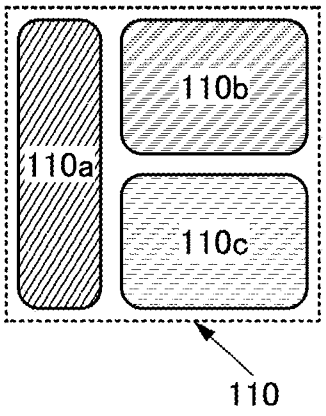
FIGS. 7A to 7E are top views showing examples of pixels.
Figure 8A:
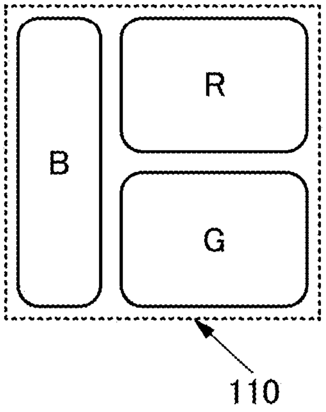
FIGS. 8A to 8E are top views showing examples of pixels.

The pixel 110 illustrated in FIG. 7A employs S-stripe arrangement. The pixel 110 in FIG. 7A consists of three subpixels 110*a*, 110*b*, and 110*c*. For example, as illustrated in FIG. 8A, the subpixel 110*a* may be a blue subpixel B, the subpixel 110*b* may be a red subpixel R, and the subpixel 110*c* may be a green subpixel G.

Figure 7B:
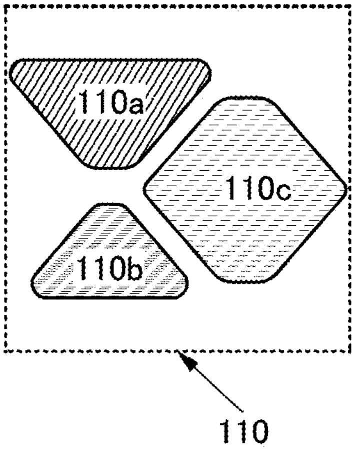
Figure 8B:
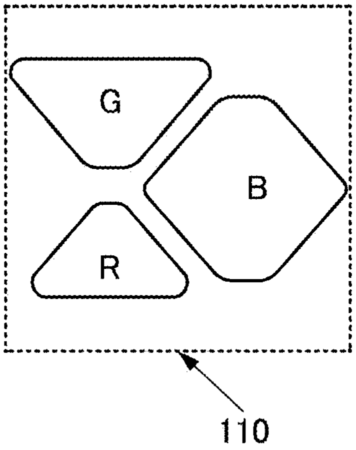

The pixel 110 illustrated in FIG. 7B includes the subpixel 110*a* whose top surface has a rough trapezoidal shape with rounded corners, the subpixel 110*b* whose top surface has a rough triangle shape with rounded corners, and the subpixel 110*c* whose top surface has a rough tetragonal or rough hexagonal shape with rounded corners. The subpixel 110*a* has a larger light-emitting area than the subpixel 110*b*. In this manner, the shapes and sizes of the subpixels can be determined independently. For example, the size of a subpixel including a light-emitting device with higher reliability can be smaller. For example, as illustrated in FIG. 8B, the subpixel 110*a* may be a green subpixel G, the subpixel 110*b* may be a red subpixel R, and the subpixel 110*c* may be a blue subpixel B.

Figure 7C:
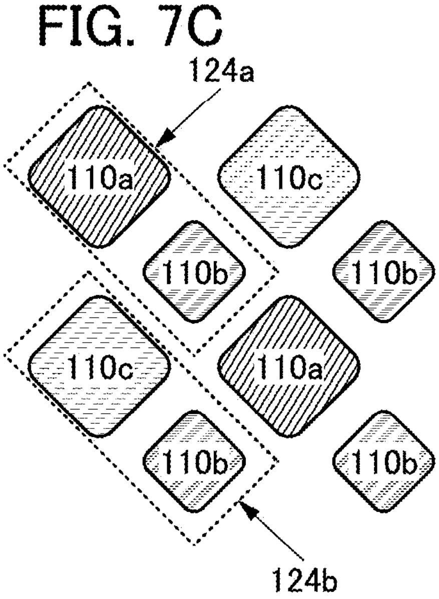
Figure 8C:
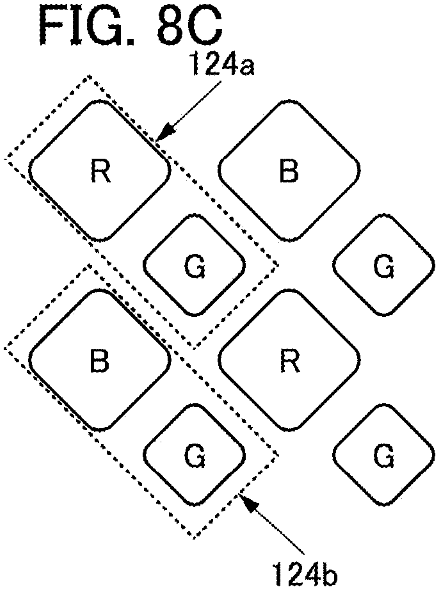

Pixels 124*a* and 124*b* illustrated in FIG. 7C employ pentile arrangement. FIG. 7C shows an example in which the pixels 124*a* including the subpixels 110*a* and 110*b* and the pixels 124*b* including the subpixels 110*b* and 110*c* are alternately arranged. For example, as illustrated in FIG. 8C, the subpixel 110*a* may be a red subpixel R, the subpixel 110*b* may be a green subpixel G, and the subpixel 110*c* may be a blue subpixel B.

Figure 7D:
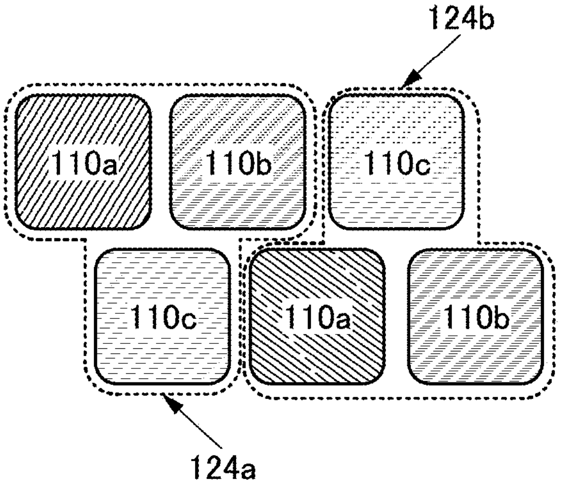
Figure 7E:
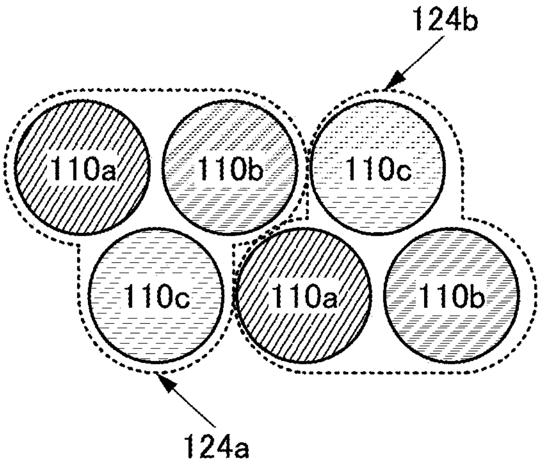
Figure 8D:
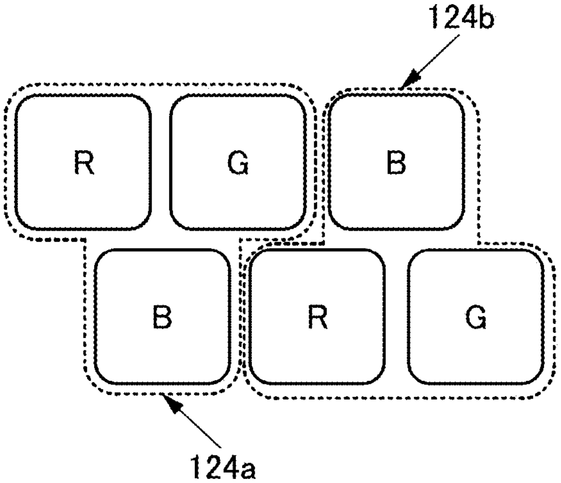

The pixels 124*a* and 124*b* illustrated in FIGS. 7D and 7E employ delta arrangement. The pixel 124*a* includes two subpixels (the subpixels 110*a* and 110*b*) in the upper row (first row) and one subpixel (the subpixel 110*c*) in the lower row (second row). The pixel 124*b* includes one subpixel (the subpixel 110*c*) in the upper row (first row) and two subpixels (the subpixels 110*a* and 110*b*) in the lower row (second row). For example, as illustrated in FIG. 8D, the subpixel 110*a* may be a red subpixel R, the subpixel 110*b* may be a green subpixel G, and the subpixel 110*c* may be a blue subpixel B.

FIG. 7D shows an example where the top surface of each subpixel has a rough tetragonal shape with rounded corners, and FIG. 7E shows an example where the top surface of each subpixel is circular.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel can have a polygonal shape with rounded corners, an elliptical shape, a circular shape, or the like.

Furthermore, in the method for manufacturing the display panel of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer may have a polygonal shape with rounded corners, an elliptical shape, a circular shape, or the like. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance so that a transferred pattern agrees with a design pattern (an optical proximity correction (OPC) technique) may be used. Specifically, with the OPC technique, a pattern for correction is added to a corner portion or the like of a figure on a mask pattern.

Figure 8E:
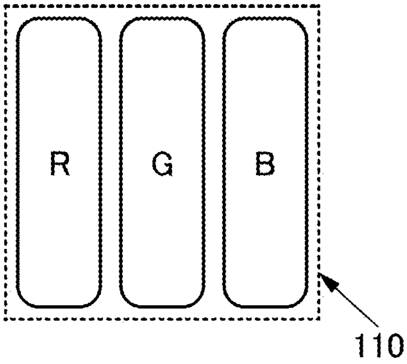

Also in the pixel 110 illustrated in FIG. 6A, which employs stripe arrangement, the subpixel 110*a* may be a red subpixel R, the subpixel 110*b* may be a green subpixel G, and the subpixel 110*c* may be a blue subpixel B as illustrated in FIG. 8E, for example.

In one embodiment of the present invention, an organic EL device is used as a light-emitting device.

In the display region 100 of one embodiment of the present invention, light-emitting devices are arranged in a matrix in a pixel portion, and an image can be displayed on the pixel portion.

The refresh rate of the display region 100 of one embodiment of the present invention can be variable. For example, the refresh rate is adjusted (in the range from 0.01 Hz to 240 Hz, for example) in accordance with contents displayed on the display region 100, whereby power consumption can be reduced.

Embodiment 5

In this embodiment, structure examples and application examples of a panel that is one embodiment of a display panel that can easily have a larger size are described with reference to drawings.

One embodiment of the present invention is a display panel capable of increasing its size by arranging a plurality of display panels to partly overlap one another. In two of the overlapping display panels, at least a display panel positioned on the display surface side (upper side) includes a region transmitting visible light that is adjacent to a display portion. A pixel of a display panel positioned on the lower side and the region transmitting visible light of the display panel positioned on the upper side are provided to overlap with each other. Thus, the two of the overlapping display panels can display a seamless and contiguous image when seen from the display surface side (in a planar view).

For example, one embodiment of the present invention is a panel including a first display panel and a second display panel.

For one or both of the first display panel and the second display panel, the display apparatus described above as an example, which includes a light-emitting element and a light-receiving element, can be used. In other words, at least one of the first pixel, the second pixel, and the third pixel includes a light-emitting element and a light-receiving element.

Specifically, the following structure can be employed, for example.

Structure Example 1

[Display Panel]

Figure 9A:
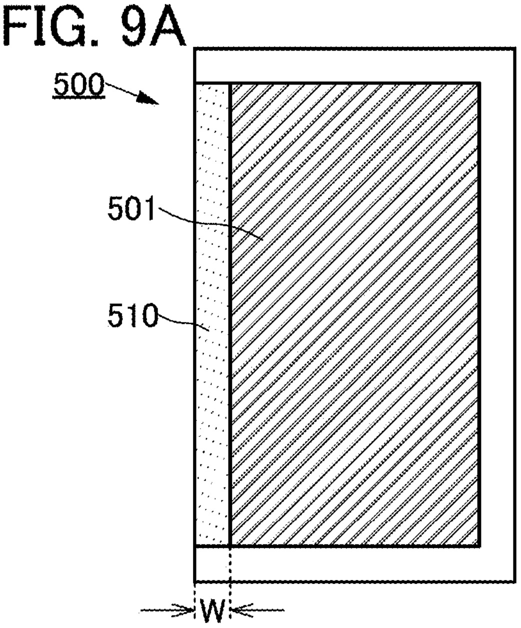
FIGS. 9A and 9B each show a structure example of a display apparatus.

FIG. 9A is a schematic top view of a display panel 500 included in a display apparatus of one embodiment of the present invention. For easy understanding, an example is shown in which the display panel 500 has a rectangular shape, but the shape is not limited thereto.

The display panel 500 includes a display region 501 and a region 510 transmitting visible light that is adjacent to the display region 501.

Here, an image can be displayed on the display region 501 even when the display panel 500 is used independently. Moreover, an image can be captured by the display region 501 even when the display panel 500 is used independently.

In the region 510, for example, a pair of substrates included in the display panel 500, a sealant for sealing the display element sandwiched between the pair of substrates, and the like may be provided. Here, for members provided in the region 510, materials that transmit visible light are used. The width W of the region 510 is preferably as small as possible, and in this embodiment, part of the region 510 is preferably removed by laser processing. Note that in this specification, the width direction and the depth direction are defined as the direction in the plane including the width W and the thickness direction, respectively. A junction portion has a structure similar to that in Embodiment 1 or 2.

A terminal (also referred to as a connection terminal) electrically connected to an external terminal or a wiring layer, a wiring electrically connected to the terminal, and the like are provided on the rear surface side, and thus are not illustrated here. In addition, a driver circuit is also provided on the rear surface side.

For specific description of a cross-sectional structure example or the like of the display panel, the other embodiments can be referred to.

[Panel]

Figure 9B:
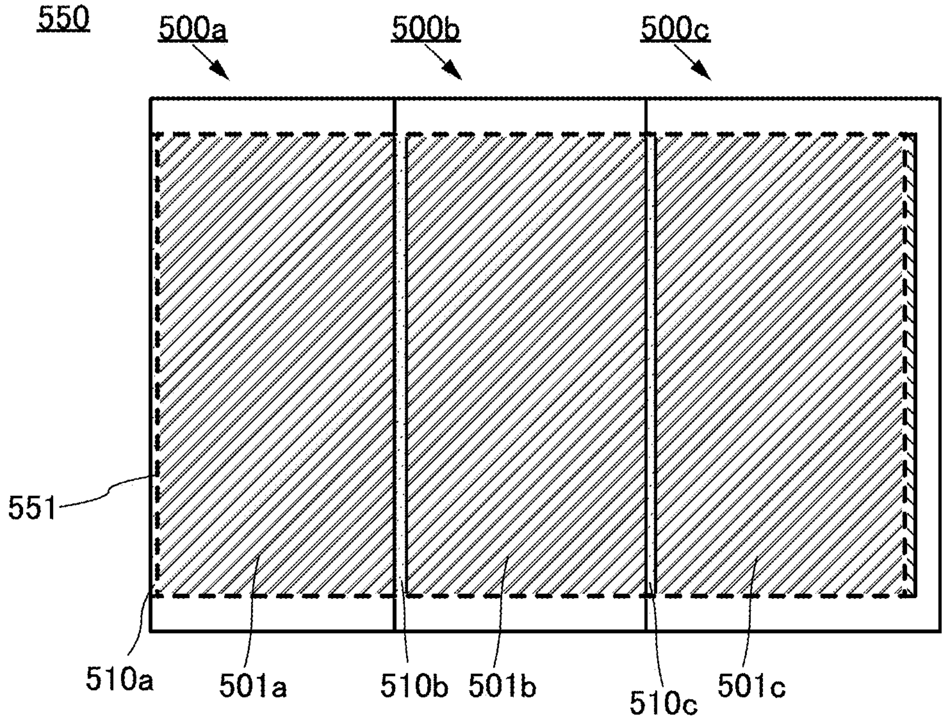

A panel 550 of one embodiment of the present invention includes a plurality of display panels 500 described above. FIG. 9B is a schematic top view of the panel 550 including three display panels.

Hereinafter, to distinguish the display panels from each other, the same components included in the display panels from each other, or the same components relating to the display panels from each other, letters are added to reference numerals of them. Unless otherwise specified, in a plurality of display panels partly overlapping with each other, "a" is added to reference numerals for a display panel placed on the lowest side (the side opposite to the display surface side), components thereof, and the like, and to one or more display panels placed on the upper side of the display panel, components thereof, and the like, "b" or letters after "b" in alphabetical order are added from the lower side. Furthermore, unless otherwise specified, in describing a structure in which a plurality of display panels is included, letters are not added when a common part of the display panels or the components or the like is described.

The panel 550 in FIG. 9B includes a display panel 500*a*, a display panel 500*b*, and a display panel 500*c*. End portions of the display panel 500*b* and the display panel 500*c* are removed by laser light treatment.

The display panel 500*b* is placed so that part of the display panel 500*b* is stacked over an end portion of the display panel 500*a*. Specifically, the display panel 500*b* is placed so that a region 510*b* transmitting visible light of the display panel 500*b* overlaps with a display region 501*a* of the display panel 500*a*.

Furthermore, the display panel 500*c* is placed so that part of the display panel 500*c* overlaps an upper side (a display surface side) of the display panel 500*b*. Specifically, the display panel 500*c* is placed so that a region 510*c* transmitting visible light of the display panel 500*c* overlaps with a display region 501*b* of the display panel 500*b*.

The region 510*b* transmitting visible light overlaps with the display region 501*a*; thus, the whole display region 501*a* is visually recognized from the display surface side. Similarly, the whole display region 501*b* is also visually recognized from the display surface side when the region 510*c* overlaps with the display region 501*b*. Therefore, a region where the display region 501*a*, the display region 501*b*, and the display region 501*c* are placed seamlessly can serve as a display region 551 of the panel 550. Alternatively, all the regions 510*b* transmitting visible light may be removed using laser light and the display panel 500*a*, the display panel 500*b*, and the display panel 500*c* may be arranged by a tiling method.

The display region 551 of the panel 550 can be enlarged by the number of display panels 500. Here, by using display panels each having an image capturing function (i.e., display panels each including a light-emitting element and a light-receiving element) as all the display panels 500, the entire display region 551 can serve as an imaging region.

Note that without limitation to the above, a display panel having an image capturing function and a display panel not having an image capturing function (e.g., a display panel having no light-receiving element) may be combined. For example, a display panel having an image capturing function can be used where needed, and a display panel not having an image capturing function can be used in other portions.

Structure Example 2

In FIG. 9B, the plurality of display panels 500 are arranged in one direction; however, a plurality of display panels 500 may be arranged in two directions of the vertical and horizontal directions.

Figure 10A:
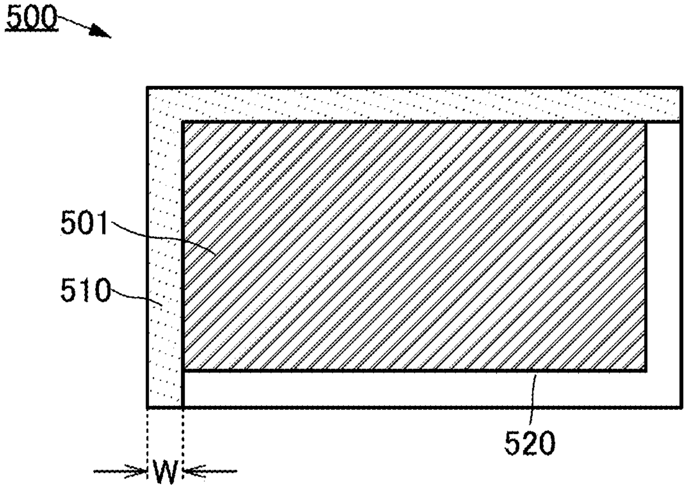
FIGS. 10A to 10C show a structure example of a display apparatus.

FIG. 10A shows an example of the display panel 500 in which the shape of the region 510 is different from that in FIG. 9A. In the display panel 500 in FIG. 10A, the region 510 transmitting visible light is placed along adjacent two sides of the display region 501.

Figure 10B:
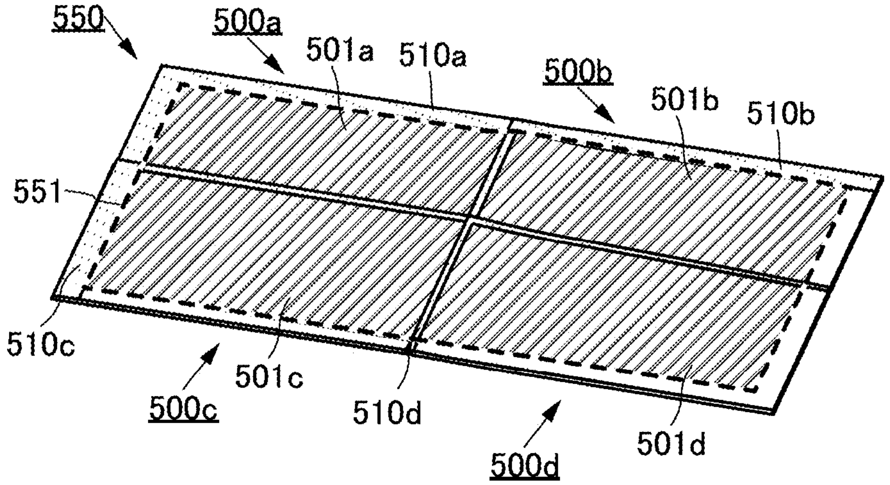
Figure 10C:
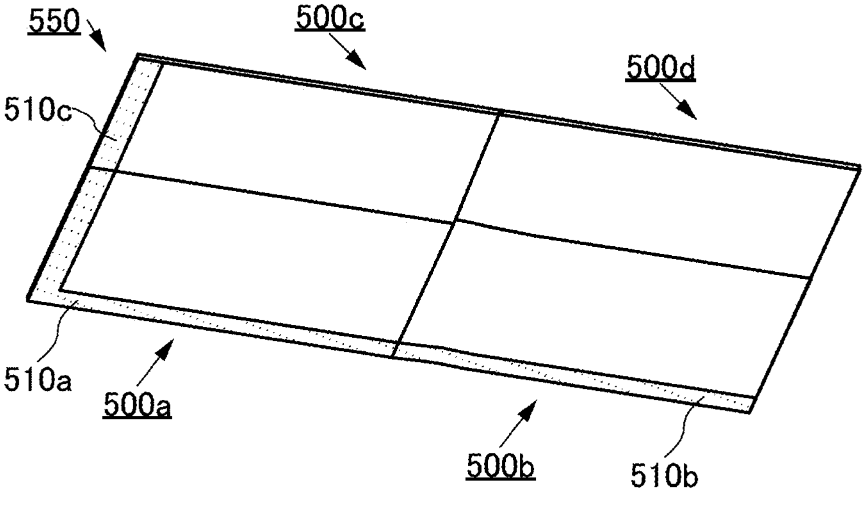

FIG. 10B is a schematic perspective view of the panel 550 in which the display panels 500 in FIG. 10A are arranged two by two in both vertical and horizontal directions. FIG. 10C is a schematic perspective view of the panel 550 when seen from a side opposite to the display surface side. Although not illustrated, for connection to an external terminal, an electrode or a terminal is provided on the side opposite to the display surface side, and is connected to a support including a wiring layer.

In FIGS. 10B and 10C, part of the region 510*b* of the display panel 500*b* overlaps with a region along a short side of the display region 501*a* of the display panel 500*a*. In addition, part of the region 510*c* of the display panel 500*c* overlaps with a region along a long side of the display region 501*a* of the display panel 500*a*. Moreover, the region 510*d* of the display panel 500*d* overlaps both a region along a long side of the display region 501*b* of the display panel 500*b* and a region along a short side of the display region 501*c* of the display panel 500*c*.

Therefore, as illustrated in FIG. 10B, a region where the display region 501*a*, the display region 501*b*, the display region 501*c*, and the display region 501*d* are placed seamlessly can serve as the display region 551 of the panel 550.

Here, it is preferable that a flexible material be used for the pair of substrates included in the display panel 500 and the display panel 500 have flexibility. A plurality of display panels 500 are combined after their end portions are processed by laser light. For connection between wirings or electrodes, an anisotropic conductive paste may be provided in addition to an adhesive layer at a boundary.

The display regions can be leveled, so that the display quality of an image displayed on the display region 551 of the panel 550 can be improved.

Furthermore, to reduce the step between two adjacent display panels 500, the thickness of the display panel 500 is preferably small. For example, the thickness of the display panel 500 is preferably less than or equal to 1 mm, further preferably less than or equal to 300 μm, still further preferably less than or equal to 100 μm.

A substrate for protecting the display region 551 of the panel 550 may be provided. The substrate may be provided for each display panel, or one substrate may be provided for a plurality of display panels.

Note that although the four rectangular display panels 500 are arranged here, the number of the display panels 500 is increased, whereby a large panel can be obtained. Furthermore, by changing a method for arranging the plurality of display panels 500, the shape of the contour of the display region of the panel can be a non-rectangular shape, e.g., any of a variety of shapes such as a circular shape, an elliptical shape, and a polygonal shape. In addition, when the display panels 500 are arranged in a three-dimensional manner, a panel including a display region having a three-dimensional shape, e.g., any of a circular cylindrical shape, a spherical shape, and a hemispherical shape, can be obtained.

At least part of this embodiment can be implemented in combination with any of the other embodiments described in this specification, as appropriate.

Embodiment 6

In this embodiment, a light-emitting/receiving apparatus of one embodiment of the present invention will be described.

A light-emitting/receiving portion of the light-emitting/receiving apparatus of one embodiment of the present invention includes light-receiving elements (also referred to as light-receiving devices) and light-emitting elements (also referred to as light-emitting devices). The light-emitting/receiving portion has a function of displaying an image with the use of the light-emitting elements. Furthermore, the light-emitting/receiving portion has one or both of an image capturing function and a sensing function with use of the light-receiving elements. Thus, the light-emitting/receiving apparatus of one embodiment of the present invention can be expressed as a display apparatus, and the light-emitting/receiving portion can be expressed as a display portion.

Alternatively, the light-emitting/receiving apparatus of one embodiment of the present invention may be configured to include a light-emitting/receiving element (also referred to as a light-emitting/receiving device) and a light-emitting element.

First, the light-emitting/receiving apparatus including a light-receiving element and a light-emitting element is described.

The light-emitting/receiving apparatus of one embodiment of the present invention includes light-receiving elements and light-emitting elements in the light-emitting/receiving portion. In the light-emitting/receiving apparatus of one embodiment of the present invention, the light-emitting elements are arranged in a matrix in a light-emitting/receiving portion, and an image can be displayed on the light-emitting/receiving portion. Furthermore, the light-receiving elements are arranged in a matrix in the light-emitting/receiving portion, and the light-emitting/receiving portion has one or both of an image capturing function and a sensing function. The light-emitting/receiving portion can be used as an image sensor, a touch sensor, or the like. That is, by sensing light with the light-emitting/receiving portion, an image can be taken and touch operation with an object (e.g., a finger or a stylus) can be detected. Furthermore, in the light-emitting/receiving apparatus of one embodiment of the present invention, the light-emitting elements can be used as a light source of the sensor. Accordingly, a light-receiving portion and a light source do not need to be provided separately from the light-emitting/receiving apparatus; hence, the number of components of an electronic device can be reduced.

In other words, the electronic device of one embodiment of the present invention includes both the light-emitting device and the sensor device, so that, for example, a fingerprint authentication device or a capacitive touch panel device for scrolling or the like is not necessarily provided separately from the electronic device. Thus, one embodiment of the present invention can provide an electronic device with reduced manufacturing cost.

In the light-emitting/receiving apparatus of one embodiment of the present invention, when an object reflects (or scatters) light emitted from the light-emitting element included in the light-emitting/receiving portion, the light-receiving element can sense the reflected light (or the scattered light); thus, image capturing, touch operation sensing, or the like is possible even in a dark place.

The light-emitting element included in the light-emitting/receiving apparatus of one embodiment of the present invention functions as a display element (also referred to as a display device).

As the light-emitting element, an EL element (also referred to as an EL device) such as an OLED or a QLED is preferably used. Examples of light-emitting substances included in EL elements include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). Alternatively, as the light-emitting element, an LED such as a micro LED (also referred to as a μLED in some cases) can be used.

The light-emitting/receiving apparatus of one embodiment of the present invention has a function of sensing light using the light-receiving elements.

When the light-receiving elements are used as an image sensor, the light-emitting/receiving apparatus can capture an image using the light-receiving elements. For example, the light-emitting/receiving apparatus can be used as a scanner.

An electronic device including the light-emitting/receiving apparatus of one embodiment of the present invention can acquire data related to biological information such as a fingerprint or a palm print by using a function of an image sensor. That is, a biological authentication sensor can be incorporated in the light-emitting/receiving apparatus. When the light-emitting/receiving apparatus incorporates a biological authentication sensor, the number of components of an electronic device can be reduced as compared to the case where a biological authentication sensor is provided separately from the light-emitting/receiving apparatus; thus, the size and weight of the electronic device can be reduced.

When the light-receiving elements are used as a touch sensor, the light-emitting/receiving apparatus can detect touch operation by an object with the use of the light-receiving elements.

As the light-receiving element, a PN photodiode or a PIN photodiode can be used, for example. The light-receiving element functions as a photoelectric conversion element (also referred to as a photoelectric conversion device) that senses light incident on the light-receiving element and generates charge. The amount of electric charge generated from the light-receiving elements depends on the amount of light entering the light-receiving elements.

It is particularly preferable to use an organic photodiode including a layer containing an organic compound as the light-receiving element. An organic photodiode, which is easily made thin, lightweight, and large in area and has a high degree of freedom for shape and design, can be used in a variety of devices.

In one embodiment of the present invention, organic EL elements (also referred to as organic EL devices) are used as the light-emitting elements, and organic photodiodes are used as the light-receiving elements. The organic EL elements and the organic photodiodes can be formed over one substrate. Thus, the organic photodiodes can be incorporated in a display apparatus including the organic EL elements.

If all the layers of the organic EL elements and the organic photodiodes are formed separately, the number of deposition steps becomes extremely large. However, a large number of layers can be shared between the organic photodiodes and the organic EL elements; hence, forming the common layers concurrently can prevent the increase in the number of deposition steps.

For example, one of a pair of electrodes (a common electrode) can be a layer shared by the light-receiving element and the light-emitting element. As another example, at least one of a hole-injection layer, a hole-transport layer, an electron-transport layer, and an electron-injection layer is preferably shared by the light-receiving element and the light-emitting element. When the light-receiving element and the light-emitting element include a common layer in such a manner, the number of deposition steps and the number of masks can be reduced, thereby reducing the number of manufacturing steps and the manufacturing cost of the light-emitting/receiving apparatus. Furthermore, the light-emitting/receiving apparatus including the light-receiving elements can be manufactured using an existing manufacturing apparatus and an existing manufacturing method for the display apparatus.

Next, a light-emitting/receiving apparatus including a light-emitting/receiving element and a light-emitting element is described. Note that functions, behavior, effects, and the like similar to those in the above are not be described in some cases.

In the light-emitting/receiving apparatus of one embodiment of the present invention, a subpixel exhibiting any color includes a light-emitting/receiving element instead of a light-emitting element, and subpixels exhibiting the other colors each include a light-emitting element. The light-emitting/receiving element has both a function of emitting light (a light-emitting function) and a function of receiving light (a light-receiving function). For example, in the case where a pixel includes three subpixels of red, green, and blue, at least one of the subpixels includes a light-emitting/receiving element and the other subpixels each include a light-emitting element. Thus, the light-emitting/receiving portion of the light-emitting/receiving apparatus of one embodiment of the present invention has a function of displaying an image using both a light-emitting/receiving element and a light-emitting element.

The use of the light-emitting/receiving element serving as both a light-emitting element and a light-receiving element can provide a light-receiving function for the pixel without increasing the number of subpixels included in the pixel. Thus, the light-emitting/receiving portion of the light-emitting/receiving apparatus can be provided with one or both of an image capturing function and a sensing function while keeping the aperture ratio of pixels (aperture ratio of subpixels) and the resolution of the light-emitting/receiving apparatus. Accordingly, in the light-emitting/receiving apparatus of one embodiment of the present invention, the aperture ratio of the pixel can be more increased and the resolution can be increased more easily than in the case where a subpixel including a light-receiving element is provided separately from a subpixel including a light-emitting element In the light-emitting/receiving apparatus of one embodiment of the present invention, light-emitting/receiving elements and light-emitting elements are arranged in a matrix in a light-emitting/receiving portion, and an image can be displayed on the light-emitting/receiving portion. The light-emitting/receiving portion can be used as an image sensor, a touch sensor, or the like. In the light-emitting/receiving apparatus of one embodiment of the present invention, the light-emitting elements can be used as a light source of the sensor. Thus, image capturing, touch operation sensing, or the like is possible even in a dark place.

The light-emitting/receiving element can be manufactured by combining an organic EL element and an organic photodiode. For example, by adding an active layer of an organic photodiode to a layered structure of an organic EL element, the light-emitting/receiving element can be manufactured. Furthermore, in the light-emitting/receiving element formed of a combination of an organic EL element and an organic photodiode, layers common to the organic EL element and the organic photodiode are formed together, so that an increase in the number of deposition steps can be prevented.

For example, one of a pair of electrodes (a common electrode) can be a layer shared by the light-emitting/receiving elements and the light-emitting elements. As another example, at least one of a hole-injection layer, a hole-transport layer, an electron-transport layer, and an electron-injection layer may be shared by the light-emitting/receiving elements and the light-emitting elements.

Note that layers included in the light-emitting/receiving elements might have different functions between the case where the light-emitting/receiving elements function as the light-receiving elements and the case where the light-emitting/receiving elements function as the light-emitting elements. In this specification, the name of a component is based on its function of the case where the light-emitting/receiving elements function as the light-emitting elements.

The light-emitting/receiving apparatus of this embodiment has a function of displaying images using the light-emitting elements and the light-emitting/receiving elements. That is, the light-emitting element and the light-emitting/receiving element function as a display element.

The light-emitting/receiving apparatus of this embodiment has a function of sensing light using the light-emitting/receiving elements. The light-emitting/receiving element can sense light having a shorter wavelength than light emitted by the light-emitting/receiving element itself.

When the light-emitting/receiving elements are used as an image sensor, the light-emitting/receiving apparatus of this embodiment can capture an image using the light-emitting/receiving elements. When the light-emitting/receiving element is used as the touch sensor, the light-emitting/receiving apparatus of this embodiment can detect touch operation of an object with the use of the light-emitting/receiving element.

The light-emitting/receiving element functions as a photoelectric conversion element. The light-emitting/receiving element can be manufactured by adding an active layer of the light-receiving element to the above-described structure of the light-emitting element. In the light-emitting/receiving element, an active layer of a PN photodiode or a PIN photodiode can be used, for example.

In the light-emitting/receiving element, it is particularly preferable to use an active layer of an organic photodiode including a layer containing an organic compound. An organic photodiode, which is easily made thin, lightweight, and large in area and has a high degree of freedom for shape and design, can be used in a variety of devices.

A display apparatus that is an example of the light-emitting/receiving apparatus of one embodiment of the present invention is more specifically described below with reference to drawings.

Structure Example 1 of Display Apparatus

Structure Example 1-1

Figure 11A:
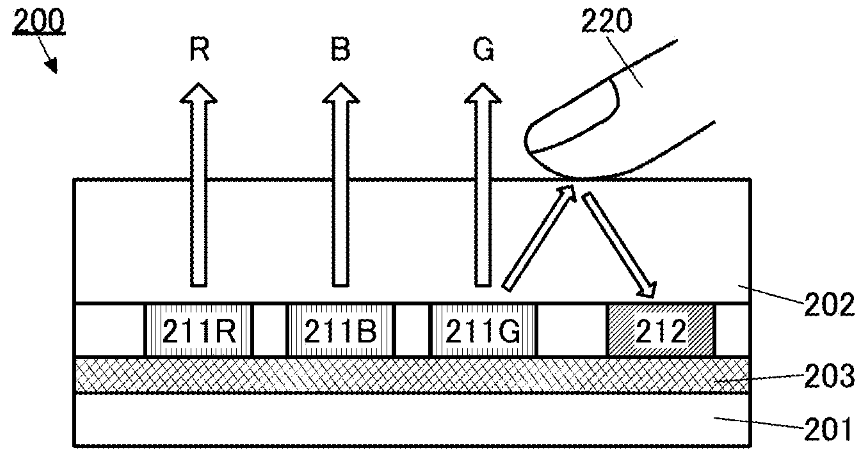
FIGS. 11A, 11B, and 11D are cross-sectional views showing an example of a display apparatus.

FIG. 11A is a schematic diagram of a display panel 200. The display panel 200 includes a substrate 201, a substrate 202, a light-receiving element 212, a light-emitting device 211R, a light-emitting device 211G, a light-emitting device 211B, the functional layer 203, and the like.

The light-emitting devices 211R, 211G, and 211B and the light-receiving element 212 are provided between the substrate 201 and the substrate 202. The light-emitting device 211R, the light-emitting device 211G, and the light-emitting device 211B emit red (R) light, green (G) light, and blue (B) light, respectively. Hereinafter, in the case where the light-emitting device 211R, the light-emitting device 211G, and the light-emitting device 211B are not distinguished from each other, each light-emitting device is referred to as a light-emitting device 211 in some cases.

The display panel 200 includes a plurality of pixels arranged in a matrix. One pixel includes at least one subpixel. One subpixel includes one light-emitting element. For example, the pixel can include three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes the light-receiving element 212. The light-receiving element 212 may be provided in all the pixels or in some of the pixels. In addition, one pixel may include a plurality of light-receiving elements 212.

FIG. 11A shows a state where a finger 220 touches a surface of the substrate 202. Part of light emitted from the light-emitting device 211G is reflected by a contact portion of the substrate 202 and the finger 220. In the case where part of reflected light or scattered light is incident on the light-receiving element 212, the contact of the finger 220 with the substrate 202 can be sensed. That is, the display panel 200 can function as a touch panel.

The functional layer 203 includes a circuit for driving the light-emitting device 211R, the light-emitting device 211G, and the light-emitting device 211B and a circuit for driving the light-receiving element 212. The functional layer 203 includes a switch, a transistor, a capacitor, a wiring, and the like. Note that in the case where the light-emitting device 211R, the light-emitting device 211G, the light-emitting device 211B, and the light-receiving element 212 are driven by a passive-matrix method, a structure not provided with a switch, a transistor, or the like may be employed.

Figure 11B:
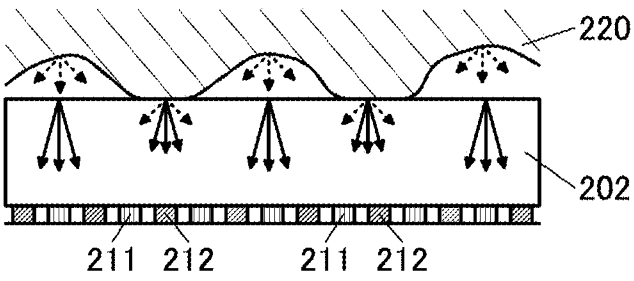

The display panel 200 preferably has a function of sensing a fingerprint of the finger 220. FIG. 11B schematically shows an enlarged view of the contact portion when the finger 220 touches the substrate 202. FIG. 11B shows the light-emitting devices 211 and the light-receiving element 212 that are alternately arranged.

The fingerprint of the finger 220 is formed of depressions and projections. Therefore, as illustrated in FIG. 11B, the projections of the fingerprint touch the substrate 202.

Reflection of light from a surface, an interface, or the like is categorized into regular reflection and diffuse reflection. Regularly reflected light is highly directional light with an angle of reflection equal to the angle of incidence. Diffusely reflected light has low directionality and low angular dependence of intensity. As for regular reflection and diffuse reflection, diffuse reflection components are dominant in the light reflected from the surface of the finger 220. Meanwhile, regular reflection components are dominant in the light reflected from the interface between the substrate 202 and the air.

The intensity of light that is reflected from contact surfaces or non-contact surfaces between the finger 220 and the substrate 202 and enters the light-receiving elements 212 which are positioned directly below the contact surfaces or the non-contact surfaces is the sum of intensities of regularly reflected light and diffusely reflected light. As described above, regularly reflected light (indicated by solid arrows) is dominant near the depressions of the finger 220, where the finger 220 is not in contact with the substrate 202; whereas diffusely reflected light (indicated by dashed arrows) from the finger 220 is dominant near the projections of the finger 220, where the finger 220 is in contact with the substrate 202. Thus, the intensity of light received by the light-receiving element 212 positioned directly below the depression is higher than the intensity of light received by the light-receiving element 212 positioned directly below the projection. Accordingly, an image of the fingerprint of the finger 220 can be captured.

When the interval between the light-receiving elements 212 is smaller than the distance between two projections of the fingerprint, preferably the distance between a depression and a projection adjacent to each other, a clear fingerprint image can be obtained. The distance between a depression and a projection of a human's fingerprint is approximately 200 μm; thus, the interval between the light-receiving elements 212 is, for example, less than or equal to 400 μm, preferably less than or equal to 200 μm, further preferably less than or equal to 150 μm, still further preferably less than or equal to 100 μm, even still further preferably less than or equal to 50 μm and greater than or equal to 1 μm, preferably greater than or equal to 10 μm, further preferably greater than or equal to 20 μm.

Figure 11C:
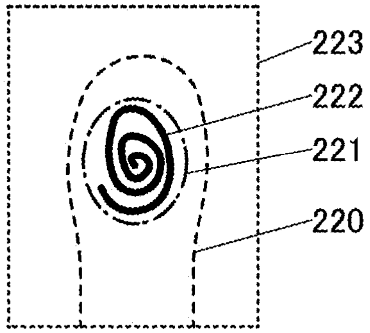
FIGS. 11C and 11E are diagrams showing examples of images.

FIG. 11C shows an example of a fingerprint image captured with the display panel 200. In FIG. 11C, in an imaging range 223, the outline of the finger 220 is indicated by a dashed-dotted line and the outline of a contact portion 221 is indicated by a dashed line. In the contact portion 221, a high-contrast image of a fingerprint 222 can be captured by a difference in light incident on the light-receiving element 212.

Figure 11D:
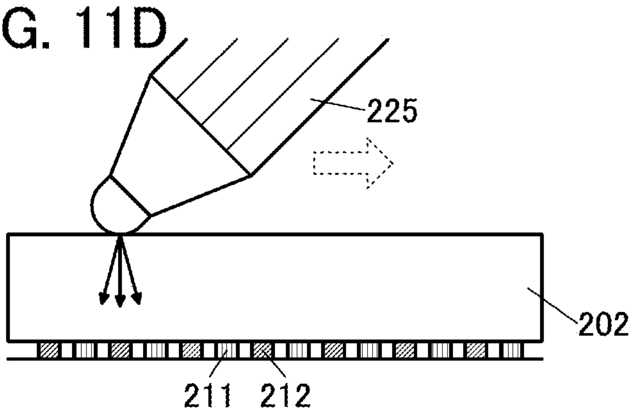

The display panel 200 can also function as a touch panel or a pen tablet. FIG. 11D shows a state in which a tip of a stylus 225 slides in a direction indicated by a dashed-dotted arrow while the tip of the stylus 225 touches the substrate 202.

As shown in FIG. 11D, when diffusely reflected light that is diffused by the contact surface of the tip of the stylus 225 and the substrate 202 is incident on the light-receiving element 212 that overlaps with the contact surface, the position of the tip of the stylus 225 can be sensed with high accuracy.

Figure 11E:
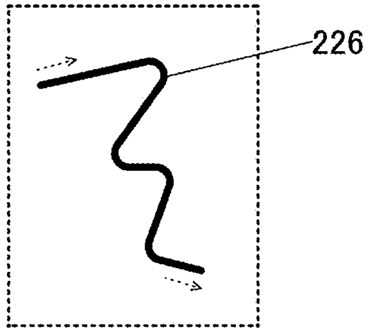

FIG. 11E shows an example of a path 226 of the stylus 225 that is detected in the display panel 200. The display panel 200 can sense the position of an object to be sensed, such as the stylus 225, with high accuracy, so that high-definition drawing can be performed using a drawing application or the like. Unlike the case of using a capacitive touch sensor, an electromagnetic induction touch pen, or the like, the display panel 200 can sense even the position of a highly insulating object to be sensed, the material of a tip portion of the stylus 225 is not limited, and a variety of writing materials (e.g., a brush, a glass pen, a quill pen, and the like) can be used.

Figure 11F:
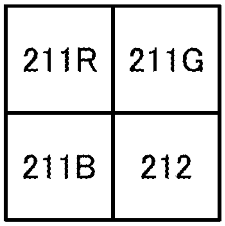
FIGS. 11F to 11H are top views showing examples of pixels.
Figure 11G:
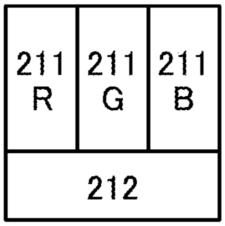
Figure 11H:
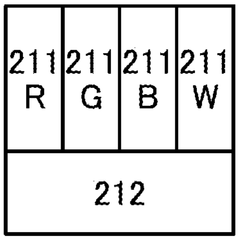

Here, FIGS. 11F to 11H show examples of pixels that can be used for the display panel 200.

Pixels illustrated in FIGS. 11F and 11G include the light-emitting devices 211R, 211G, and 211B for red (R), green (G), and blue (B), respectively, and the light-receiving element 212. The pixels each include a pixel circuit for driving the light-emitting devices 211R, 211G, and 211B and the light-receiving element 212.

FIG. 11F shows an example in which three light-emitting elements and one light-receiving element are provided in a matrix of 2×2. FIG. 11G shows an example in which three light-emitting elements are arranged in one column and one laterally long light-receiving element 212 is provided below the three light-emitting elements.

The pixel shown in FIG. 11H includes a light-emitting device 211W for white (W). Here, four light-emitting elements are arranged in one line and the light-receiving element 212 is provided below the four light-emitting elements.

Note that the pixel structure is not limited to the above structure, and a variety of pixel arrangements can be employed.

Structure Example 1-2

An example of a structure including a light-emitting element emitting visible light, a light-emitting element emitting infrared light, and a light-receiving element is described below.

Figure 12A:
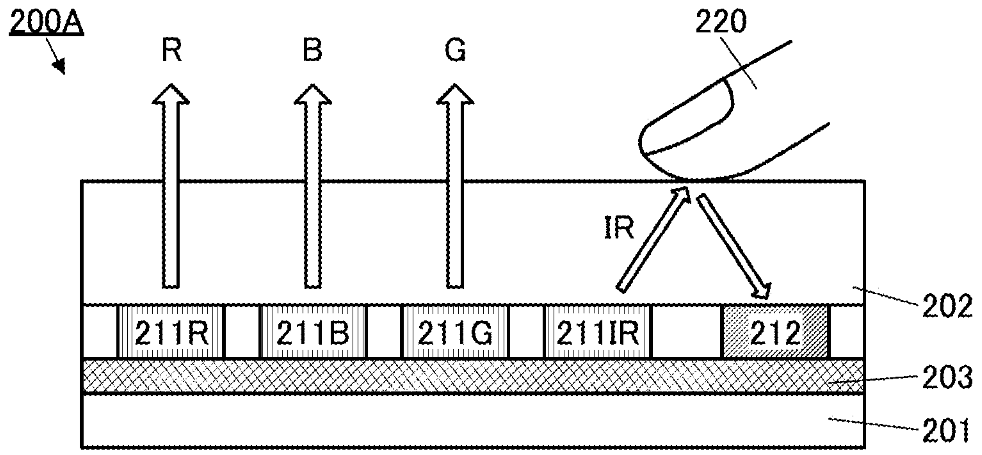
FIG. 12A is a cross-sectional view showing a structure example of a display apparatus.

A display panel 200A illustrated in FIG. 12A includes a light-emitting device 211IR in addition to the components illustrated in FIG. 11A as an example. The light-emitting device 211IR is a light-emitting element emitting infrared light IR. Moreover, in that case, an element capable of receiving at least the infrared light IR emitted from the light-emitting device 2111R is preferably used as the light-receiving element 212. As the light-receiving element 212, an element capable of receiving visible light and infrared light is further preferably used.

As illustrated in FIG. 12A, when the finger 220 touches the substrate 202, the infrared light IR emitted from the light-emitting device 2111R is reflected or scattered by the finger 220 and part of reflected light or scattered light is incident on the light-receiving element 212, so that the positional information of the finger 220 can be obtained.

Figure 12B:
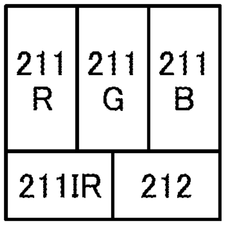
FIGS. 12B to 12D are top views showing examples of pixels.
Figure 12C:
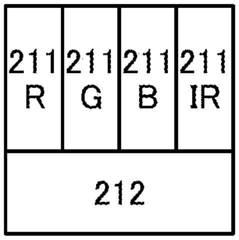
Figure 12D:
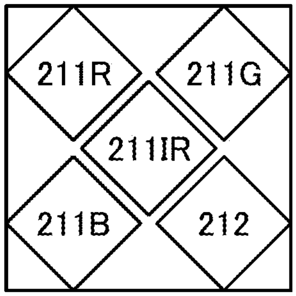

FIGS. 12B to 12D show examples of pixels that can be used for the display panel 200A.

FIG. 12B shows an example in which three light-emitting elements are arranged in one column and the light-emitting device 2111R and the light-receiving element 212 are arranged below the three light-emitting elements in a horizontal direction. In the display apparatus of one embodiment of the present invention, the pixel has a light-receiving function, whereby the contact or approach of an object can be sensed while an image is displayed. Moreover, the display apparatus of one embodiment of the present invention includes a subpixel emitting infrared light; thus, with the use of the subpixels included in the display apparatus, an image can be displayed while infrared light is emitted as a light source. In other words, the display apparatus of one embodiment of the present invention has a structure with high affinity for a function other than a display function (here, a light-receiving function). The light-receiving element 212 may be used for a touch sensor, a non-contact sensor, or the like.

FIG. 12C shows an example in which four light-emitting elements including the light-emitting device 21118 are arranged in one line and the light-receiving element 212 is provided below the four light-emitting elements.

FIG. 12D shows an example in which three light-emitting elements and the light-receiving element 212 arranged in all directions with the light-emitting device 2111R used as a center.

Note that in the pixels shown in FIGS. 12B to 12D, the positions of the light-emitting elements can be interchangeable, or the positions of the light-emitting element and the light-receiving element can be interchangeable.

Structure Example 1-3

An example of a structure including a light-emitting element emitting visible light and a light-emitting/receiving element emitting and receiving visible light is described below.

Figure 13A:
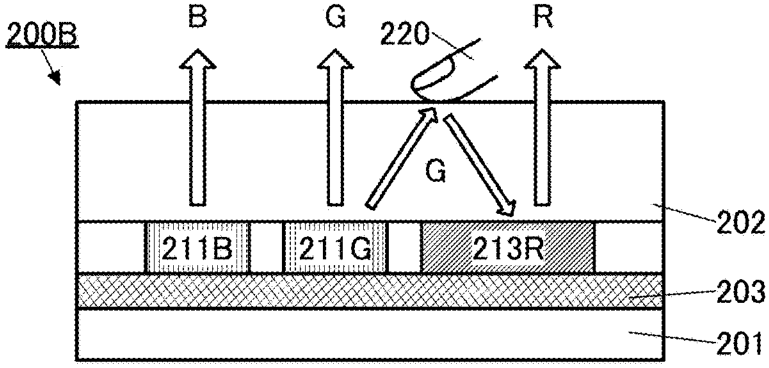
FIG. 13A is a cross-sectional view showing a structure example of a display apparatus.

A display panel 200B illustrated in FIG. 13A includes the light-emitting device 211B, the light-emitting device 211G, and a light-emitting/receiving device 213R. The light-emitting/receiving device 213R has a function of a light-emitting element that emits red (R) light, and a function of a photoelectric conversion element that receives visible light. FIG. 13A illustrates an example in which the light-emitting/receiving device 213R receives green (G) light emitted from the light-emitting device 211G. Note that the light-emitting/receiving device 213R may receive blue (B) light emitted from the light-emitting device 211B. Alternatively, the light-emitting/receiving device 213R may receive both green light and blue light.

For example, the light-emitting/receiving device 213R preferably receives light having a shorter wavelength than light emitted from itself. Alternatively, the light-emitting/receiving device 213R may receive light (e.g., infrared light) having a longer wavelength than light emitted from itself. The light-emitting/receiving device 213R may receive light having approximately the same wavelength as light emitted from itself; however, in that case, the light-emitting/receiving device 213R also receives light emitted from itself, whereby its emission efficiency might be decreased. Therefore, the peak of the emission spectrum and the peak of the absorption spectrum of the light-emitting/receiving device 213R preferably overlap as little as possible.

Here, light emitted from the light-emitting/receiving element is not limited to red light. Light emitted from the light-emitting elements is not limited to a combination of green light and blue light. For example, the light-emitting/receiving element can be an element that emits green light or blue light and receives light having a different wavelength from light emitted from itself.

The light-emitting/receiving device 213R serves as both a light-emitting element and a light-receiving element as described above, whereby the number of elements provided in one pixel can be reduced. Thus, higher definition, a higher aperture ratio, higher resolution, and the like can be easily achieved.

FIGS. 13B to 13I show examples of pixels that can be used for the display panel 200B.

Figure 13B:
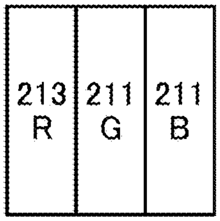
FIGS. 13B to 13I are top views showing examples of pixels.
Figure 13C:
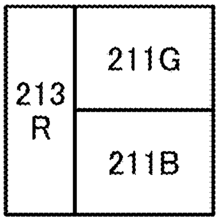

FIG. 13B illustrates an example in which the light-emitting/receiving device 213R, the light-emitting device 211G, and the light-emitting device 211B are arranged in one column. FIG. 13C illustrates an example in which the light-emitting device 211G and the light-emitting device 211B are arranged in the vertical direction and the light-emitting/receiving device 213R is provided alongside the light-emitting devices.

Figure 13D:
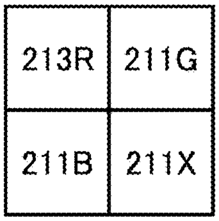

FIG. 13D shows an example in which three light-emitting elements (the light-emitting device 211G, the light-emitting device 211B, and a light-emitting device 211X) and one light-emitting/receiving element are arranged in a matrix of 2×2. The light-emitting device 211X emits light of a color other than R, G, and B. Examples of light of a color other than R, G, and B include white (W) light, yellow (Y) light, cyan (C) light, magenta (M) light, infrared light (IR), and ultraviolet light (UV). In the case where the light-emitting device 211X emits infrared light, the light-emitting/receiving element preferably has a function of sensing infrared light or a function of sensing both visible light and infrared light. The wavelength of light that the light-emitting/receiving element senses can be determined depending on the application of the sensor.

Figure 13E:
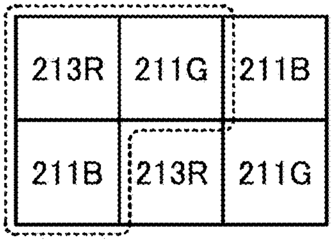

FIG. 13E illustrates two pixels. A region that includes three elements and is enclosed by a dotted line corresponds to one pixel. The pixels each include the light-emitting device 211G, the light-emitting device 211B, and the light-emitting/receiving device 213R. In the pixel on the left in FIG. 13E, the light-emitting/receiving device 213R is positioned in the same row as the light-emitting device 211G, and the light-emitting/receiving device 213R is positioned in the same column as the light-emitting device 211B. In the pixel on the right in FIG. 13E, the light-emitting/receiving device 213R is positioned in the same row as the light-emitting device 211G, and the light-emitting device 211G is positioned in the same column as the light-emitting device 211B. In the pixel layout in FIG. 13E, the light-emitting/receiving device 213R, the light-emitting device 211G, and the light-emitting device 211B are repeatedly arranged in both the odd-numbered row and the even-numbered row, and in each column, the light-emitting elements or the light-emitting element and the light-emitting/receiving element arranged in the odd-numbered row and the even-numbered row emit light of different colors.

Figure 13F:
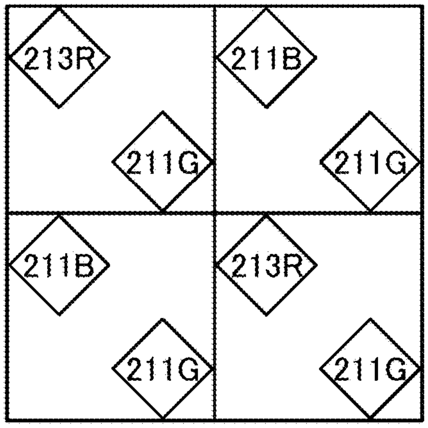

FIG. 13F illustrates four pixels which employ pentile arrangement; adjacent two pixels each have a different combination of two light-emitting elements or light-emitting/receiving elements that emit light of different colors. FIG. 13F illustrates the top-surface shape of the light-emitting elements or light-emitting/receiving elements.

In FIG. 13F, the upper-left pixel and the lower-right pixel each include the light-emitting/receiving device 213R and the light-emitting device 211G. The upper-right pixel and the lower-left pixel each include the light-emitting device 211G and the light-emitting device 211B. That is, in the example shown in FIG. 13F, each pixel is provided with the light-emitting device 211G The top surface shapes of the light-emitting elements and the light-emitting/receiving elements are not particularly limited and can be a circular shape, an elliptical shape, a polygonal shape, a polygonal shape with rounded corners, or the like. FIG. 13F and the like illustrate examples in which the top surface shapes of the light-emitting elements and the light-emitting/receiving elements are each a square tilted at approximately 45° (a diamond shape). Note that the top surface shapes of the light-emitting elements and the light-emitting/receiving elements of different colors may vary, or the elements of at least one color or all colors may have the same top surface shape.

The sizes of the light-emitting regions (or light-emitting/receiving regions) of the light-emitting elements and the light-emitting/receiving elements of different colors may vary, or the regions of at least one color or all colors may be the same in size. For example, in FIG. 13F, the light-emitting region of the light-emitting device 211G provided in each pixel may have a smaller area than the light-emitting region (or the light-emitting/receiving region) of the other elements.

Figure 13H:
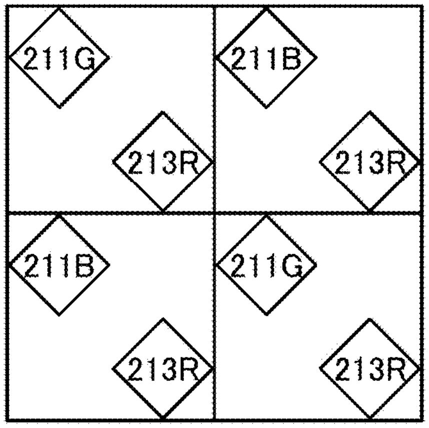
Figure 13G:
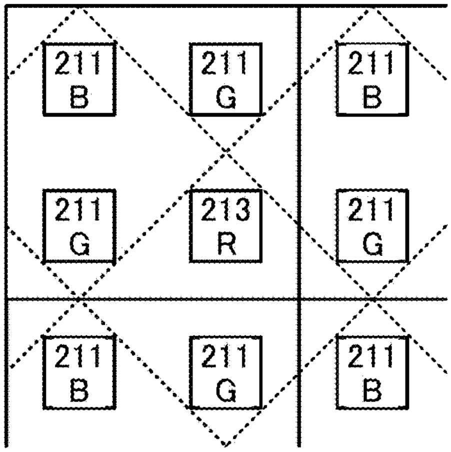

FIG. 13G is a variation of the pixel arrangement of FIG. 13F. Specifically, the structure of FIG. 13G is obtained by rotating the structure of FIG. 13F by 45°. Although one pixel is regarded as being formed of two elements in FIG. 13F, one pixel can be regarded as being formed of four elements as illustrated in FIG. 13G.

FIG. 13H is a variation of the pixel arrangement of FIG. 13F. In FIG. 13H, the upper-left pixel and the lower-right pixel each include the light-emitting/receiving device 213R and the light-emitting device 211G. The upper-right pixel and the lower-left pixel each include the light-emitting/receiving device 213R and the light-emitting device 211B. That is, in the example shown in FIG. 13H, each pixel is provided with the light-emitting/receiving device 213R. The structure illustrated in FIG. 13H achieves higher-resolution image capturing than the structure illustrated in FIG. 13F because of having the light-emitting/receiving device 213R in each pixel. Thus, the accuracy of biometric authentication can be increased, for example.

Figure 13I:
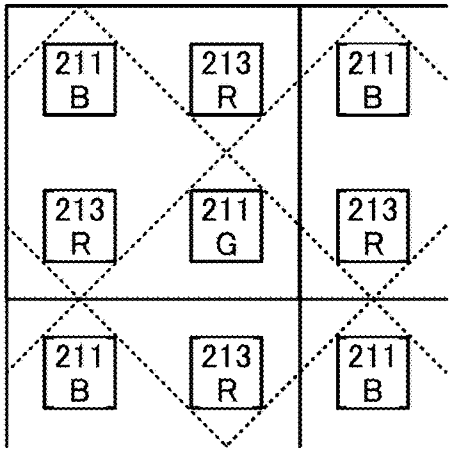

FIG. 13I shows a variation example of the pixel arrangement in FIG. 13H, obtained by rotating the pixel arrangement in FIG. 13H by 45°.

In FIG. 13I, one pixel is described as being composed of four elements (two light-emitting elements and two light-emitting/receiving elements). The pixel including a plurality of light-emitting/receiving elements having a light-receiving function allows high-resolution image capturing. Thus, the accuracy of biometric authentication can be increased. For example, the resolution of image capturing can be the square root of 2 times the resolution of display.

A display apparatus which employs the structure illustrated in FIG. 13H or FIG. 13I includes p (p is an integer greater than or equal to 2) first light-emitting elements, q (q is an integer greater than or equal to 2) second light-emitting elements, and r (r is an integer greater than p and q) light-emitting/receiving elements. As for p and r, r=2p is satisfied. As for p, q, and r, r=p+q is satisfied. Either the first light-emitting elements or the second light-emitting elements emit green light, and the other light-emitting elements emit blue light. The light-emitting/receiving elements emit red light and have a light-receiving function.

When a touch operation is detected using the light-emitting/receiving elements, for example, it is preferable that light emitted from a light source be less likely to be perceived by the user. Since blue light has lower visibility than green light, light-emitting elements that emit blue light are preferably used as a light source. Accordingly, the light-emitting/receiving elements preferably have a function of receiving blue light. Note that without limitation to the above, light-emitting elements used as a light source can be selected as appropriate depending on the sensitivity of the light-emitting/receiving elements.

As described above, the display apparatus of this embodiment can employ any of various types of pixel arrangements.

At least part of this embodiment can be implemented in combination with any of the other embodiments described in this specification, as appropriate.

Embodiment 7

In this embodiment, a light-emitting element (also referred to as light-emitting device) and a light-receiving element (also referred to as a light-receiving device) that can be used in a light-emitting/receiving apparatus of one embodiment of the present invention will be described.

Structures of light-emitting devices can be classified roughly into a single structure and a tandem structure. A light-emitting device with a single structure includes one light-emitting unit between a pair of electrodes, and the light-emitting unit preferably includes one or more light-emitting layers. To obtain white light emission with a single structure, two or more light-emitting layers are selected such that emission colors of the light-emitting layers are complementary colors. For example, when emission colors of a first light-emitting layer and a second light-emitting layer are complementary colors, a light-emitting device can be configured to emit white light as a whole. This can be applied to a light-emitting device including three or more light-emitting layers.

A light-emitting device having a tandem structure includes two or more light-emitting units between a pair of electrode, and each light-emitting unit preferably includes one or more light-emitting layers. When light-emitting layers that emit light of the same color are used in each light-emitting unit, luminance per predetermined current can be increased, and the light-emitting device can have higher reliability than that with a single structure. To obtain white light emission with a tandem structure, the light-emitting device is configured to obtain white light emission by combining light from light-emitting layers of a plurality of light-emitting units. Note that a combination of emission colors for obtaining white light emission is similar to that for a single structure. In a light-emitting device having a tandem structure, an intermediate layer such as a charge-generation layer is preferably provided between a plurality of light-emitting units.

When the white light-emitting device (having a single structure or a tandem structure) and a light-emitting device having an SBS structure are compared to each other, the latter can have lower power consumption than the former. To reduce power consumption, a light-emitting device having an SBS structure is preferably used. Meanwhile, the white light-emitting device is preferable in terms of lower manufacturing cost or higher manufacturing yield because the manufacturing process of the white light-emitting device is simpler than that of a light-emitting device having an SBS structure.

<Structure Example of Light-Emitting Device>

Figure 14A:
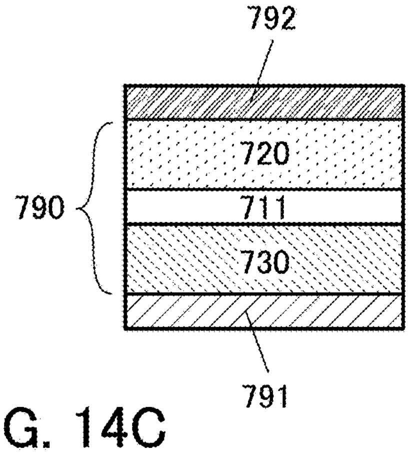
FIGS. 14A to 14F show structure examples of light-emitting devices.

As illustrated in FIG. 14A, the light-emitting device includes an EL layer 790 between a pair of electrodes (a lower electrode 791 and an upper electrode 792). The EL layer 790 can be formed of a plurality of layers such as a layer 720, a light-emitting layer 711, and a layer 730. The layer 720 can include, for example, a layer containing a substance with a high electron-injection property (an electron-injection layer) and a layer containing a substance with a high electron-transport property (an electron-transport layer). The light-emitting layer 711 contains a light-emitting compound, for example. The layer 730 can include, for example, a layer containing a substance with a high hole-injection property (a hole-injection layer) and a layer containing a substance with a high hole-transport property (a hole-transport layer).

The structure including the layer 720, the light-emitting layer 711, and the layer 730, which is provided between a pair of electrodes, can function as a single light-emitting unit, and the structure in FIG. 14A is referred to as a single structure in this specification.

Figure 14B:
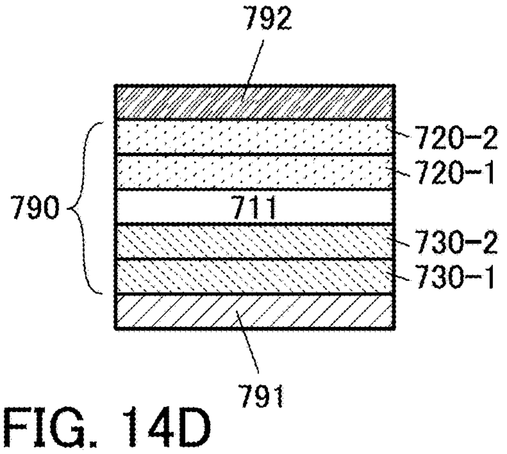

FIG. 14B is a modification example of the EL layer 790 included in the light-emitting device illustrated in FIG. 14A. Specifically, the light-emitting device illustrated in FIG. 14B includes a layer 730-1 over the lower electrode 791, a layer 730-2 over the layer 730-1, the light-emitting layer 711 over the layer 730-2, a layer 720-1 over the light-emitting layer 711, a layer 720-2 over the layer 720-1, and the upper electrode 792 over the layer 720-2. For example, when the lower electrode 791 functions as an anode and the upper electrode 792 functions as a cathode, the layer 730-1 functions as a hole-injection layer, the layer 730-2 functions as a hole-transport layer, the layer 720-1 functions as an electron-transport layer, and the layer 720-2 functions as an electron-injection layer. Alternatively, when the lower electrode 791 functions as a cathode and the upper electrode 792 functions as an anode, the layer 730-1 functions as an electron-injection layer, the layer 730-2 functions as an electron-transport layer, the layer 720-1 functions as a hole-transport layer, and the layer 720-2 functions as the hole-injection layer. With such a layered structure, carriers can be efficiently injected to the light-emitting layer 711, and the efficiency of the recombination of carriers in the light-emitting layer 711 can be enhanced.

Figure 14C:
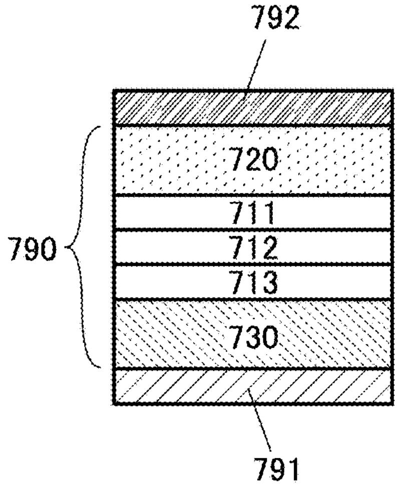
Figure 14D:
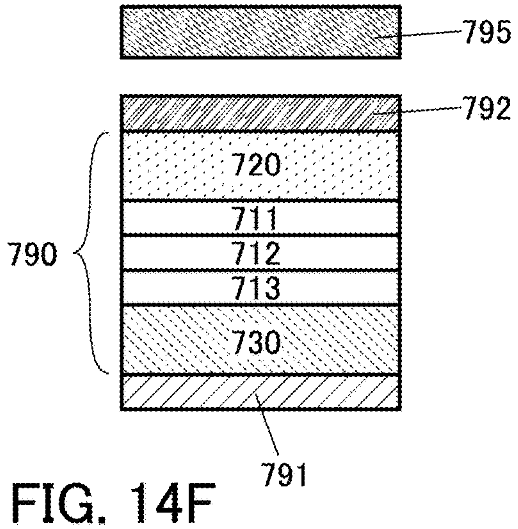

Note that structures in which a plurality of light-emitting layers (light-emitting layers 711, 712, and 713) are provided between the layer 720 and the layer 730 as illustrated in FIG. 14C and FIG. 14D are other variations of the single structure.

Figure 14E:
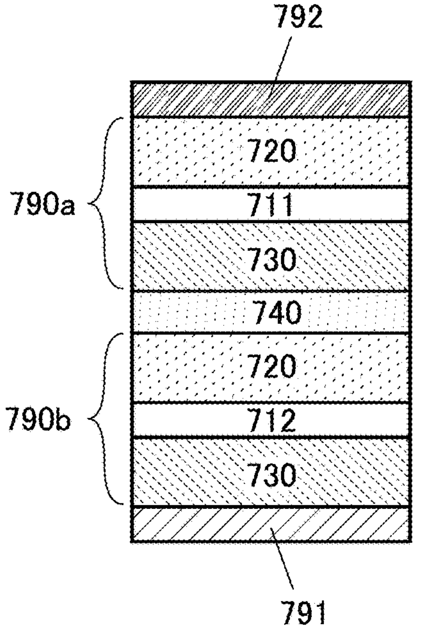
Figure 14F:
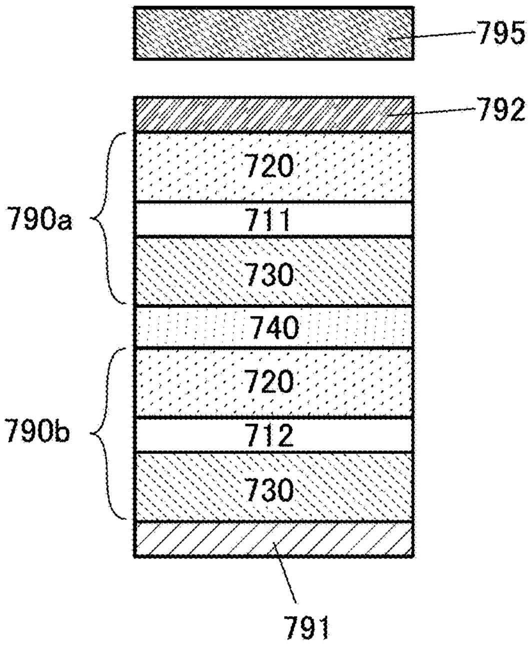

Structures in which a plurality of light-emitting units (EL layers 790*a* and 790*b*) are connected in series with an intermediate layer (charge-generation layer) 740 therebetween as illustrated in FIG. 14E and FIG. 14F are referred to as a tandem structure in this specification. The structures illustrated in FIG. 14E and FIG. 14F are each referred to as a tandem structure in this specification and the like; however, the name of the structure is not limited thereto. A tandem structure may be referred to as a stack structure, for example. The tandem structure enables a light-emitting device capable of high luminance light emission.

In FIG. 14C, the same light-emitting material may be used for the light-emitting layer 711, the light-emitting layer 712, and the light-emitting layer 713.

Alternatively, different light-emitting materials may be used for the light-emitting layer 711, the light-emitting layer 712, and the light-emitting layer 713. White light can be obtained when the light-emitting layer 711, the light-emitting layer 712, and the light-emitting layer 713 emit light of complementary colors. FIG. 14D shows an example in which a coloring layer 795 functioning as a color filter is provided. When white light passes through a color filter, light of a desired color can be obtained.

In FIG. 14E, the same light-emitting material may be used for the light-emitting layer 711 and the light-emitting layer 712. Alternatively, different light-emitting materials may be used for the light-emitting layer 711 and the light-emitting layer 712. White light can be obtained when the light-emitting layer 711 and the light-emitting layer 712 emit light of complementary colors. FIG. 14F shows an example in which the coloring layer 795 is further provided.

In FIGS. 14C to 14F, the layer 720 and the layer 730 may each have a layered structure of two or more layers as in FIG. 14B.

In FIG. 14D, the same light-emitting material may be used for the light-emitting layer 711, the light-emitting layer 712, and the light-emitting layer 713. Similarly, in FIG. 14F, the same light-emitting material may be used for the light-emitting layer 711 and the light-emitting layer 712. Here, when a color conversion layer is used instead of the coloring layer 795, light of a desired color different from the emission color of the light-emitting material can be obtained. For example, a blue light-emitting material is used for each light-emitting layer and blue light passes through the color conversion layer, whereby light with a wavelength longer than that of blue light (e.g., red light or green light) can be obtained. For the color conversion layer, a fluorescent material, a phosphorescent material, quantum dots, or the like can be used.

A structure in which light-emitting devices that emit light of different colors (here, blue (B), green (G), and red (R)) are separately formed is referred to as a side-by-side (SBS) structure in some cases.

The emission color of the light-emitting device can be changed to red, green, blue, cyan, magenta, yellow, white, or the like depending on the material of the EL layer 790. When the light-emitting device has a microcavity structure, the color purity can be further increased.

In the light-emitting device that emits white light, the light-emitting layer preferably contains two or more kinds of light-emitting substances. To obtain white light emission, the two or more kinds of light-emitting substances are selected so as to emit light of complementary colors. For example, the emission colors of first and second light-emitting layers are complementary, so that the light-emitting device can emit white light as a whole. This can be applied to a light-emitting device including three or more light-emitting layers.

The light-emitting layer preferably contains two or more selected from light-emitting substances that emit light of red (R), green (G), blue (B), yellow (Y), orange (O), and the like. Alternatively, a light-emitting layer preferably contains two or more light-emitting substances each of which emits light containing two or more of spectral components of R, G, and B.

[Light-Receiving Device]

Figure 15A:
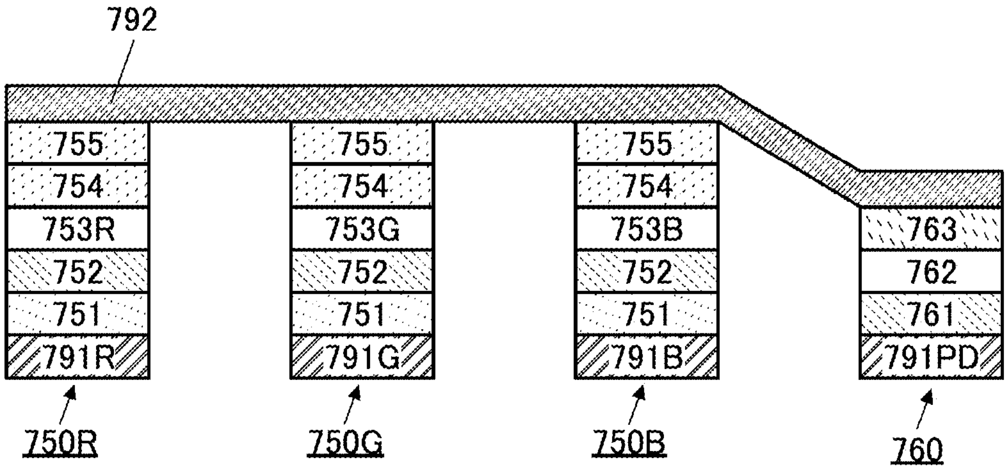
FIGS. 15A and 15B show structure examples of light-emitting devices and a light-receiving device.

FIG. 15A is a schematic cross-sectional view of a light-emitting device 750R, a light-emitting device 750G, a light-emitting device 750B, and a light-receiving device 760. The light-emitting device 750R, the light-emitting device 750G, the light-emitting device 750B, and the light-receiving device 760 share an upper electrode 792.

The light-emitting device 750R includes a pixel electrode 791R, a layer 751, a layer 752, a light-emitting layer 753R, a layer 754, a layer 755, and the upper electrode 792. The light-emitting device 750G includes the pixel electrode 791G and a light-emitting layer 753G. The light-emitting device 750B includes the pixel electrode 791B and a light-emitting layer 753B.

The layer 751 includes, for example, a layer containing a substance with a high hole-injection property (a hole-injection layer). The layer 752 includes, for example, a layer containing a substance with a high hole-transport property (a hole-transport layer). The layer 754 includes, for example, a layer containing a substance with a high electron-transport property (an electron-transport layer). The layer 755 includes, for example, a layer containing a substance with a high electron-injection property (an electron-injection layer).

Alternatively, the layer 751 may include an electron-injection layer, the layer 752 may include an electron-transport layer, the layer 754 may include a hole-transport layer, and the layer 755 may include a hole-injection layer.

FIG. 15A illustrates the layer 751 and the layer 752 separately; however, one embodiment of the present invention is not limited thereto. For example, the layer 752 may be omitted when the layer 751 has functions of both a hole-injection layer and a hole-transport layer or the layer 751 has functions of both an electron-injection layer and an electron-transport layer.

Note that the light-emitting layer 753R included in the light-emitting device 750R includes a light-emitting substance which emits red light, the light-emitting layer 753G included in the light-emitting device 750G includes a light-emitting substance which emits green light, and the light-emitting layer 753B included in the light-emitting device 750B includes a light-emitting substance which emits blue light. Note that the light-emitting device 750G and the light-emitting device 750B have a structure in which the light-emitting layer 753R included in the light-emitting device 750R is replaced with the light-emitting layer 753G and the light-emitting layer 753B, respectively, and the other components are similar to those of the light-emitting device 750R.

The structure (material, thickness, or the like) of the layer 751, the layer 752, the layer 754, and the layer 755 may be the same or different from each other among the light-emitting devices of different colors.

The light-receiving device 760 includes the pixel electrode 791PD, a layer 761, a layer 762, a layer 763, and the upper electrode 792. The light-receiving device 760 can be configured not to include a hole-injection layer and an electron-injection layer.

The layer 762 includes an active layer (also referred to as a photoelectric conversion layer). The layer 762 has a function of absorbing light in a specific wavelength range and generating carriers (electrons and holes).

The layer 761 and the layer 763 each include, for example, a hole-transport layer or an electron-transport layer. In the case where the layer 761 includes a hole-transport layer, the layer 763 includes an electron-transport layer. In the case where the layer 761 includes an electron-transport layer, the layer 763 includes a hole-transport layer.

In the light-receiving element 760, the pixel electrode 791PD may be an anode and the upper electrode 792 may be a cathode, or the pixel electrode 791PD may be a cathode and the upper electrode 792 may be an anode.

Figure 15B:
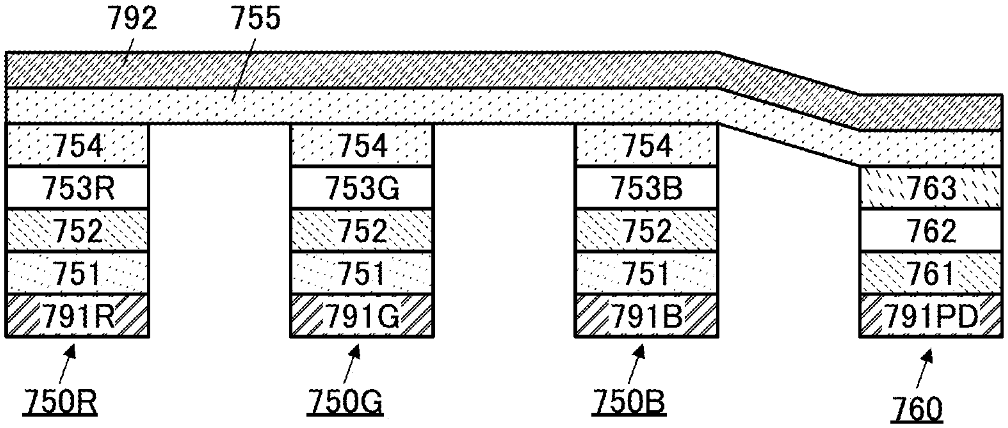

FIG. 15B is a variation of FIG. 15A. FIG. 15B shows an example in which the light-emitting elements and the light-receiving element share not only the upper electrode 792 but also the layer 755. In this case, the layer 755 can be referred to as a common layer. By providing one or more common layers for the light-emitting elements and the light-receiving element in this manner, the manufacturing process can be simplified, resulting in a reduction in manufacturing cost.

Here, the layer 755 functions as an electron-injection layer or a hole-injection layer of the light-emitting devices 750R, 750G, and 750B. At this time, the layer 755 functions as an electron-transport layer or a hole-transport layer of the light-receiving element 760. Thus, the light-receiving device 760 illustrated in FIG. 15B is not necessarily provided with the layer 763 functioning as an electron-transport layer or a hole-transport layer.

[Light-Emitting Device]

Here, a specific structure example of a light-emitting device will be described.

The light-emitting device includes at least a light-emitting layer. In addition to the light-emitting layer, the light-emitting device may further include a layer containing any of a substance with a high hole-injection property, a substance with a high hole-transport property, a hole-blocking material, a substance with a high electron-transport property, an electron-blocking material, a substance with a high electron-injection property, a substance with a bipolar property (a substance with a high electron- and hole-transport property), and the like.

Either a low molecular compound or a high molecular compound can be used in the light-emitting device, and an inorganic compound may also be included. Each layer included in the light-emitting device can be formed by any of the following methods: an evaporation method (including a vacuum evaporation method), a transfer method, a printing method, an inkjet method, a coating method, and the like.

For example, the light-emitting device can include one or more of the hole-injection layer, the hole-transport layer, the hole-blocking layer, an electron-blocking layer, an electron-transport layer, and an electron-injection layer.

[Light-Receiving Device]

The active layer included in the light-receiving device includes a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electron conjugation widely spread in fullerene having a spherical shape, its electron-accepting property is high. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-phenyl-$C_{71}$-butyric acid methyl ester (abbreviation: $PC_{70}BM$), [6,6]-phenyl-$C_{61}$-butyric acid methyl ester (abbreviation: $PC_{60}BM$), and 1',1",4',4"-tetrahydro-di[1,4]methanonaphthaleno[1,2:2',3',56,60:2",3"][5,6]fullerene-$C_{60}$ (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing any of a substance with a high hole-transport property, a substance with a high electron-transport property, a substance with a bipolar property (a substance with a high electron- and hole-transport property), and the like. Without limitation to the above, the light-receiving device may further include a substance with a high hole-injection property, a hole-blocking material, a material with a high electron-injection property, an electron-blocking material, and the like.

Either a low molecular compound or a high molecular compound can be used for the light-receiving device, and an inorganic compound may also be included. The layer included in the light-receiving device can be formed by any of the following methods: an evaporation method (including a vacuum evaporation method), a transfer method, a printing method, an inkjet method, a coating method, and the like.

As the hole-transport material or the electron-blocking material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]]polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. The third material may be a low molecular compound or a high molecular compound.

The above is the description of the light-receiving device.

At least part of this embodiment can be implemented in combination with any of the other embodiments described in this specification, as appropriate.

Embodiment 8

In this embodiment, a structure example of a light-emitting apparatus or a display apparatus that can be used for the light-emitting/receiving apparatus of one embodiment of the present invention will be described.

One embodiment of the present invention is a display apparatus including a light-emitting element (also referred to as a light-emitting device) and a light-receiving element (also referred to as a light-receiving device). For example, three kinds of light-emitting elements emitting red (R), green (G), and blue (B) light are included, whereby a full-color display apparatus can be achieved.

In one embodiment of the present invention, patterning of EL layers and an EL layer and an active layer is performed by a photolithography method without a shadow mask such as a metal mask. With the patterning, a high-resolution display apparatus with a high aperture ratio, which had been difficult to achieve, can be fabricated. Moreover, EL layers can be formed separately, which enables extremely clear images; thus, a display apparatus with a high contrast and high display quality can be fabricated.

It is difficult to set the distance between EL layers for different colors or between an EL layer and an active layer to be less than 10 μm with a formation method using a metal mask, for example. In contrast, with use of the above method, the distance can be decreased to be less than or equal to 3 μm, less than or equal to 2 μm, or less than or equal to 1 μm. For example, with use of an exposure tool for LSI, the distance can be decreased to be less than or equal to 500 nm, less than or equal to 200 nm, less than or equal to 100 nm, or less than or equal to 50 nm. Accordingly, the area of a non-light-emitting region exiting between two light-emitting elements or between a light-emitting element and a light-receiving element can be significantly reduced, and the aperture ratio can be close to 100%. For example, the aperture ratio is higher than or equal to 50%, higher than or equal to 60%, higher than or equal to 70%, higher than or equal to 80%, or higher than or equal to 90%; that is, an aperture ratio lower than 100% can be achieved.

Furthermore, patterns of the EL layer and the active layer themselves (also referred to as processing sizes) can be made much smaller than those in the case of using a metal mask. For example, in the case of using a metal mask for forming EL layers separately, a variation in the thickness occurs between the center and the edge of the EL layer. This causes a reduction in an effective area that can be used as a light-emitting region with respect to the area of the EL layer. In contrast, in the above manufacturing method, an EL layer is formed by processing a film deposited to have a uniform thickness, which enables a uniform thickness in the EL layer. Thus, even in a fine pattern, almost the whole area can be used as a light-emitting region. Therefore, the above method makes it possible to obtain a high resolution display apparatus with a high aperture ratio.

In many cases, an organic film formed using a fine metal mask (FMM) has an extremely small taper angle (e.g., a taper angle of greater than 0° and less than 30°) so that the thickness of the film becomes smaller in a portion closer to an end portion. Therefore, it is difficult to clearly observe a side surface of an organic film formed using an FMM because the side surface and a top surface are continuously connected. In contrast, an EL layer included in one embodiment of the present invention is processed without using an FMM, and has a clear side surface. In particular, part of the taper angle of the EL layer included in one embodiment of the present invention is preferably greater than or equal to 30° and less than or equal to 120°, further preferably greater than or equal to 60° and less than or equal to 120°.

Note that in this specification and the like, an end portion of an object having a tapered shape indicates that the end portion of the object has a cross-sectional shape in which the angle between a side surface of the object and a surface on which the object is formed (a bottom surface) is greater than 0° and less than 90° in a region of the end portion, and the thickness continuously increases from the end portion. A taper angle refers to an angle between a bottom surface (a surface on which an object is formed) and a side surface at an end portion of the object.

Hereinafter, a more specific example will be described.

Figure 16A:
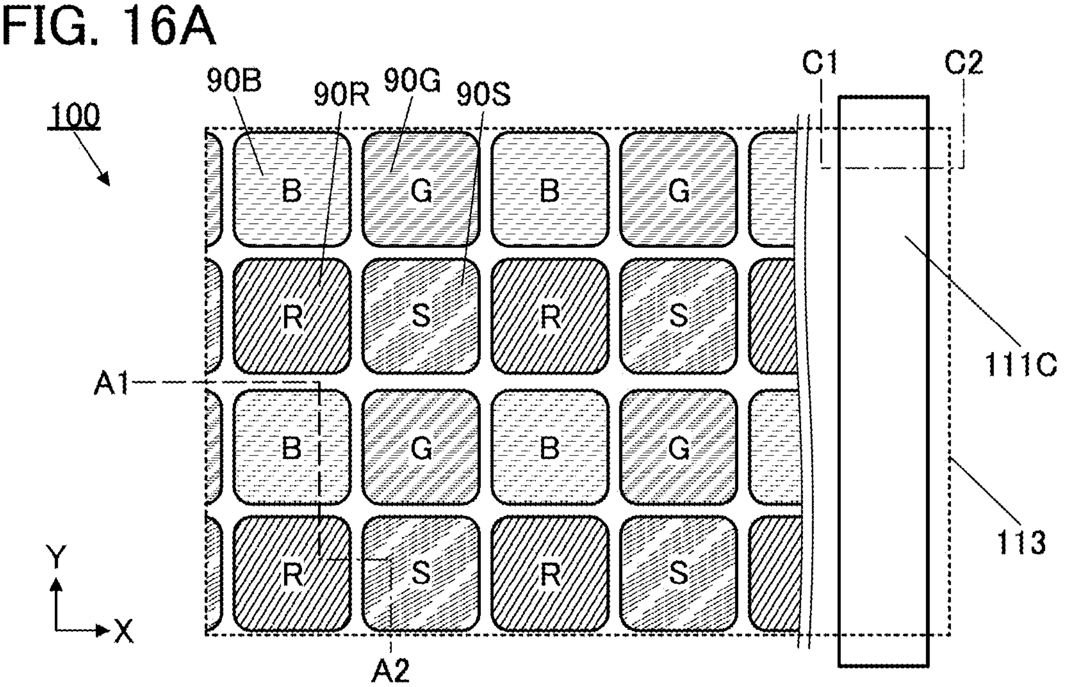
FIGS. 16A and 16B show a structure example of a display apparatus.

FIG. 16A is a schematic top view of the display region 100. The display region 100 includes a plurality of a light-emitting pixels 90R emitting red light, a plurality of light-emitting pixels 90G emitting green light, a plurality of light-emitting pixels 90B emitting blue light, and a plurality of light-receiving pixels 90S. In FIG. 16A, light-emitting regions and light-receiving regions of the light-emitting pixels and the light-receiving pixels are denoted by R, G, B, and S to easily differentiate the light-emitting pixels and the light-receiving pixels.

The light-emitting pixels 90R, the light-emitting pixels 90G, the light-emitting pixels 90B, and the light-receiving pixels 90S are arranged in a matrix. In FIG. 16A, two pixels are alternately arranged in one direction. Note that the arrangement method of the pixels is not limited thereto; another method such as a stripe, S stripe, delta, Bayer, zigzag, PenTile, or diamond arrangement may also be used.

FIG. 16A also illustrates a connection electrode 111C that is electrically connected to a common electrode 113. The connection electrode 111C is supplied with a potential (e.g., an anode potential or a cathode potential) that is to be supplied to the common electrode 113. The connection electrode 111C is provided outside a display region where the light-emitting pixels 90R and the like are arranged. In FIG. 16A, the common electrode 113 is denoted by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface, the top surface of the connection electrode 111C can have a band shape, an L shape, a square bracket shape, a quadrangular shape, or the like.

Figure 16B:
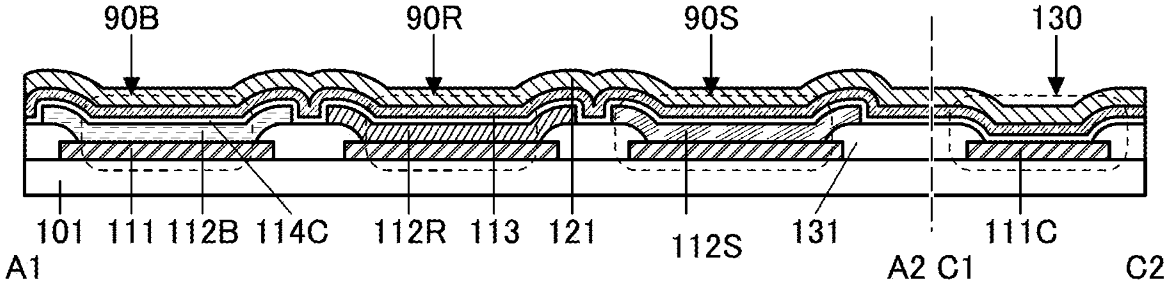

FIG. 16B is a schematic cross-sectional view taken along dashed-dotted lines A1-A2 and C1-C2 in FIG. 16A. FIG. 16B is a schematic cross-sectional view of the light-emitting pixel 90B, the light-emitting pixel 90R, the light-receiving pixel 90S, and the connection electrode 111C.

Note that the light-emitting pixel 90G that is not illustrated in the schematic cross-sectional view can have a structure similar to that of the light-emitting pixel 90B or the light-emitting pixel 90R. Hereinafter, the description of the light-emitting pixel 90B or the light-emitting pixel 90R can be referred to for the description of the light-emitting pixel 90G.

The light-emitting pixel 90B includes a pixel electrode 111, an organic layer 112B, an organic layer 114C, and the common electrode 113. The light-emitting pixel 90R includes the pixel electrode 111, an organic layer 112R, the organic layer 114C, and the common electrode 113. The light-receiving pixel 90S includes the pixel electrode 111, an organic layer 112S, the organic layer 114C, and the common electrode 113. The organic layer 114C and the common electrode 113 are shared by the light-emitting pixel 90B, the light-emitting pixel 90R, and the light-receiving pixel 90S. The organic layer 114C and the common electrode 113 can each also be referred to as a common layer.

The organic layer 112R contains a light-emitting organic compound that emits light with intensity at least in a red wavelength range. The organic layer 112B contains a light-emitting organic compound that emits light with intensity at least in a blue wavelength range. The organic layer 112S contains a photoelectric conversion material that has sensitivity in the visible light or infrared light wavelength range. The organic layer 112R and the organic layer 112B can each be called an EL layer.

The organic layer 112R, the organic layer 112B, and the organic layer 112S may each include one or more of an electron-injection layer, an electron-transport layer, a hole-injection layer, and a hole-transport layer. The organic layer 114C does not necessarily include the light-emitting layer. For example, the organic layer 114C includes one or more of an electron-injection layer, an electron-transport layer, a hole-injection layer, and a hole-transport layer.

Here, the uppermost layer in the stacked-layer structure of the organic layer 112R, the organic layer 112B, and the organic layer 112S, i.e., the layer in contact with the organic layer 114C is preferably a layer other than the light-emitting layer. For example, a structure is preferable in which an electron-injection layer, an electron-transport layer, a hole-injection layer, a hole-transport layer, or a layer other than those covers the light-emitting layer so as to be in contact with the organic layer 114C. When a top surface of the light-emitting layer is protected by another layer in manufacturing each light-emitting element, the reliability of the light-emitting element can be improved.

The pixel electrode 111 is provided for each element. The common electrode 113 and the organic layer 114C are provided as layers common to the light-emitting elements. A conductive film that transmits visible light is used for either the respective pixel electrodes or the common electrode 113, and a reflective conductive film is used for the other. When the respective pixel electrodes are light-transmitting electrodes and the common electrode 113 is a reflective electrode, a bottom-emission display apparatus is obtained. When the respective pixel electrodes are reflective electrodes and the common electrode 113 is a light-transmitting electrode, a top-emission display apparatus is obtained. Note that when both the respective pixel electrodes and the common electrode 113 transmit light, a dual-emission display apparatus can be obtained.

The insulating layer 131 is provided to cover end portions of the pixel electrode 111. The end portions of the insulating layer 131 are preferably tapered. Note that in this specification and the like, an end portion of an object having a tapered shape indicates that the end portion of the object has a cross-sectional shape in which the angle between a surface of the object and a surface on which the object is formed is greater than 0° and less than 90° in a region of the end portion, and the thickness continuously increases from the end portion.

When an organic resin is used for the insulating layer 131, a surface of the insulating layer 131 can be moderately curved. Thus, coverage with a film formed over the insulating layer 131 can be improved.

Examples of materials that can be used for the insulating layer 131 include an acrylic resin, a polyimide resin, an epoxy resin, a polyamide resin, a polyimide-amide resin, a siloxane resin, a benzocyclobutene-based resin, a phenol resin, and precursors of these resins.

Alternatively, the insulating layer 131 may be formed using an inorganic insulating material. Examples of inorganic insulating materials that can be used for the insulating layer 131 include oxides and nitrides such as silicon oxide, silicon oxynitride, silicon nitride oxide, silicon nitride, aluminum oxide, aluminum oxynitride, and hafnium oxide. Yttrium oxide, zirconium oxide, gallium oxide, tantalum oxide, magnesium oxide, lanthanum oxide, cerium oxide, neodymium oxide, or the like may be used.

As illustrated in FIG. 16B, there are gaps between the organic layers of two light-emitting elements that emit light of different colors and between the organic layers of the light-emitting element and the light-receiving element. The organic layer 112R, the organic layer 112B, and the organic layer 112S are thus preferably provided so as not to be in contact with each other. This favorably prevents unintentional light emission from being caused by current flowing through adjacent two organic layers. As a result, the contrast can be increased to achieve a display apparatus with high display quality.

The organic layers 112R, 112B, and 112S each preferably have a taper angle of greater than or equal to 30°. In an end portion of each of the organic layer 112R, an organic layer 112G, and the organic layer 112B, the angle between a side surface of the layer and a bottom surface of the layer (a surface on which the layer is formed) is preferably greater than or equal to 30° and less than or equal to 120°, further preferably greater than or equal to 45° and less than or equal to 120°, still further preferably greater than or equal to 60° and less than or equal to 120°. Alternatively, the organic layers 112R, 112G, and 112B each preferably have a taper angle of 90° or a neighborhood thereof (greater than or equal to 80° and less than or equal to 100°, for example).

A protective layer 121 is provided over the common electrode 113. The protective layer 121 has a function of preventing diffusion of impurities such as water into each light-emitting element from the above.

The protective layer 121 can have, for example, a single-layer structure or a stacked-layer structure including at least an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 121.

As the protective layer 121, a stacked film of an inorganic insulating film and an organic insulating film can be used. For example, a structure in which an organic insulating film is sandwiched between a pair of inorganic insulating films is preferable. Furthermore, it is preferable that the organic insulating film function as a planarization film. With this structure, the top surface of the organic insulating film can be flat, and accordingly, coverage with the inorganic insulating film over the organic insulating film is improved, leading to an improvement in barrier properties. Moreover, since the top surface of the protective layer 121 is flat, a preferable effect can be obtained; when a component (e.g., a color filter, an electrode of a touch sensor, or a lens array) is provided above the protective layer 121, the component is less affected by an uneven shape caused by the lower structure.

In the connection portion 130, the common electrode 113 is provided on and in contact with the connection electrode 111C and the protective layer 121 is provided to cover the common electrode 113. In addition, the insulating layer 131 is provided to cover end portions of the connection electrode 111C.

A structure example of a display apparatus that is partly different from that in FIG. 16B is described below. Specifically, an example in which the insulating layer 131 is not provided is described.

Figure 17A:
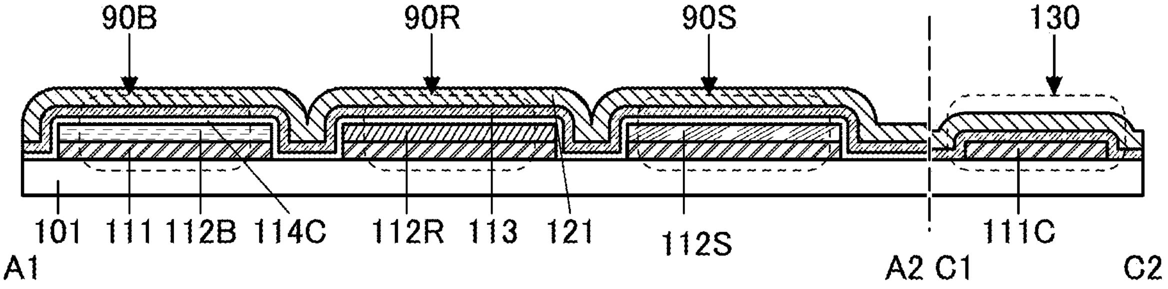
FIGS. 17A to 17D show structure examples of a display apparatus.
Figure 17B:
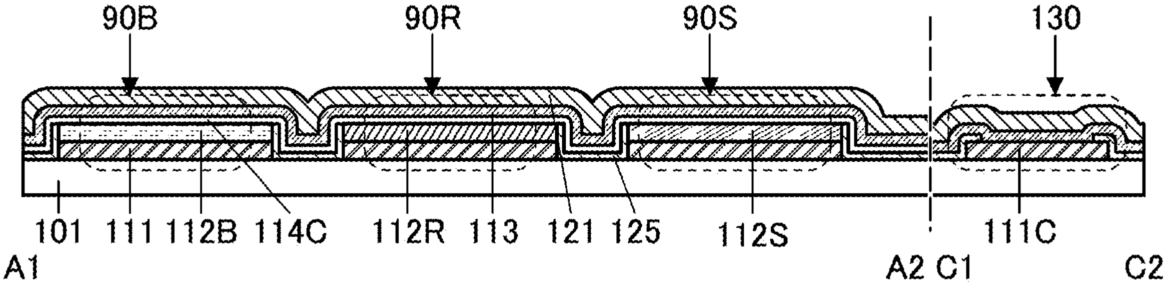
Figure 17C:
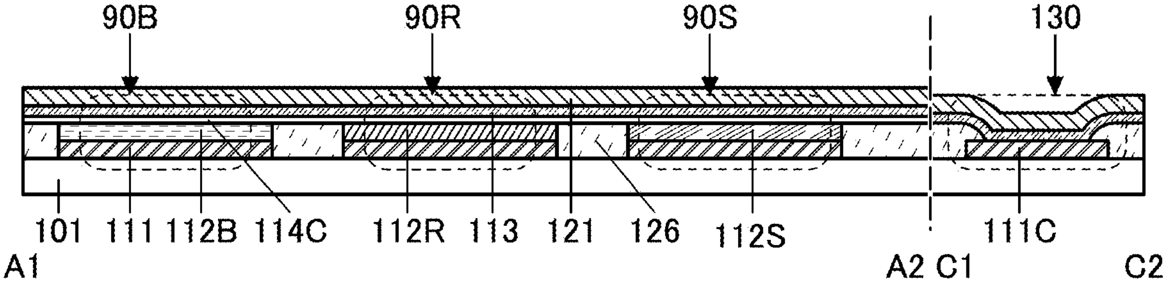

FIGS. 17A to 17C show examples of the case where an end surface including a side surface of the pixel electrode 111 is substantially aligned with an end surface including a side surface of the organic layer 112R, an end surface including a side surface of the organic layer 112B, or an end surface including a side surface of the organic layer 112S.

In FIG. 17A, the organic layer 114C is provided to cover top surfaces and side surfaces of the organic layer 112R, the organic layer 112B, and the organic layer 112S. The organic layer 114C can prevent the pixel electrode 111 and the common electrode 113 from being in contact with each other and being electrically short-circuited.

FIG. 17B shows an example in which an insulating layer 125 is provided to be in contact with the side surfaces of the organic layer 112R, the organic layer 112G, and the organic layer 112B and side surfaces of the pixel electrode 111. The insulating layer 125 can prevent the pixel electrode 111 and the common electrode 113 from being electrically short-circuited and effectively inhibit leakage current therebetween.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when an inorganic insulating film such as an aluminum oxide film, a hafnium oxide film, or a silicon oxide film formed by an ALD method is used as the insulating layer 125, the insulating layer 125 has a small number of pin holes and excels in a function of protecting the organic layer.

Note that in this specification and the like, oxynitride refers to a material that contains more oxygen than nitrogen, and nitride oxide refers to a material that contains more nitrogen than oxygen. For example, a silicon oxynitride refers to a material that contains oxygen at a higher proportion than nitrogen, and a silicon nitride oxide refers to a material that contains nitrogen at a higher proportion than oxygen.

The insulating layer 125 can be formed by a sputtering method, a CVD method, a PLD method, an ALD method, or the like. The insulating layer 125 is preferably formed by an ALD method achieving good coverage.

In FIG. 17C, resin layers 126 are provided between two adjacent light-emitting elements and between the light-emitting element and the light-receiving element so as to fill the space between two facing pixel electrodes and two facing organic layers. The resin layer 126 can planarize the surface on which the organic layer 114C, the common electrode 113, and the like are formed, which prevents disconnection of the common electrode 113 due to poor coverage in a step between adjacent light-emitting elements.

As the resin layer 126, an insulating layer containing an organic material can be favorably used. For example, the resin layer 126 can be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The resin layer 126 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. Moreover, the resin layer 126 can be formed using a photosensitive resin. A photoresist may be used as the photosensitive resin. The photosensitive resin can be of positive or negative type.

A colored material (e.g., a material containing a black pigment) may be used for the resin layer 126 so that the resin layer 126 has a function of blocking stray light from an adjacent pixel and inhibiting color mixture.

Figure 17D:
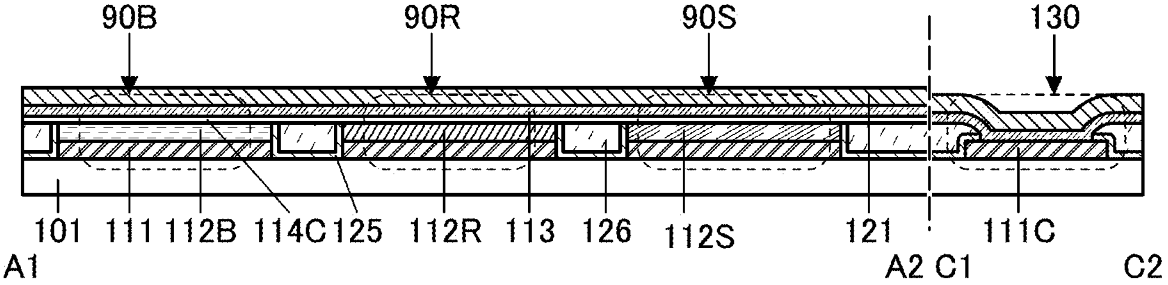

In FIG. 17D, the insulating layer 125 and the resin layer 126 over the insulating layer 125 are provided. Since the insulating layer 125 prevents the organic layer 112R or the like from being in contact with the resin layer 126, impurities such as moisture included in the resin layer 126 can be prevented from being diffused into the organic layer 112R or the like, whereby a highly reliable display apparatus can be provided.

A reflective film (e.g., a metal film containing one or more of silver, palladium, copper, titanium, aluminum, and the like) may be provided between the insulating layer 125 and the resin layer 126 so that light emitted from the light-emitting layer is reflected by the reflective film; hence, the display apparatus may be provided with a function of increasing the light extraction efficiency.

Figure 18A:
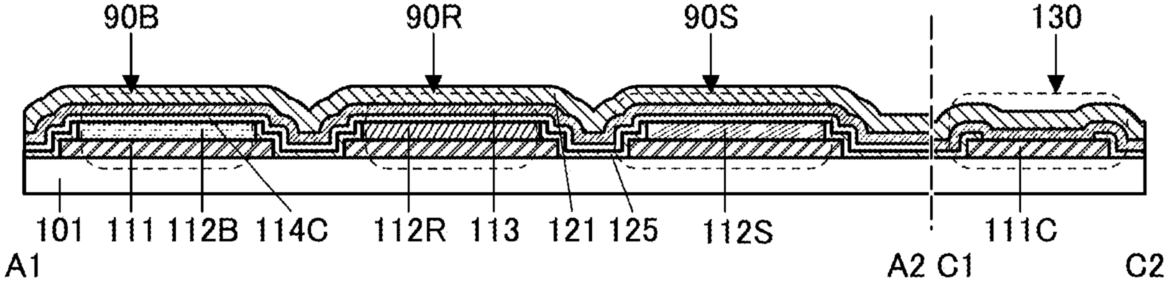
FIGS. 18A to 18C show structure examples of a display apparatus.
Figure 18B:
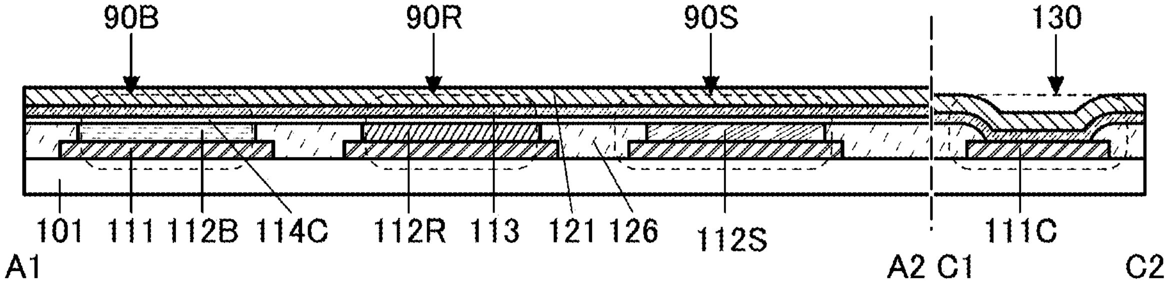
Figure 18C:
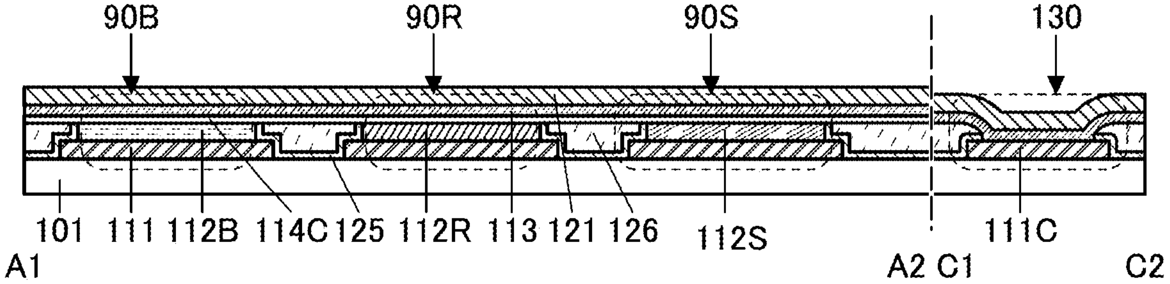

FIGS. 18A to 18C show examples in which the width of the pixel electrode 111 is larger than the width of the organic layer 112R, the organic layer 112B, or the organic layer 112S. The organic layer 112R or the like is provided on the inner side than end portions of the pixel electrode 111.

FIG. 18A shows an example in which the insulating layer 125 is provided. The insulating layer 125 is provided to cover the side surfaces of the organic layers included in the light-emitting element and the light-receiving element and part of a top surface and the side surfaces of the pixel electrode 111.

FIG. 18B shows an example in which the resin layer 126 is provided. The resin layer 126 is positioned between two adjacent light-emitting elements or between the light-emitting element and the light-receiving element, and covers the side surfaces of the organic layers and the top and side surfaces of the pixel electrode 111.

FIG. 18C shows an example in which both the insulating layer 125 and the resin layer 126 are provided. The insulating layer 125 is provided between the organic layer 112R or the like and the resin layer 126.

FIGS. 19A to 19E show examples in which the width of the pixel electrode 111 is smaller than the width of the organic layer 112R, the organic layer 112B, or the organic layer 112S. The organic layer 112R or the like extends to an outer side beyond the end portions of the pixel electrode 111.

Figure 19A:
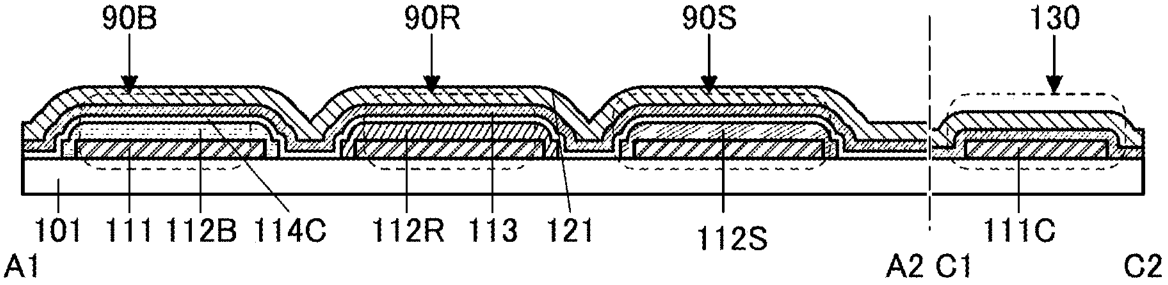
FIGS. 19A to 19D show structure examples of a display apparatus.
Figure 19B:
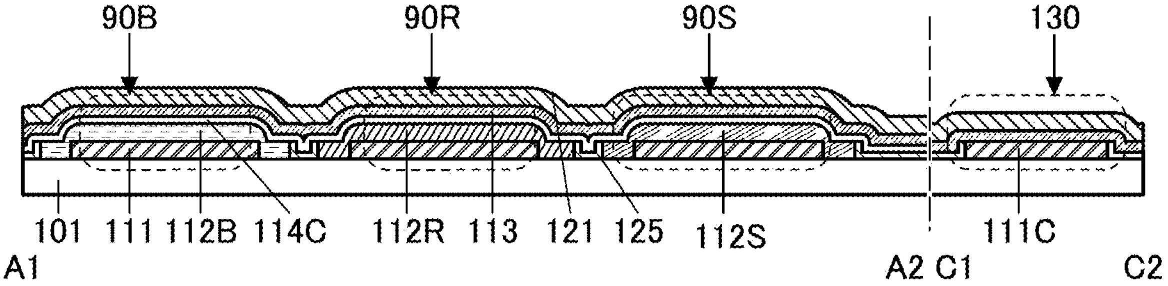

FIG. 19B shows an example in which the insulating layer 125 is provided. The insulating layer 125 is provided in contact with the side surfaces of the organic layers of two adjacent light-emitting elements. The insulating layer 125 may be provided to cover not only the side surface but also part of a top surface of the organic layer 112R or the like.

Figure 19C:
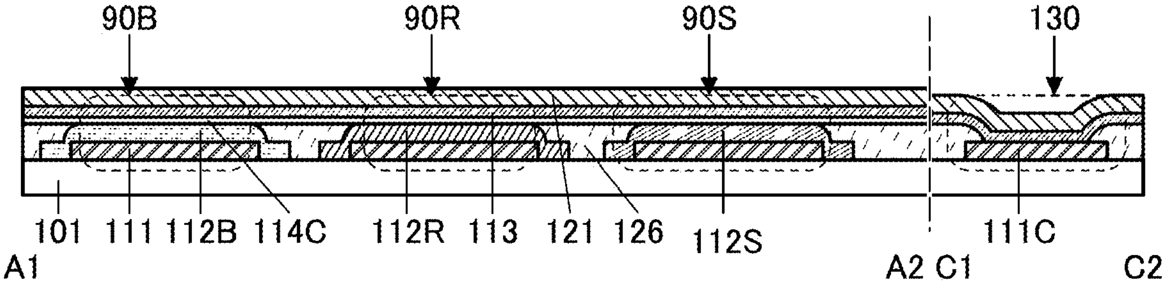

FIG. 19C shows an example in which the resin layer 126 is provided. The resin layer 126 is positioned between two adjacent light-emitting elements and covers the side surface and part of the top surface of the organic layer 112R or the like. The resin layer 126 may be formed to be in contact with the side surface of the organic layer 112R or the like and not to cover the top surface thereof.

Figure 19D:
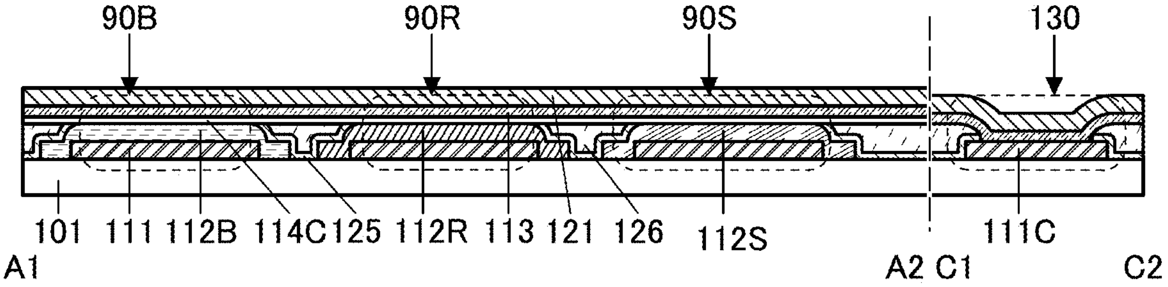

FIG. 19D shows an example in which both the insulating layer 125 and the resin layer 126 are provided. The insulating layer 125 is provided between the organic layer 112R or the like and the resin layer 126.

Here, a structure example of the resin layer 126 is described.

A top surface of the resin layer 126 is preferably as flat as possible; however, the top surface of the resin layer 126 may be concave or convex depending on an uneven shape of a surface on which the resin layer 126 is formed, the formation conditions of the resin layer 126, or the like.

FIGS. 20A to 20F are each an enlarged view of an end portion of the pixel electrode 111R included in the light-emitting pixel 90R, an end portion of the pixel electrode 111G included in the light-emitting pixel 90G, and the vicinity thereof. The organic layer 112G is provided over the pixel electrode 111G.

Figure 20A:
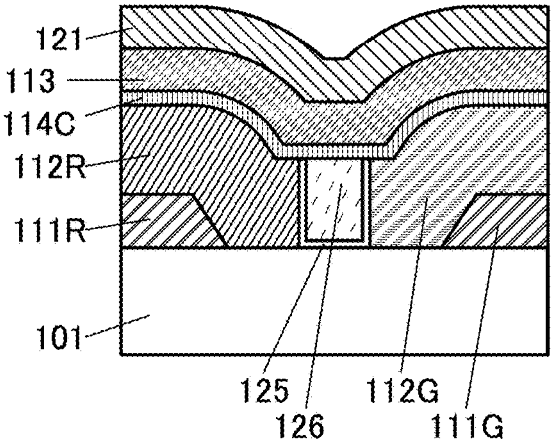
FIGS. 20A to 20F show structure examples of a display apparatus.
Figure 20B:
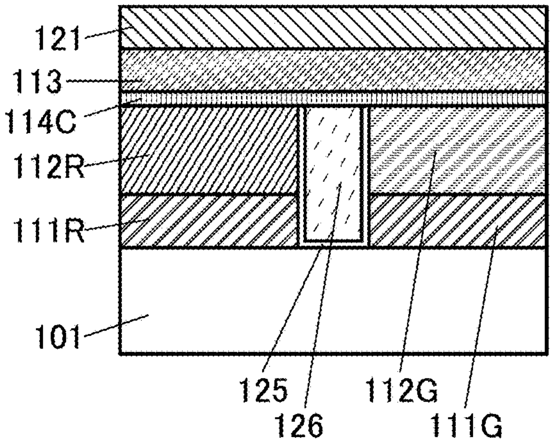
Figure 20C:
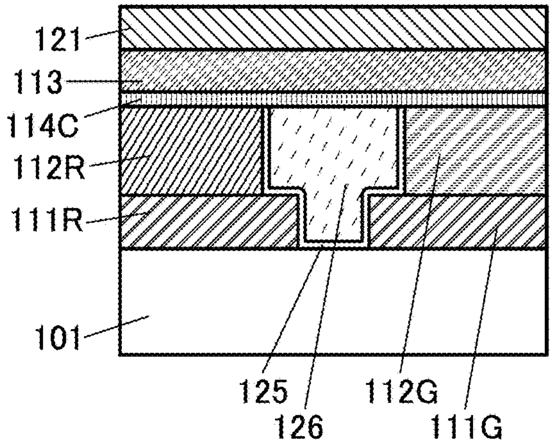

FIGS. 20A to 20C are each an enlarged view of the resin layer 126 having a flat top surface and the vicinity thereof. FIG. 20A shows an example of the case where the organic layer 112R or the like has a larger width than the pixel electrode 111. FIG. 20B shows an example in which the widths of the pixel electrode 111R and the organic layer 112R or the widths of the pixel electrode 111G and the organic layer 112G are substantially the same. FIG. 20C shows an example of the case where the organic layer 112R or the like has a smaller width than the pixel electrode 111.

The organic layer 112R is provided to cover the end portions of the pixel electrode 111 as illustrated in FIG. 20A, so that the end portion of the pixel electrode 111 is preferably tapered. Accordingly, the step coverage with the organic layer 112R is improved and a highly reliable display apparatus can be provided.

Figure 20D:
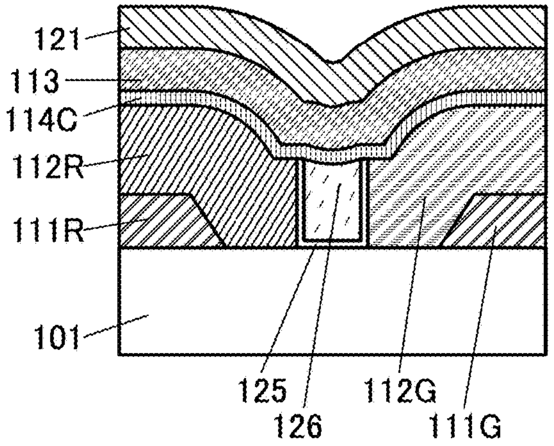
Figure 20E:
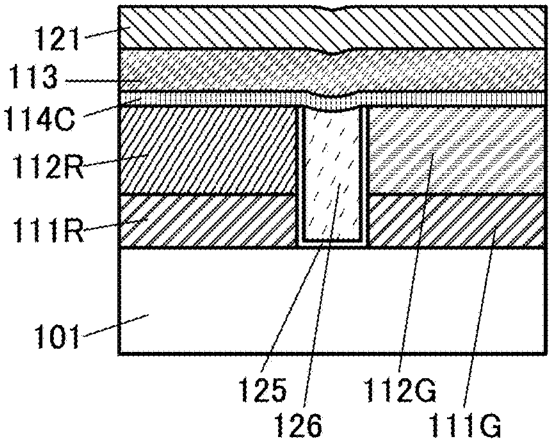
Figure 20F:
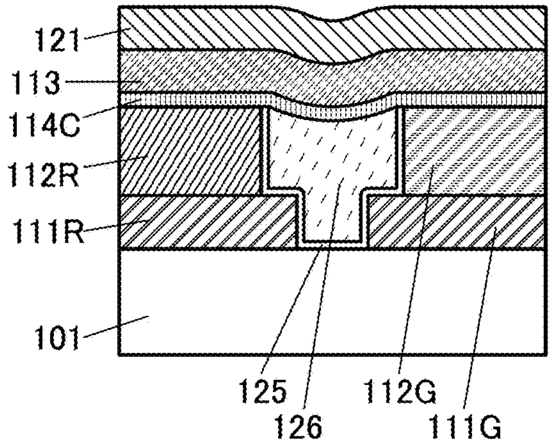

FIGS. 20D to 20F show examples of the case where the top surface of the resin layer 126 is concave. In this case, a concave portion that reflects the concave top surface of the resin layer 126 is formed on each of top surfaces of the organic layer 114C, the common electrode 113, and the protective layer 121.

Figure 21A:
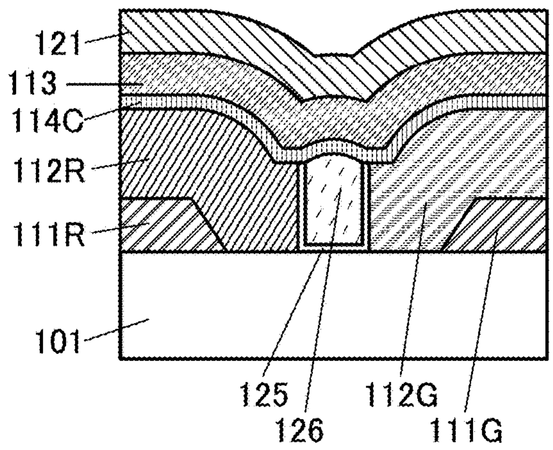
FIGS. 21A to 21F show structure examples of a display apparatus.
Figure 21D:
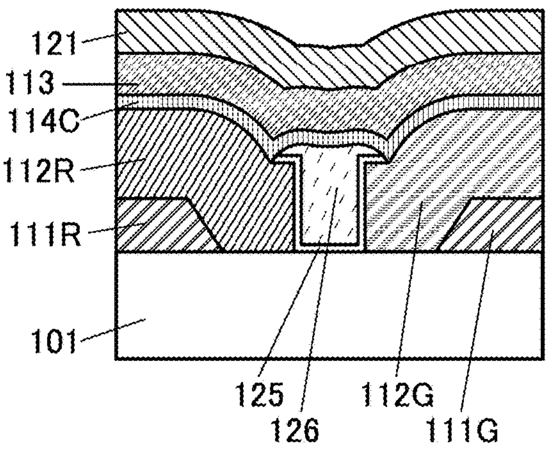
Figure 21B:
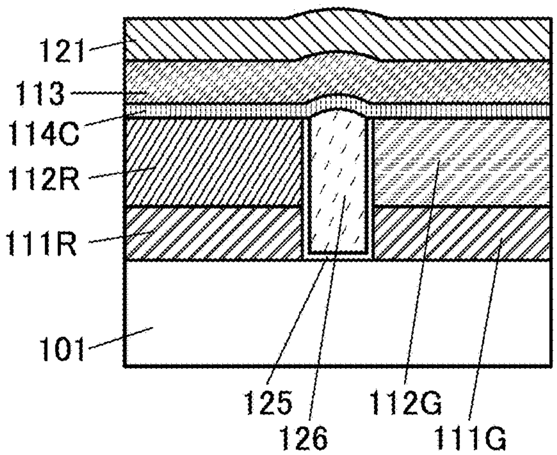
Figure 21E:
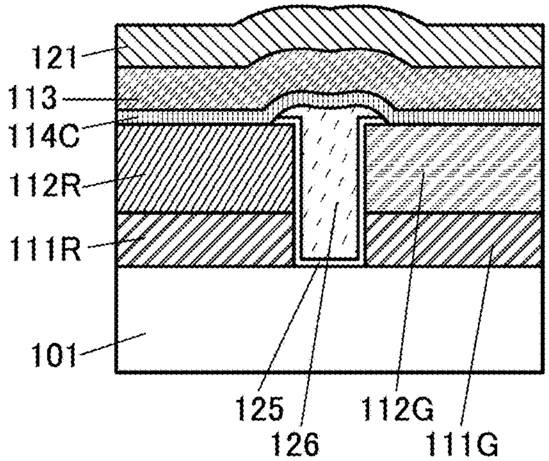
Figure 21C:
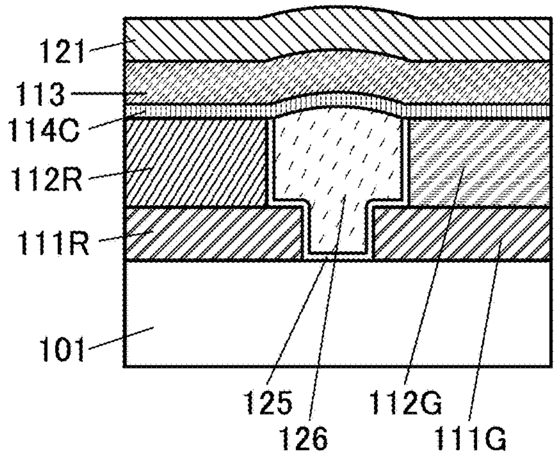

FIGS. 21A to 21C show examples of the case where the top surface of the resin layer 126 is convex. In this case, a convex portion that reflects the convex top surface of the resin layer 126 is formed on each of the top surfaces of the organic layer 114C, the common electrode 113, and the protective layer 121.

Figure 21F:
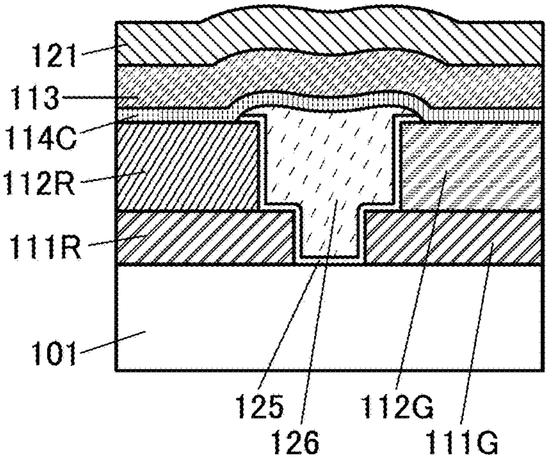

FIGS. 21D to 21F show examples of the case where part of the resin layer 126 covers an upper end portion and part of the top surface of the organic layer 112R and an upper end portion and part of the top surface of the organic layer 112G. Here, the insulating layer 125 is provided between the resin layer 126 and the top surfaces of the organic layers 112R and 112G.

FIGS. 21D to 21F show examples of the case where the top surface of the resin layer 126 is partly concave. In this case, unevenness that reflects the shape of the resin layer 126 is formed on each of the top surfaces of the organic layer 114C, the common electrode 113, and the protective layer 121.

The above is the description of the structure example of the resin layer.

At least part of this embodiment can be implemented in combination with any of the other embodiments described in this specification, as appropriate.

Embodiment 9

In this embodiment, a structure example of a display apparatus which can be used for a light-emitting/receiving apparatus of one embodiment of the present invention will be described. Although a display apparatus capable of displaying an image is described here, when a light-emitting element is used as a light source, a light-emitting/receiving apparatus can be obtained.

The display apparatus in this embodiment can be a high-resolution display apparatus or large-sized display apparatus. Accordingly, the display apparatus of this embodiment can be used for display portions of electronic devices such as a digital camera, a digital video camera, a digital photo frame, a mobile phone, a portable game console, a smart phone, a wristwatch terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Apparatus 400]

Figure 22:
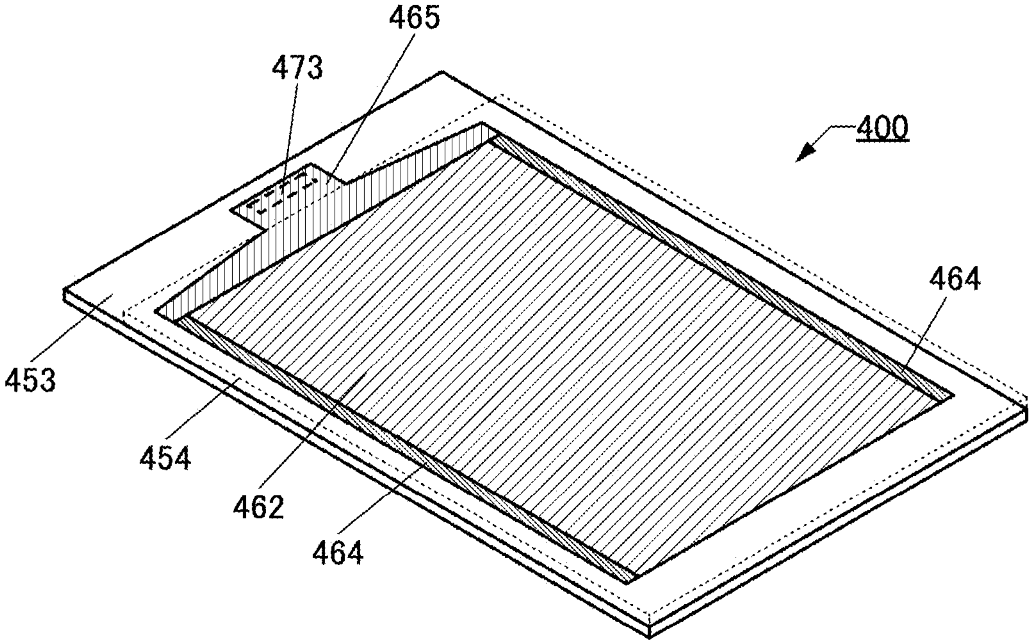
FIG. 22 shows a structure example of a display apparatus.
Figure 23A:
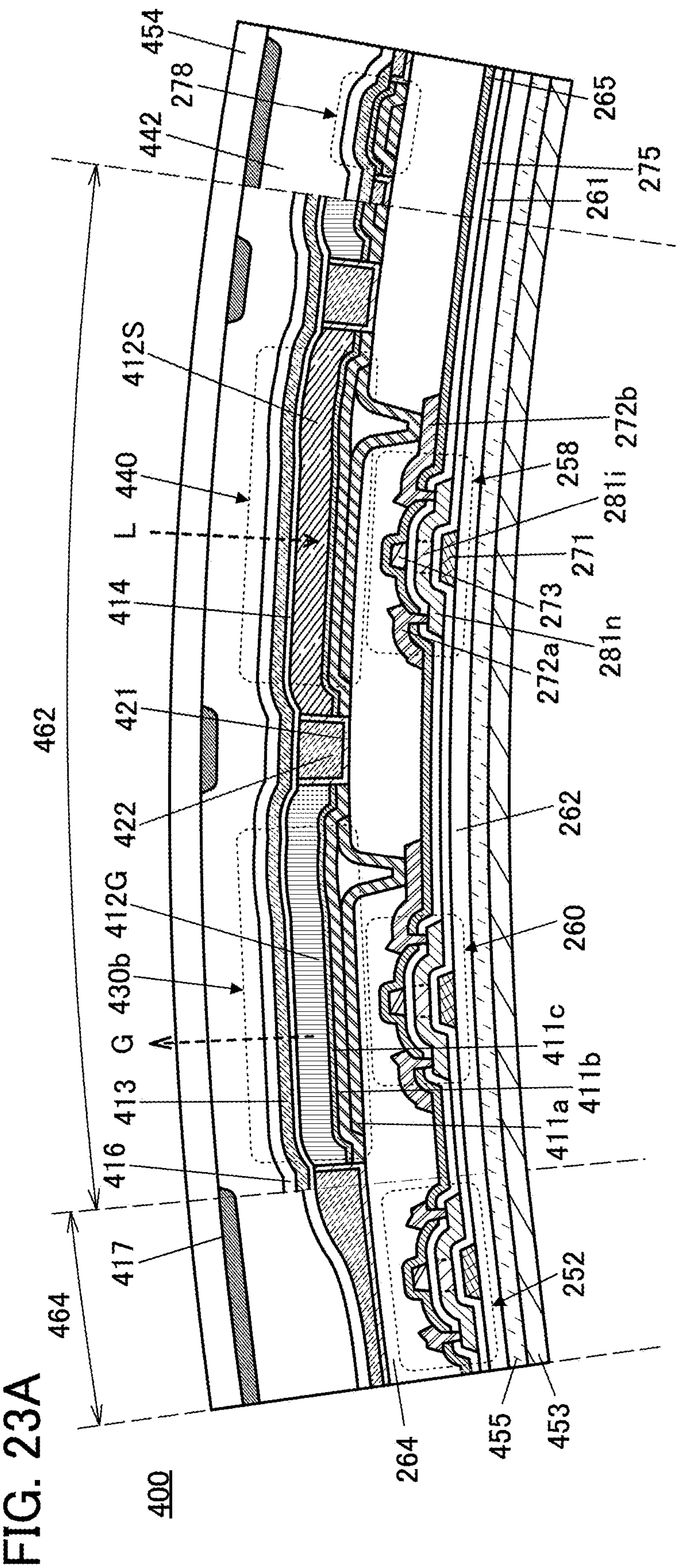
FIG. 23A is a cross-sectional view showing an example of a display apparatus.

FIG. 22 is a perspective view of a display apparatus 400, and FIG. 23A is a cross-sectional view of the display apparatus 400. The display apparatus 400 corresponds to the display panel in Embodiment 1 or 2 before the display panels are joined together.

The display apparatus 400 has a structure in which a substrate 454 and a substrate 453 are bonded to each other. In FIG. 22, the substrate 454 is denoted by a dashed line. In the case of employing arrangement by the tiling method described in Embodiment 2, end portions or peripheral portions of the substrate 453 and the substrate 454 are preferably removed by processing using laser light to form a panel with no bezel.

The display apparatus 400 includes a display portion 462, circuits 464, a wiring 465, and the like. FIG. 22 shows an example in which the display apparatus 400 is provided with an electrode 473. The electrode 473 can also be referred to as a through electrode that is connected through an opening formed in the substrate 453 to a wiring layer over a support. In addition, an integrated circuit (IC) such as a driver circuit may be connected to the electrode 473.

As the circuit 464, a scan line driver circuit can be used, for example.

In the case where a signal and power are supplied to the display portion 462 and the circuit 464, the signal and power are input to various wirings from the outside through the wiring layer or the electrode formed over the support in Embodiment 1.

FIG. 23A shows an example of cross sections of part of a region including part of the circuit 464, part of the display portion 462, and part of a region including a connection portion of the display apparatus 400. FIG. 23A specifically shows an example of a cross section of a region including a light-emitting pixel 430*b* that emits green (G) light and a light-receiving element 440 that receives reflected (L) light in the display portion 462.

The display apparatus 400 illustrated in FIG. 23A includes a transistor 252, a transistor 260, a transistor 258, the light-emitting pixel 430*b*, the light-receiving element 440, and the like between the substrate 453 and the substrate 454.

The light-emitting element and the light-receiving element that are described above as examples can be applied to the light-emitting pixel 430*b* and the light-receiving element 440, respectively.

Here, in the case where a pixel of the display apparatus includes three kinds of subpixels including light-emitting elements that emit light of different colors, the three subpixels can be of three colors of red (R), green (G), and blue (B) or of three colors of yellow (Y), cyan (C), and magenta (M). In the case where four subpixels are included, the four subpixels can be of four colors of R, G, B, and white (W) or of four colors of R, G, B, and Y. Alternatively, the subpixel may include a light-emitting element emitting infrared light.

As the light-receiving element 440, a photoelectric conversion element having sensitivity to light in a red, green, or blue wavelength range or a photoelectric conversion element having sensitivity to light in an infrared wavelength range can be used.

The substrate 454 and a protective layer 416 are bonded to each other with an adhesive layer 442. The adhesive layer 442 is provided to overlap with the light-emitting pixel 430*b* and the light-receiving element 440; that is, the display apparatus 400 employs a solid sealing structure. The substrate 454 is provided with a light-blocking layer 417.

The light-emitting pixel 430*b* and the light-receiving element 440 each include a conductive layer 411*a*, a conductive layer 411*b*, and a conductive layer 411*c* as pixel electrodes. The conductive layer 411*b* has a property of reflecting visible light and serves as a reflective electrode. The conductive layer 411*c* has a property of transmitting visible light and serves as an optical adjustment layer.

The conductive layer 411*a* included in the light-emitting pixel 430*b* is connected to a conductive layer 272*b* included in the transistor 260 through an opening provided in an insulating layer 264. The transistor 260 has a function of controlling the driving of the light-emitting element. The conductive layer 411*a* included in the light-receiving element 440 is electrically connected to the conductive layer 272*b* included in the transistor 258. The transistor 258 has a function of controlling, for example, the timing of light exposure using the light-receiving element 440.

An EL layer 412G or the photoelectric conversion layer 412S is provided to cover the pixel electrode. An insulating layer 421 is provided in contact with a side surface of the EL layer 412G and a side surface of the photoelectric conversion layer 412S, and a resin layer 422 is provided to fill a concave portion of the insulating layer 421. An organic layer 414, a common electrode 413, and the protective layer 416 are provided to cover the EL layer 412G and the photoelectric conversion layer 412S. When the protective layer 416 covering the light-emitting element is provided, which prevents an impurity such as water from entering the light-emitting element. As a result, the reliability of the light-emitting element can be enhanced.

Light G from the light-emitting pixel 430*b* is emitted toward the substrate 454. The light-receiving element 440 receives light L incident through the substrate 454 and converts the light L into an electric signal. For the substrate 454, a material having a high visible-light-transmitting property is preferably used.

The transistor 252, the transistor 260, and the transistor 258 are formed over the substrate 453. These transistors can be fabricated using the same materials in the same step.

Note that the transistor 252, the transistor 260, and the transistor 258 may be separately formed to have different structures. For example, it is possible to separately form a transistor having a back gate and a transistor having no back gate, or transistors having semiconductors, gate electrodes, gate insulating layers, source electrodes, and drain electrodes that are formed of different materials and/or have different thicknesses.

The substrate 453 and an insulating layer 262 are bonded to each other with an adhesive layer 455.

As a method for manufacturing the display apparatus 400, first, a formation substrate is bonded to the substrate 454 provided with the light-blocking layer 417 are bonded to each other with the adhesive layer 442. Here, the formation substrate is provided with the insulating layer 262, the transistors, the light-emitting elements, the light-receiving element, and the like. Then, the substrate 453 is attached to a surface exposed by separation of the formation substrate, whereby the components formed over the formation substrate are transferred onto the substrate 453. The substrate 453 and the substrate 454 are preferably flexible. Accordingly, the display apparatus 400 can be highly flexible.

The transistors 252, 260, and 258 each include a conductive layer 271 functioning as a gate, an insulating layer 261 functioning as a gate insulating layer, a semiconductor layer 281 including a channel formation region 281*i* and a pair of low-resistance regions 281*n*, a conductive layer 272*a* connected to one of the low-resistance regions 281*n*, the conductive layer 272*b* connected to the other low-resistance region 281*n*, an insulating layer 275 functioning as a gate insulating layer, a conductive layer 273 functioning as a gate, and an insulating layer 265 covering the conductive layer 273. The insulating layer 261 is positioned between the conductive layer 271 and the channel formation region 281*i*. The insulating layer 275 is positioned between the conductive layer 273 and the channel formation region 281*i*.

The conductive layer 272*a* and the conductive layer 272*b* are each connected to the corresponding low-resistance region 281*n* through openings provided in the insulating layer 275 and the insulating layer 265. One of the conductive layers 272*a* and 272*b* serves as a source, and the other serves as a drain.

FIG. 23A shows an example in which the insulating layer 275 covers a top and side surfaces of the semiconductor layer. The conductive layer 272*a* and the conductive layer 272*b* are each connected to the corresponding low-resistance region 281*n* through openings provided in the insulating layer 275 and the insulating layer 265.

Figure 23B:
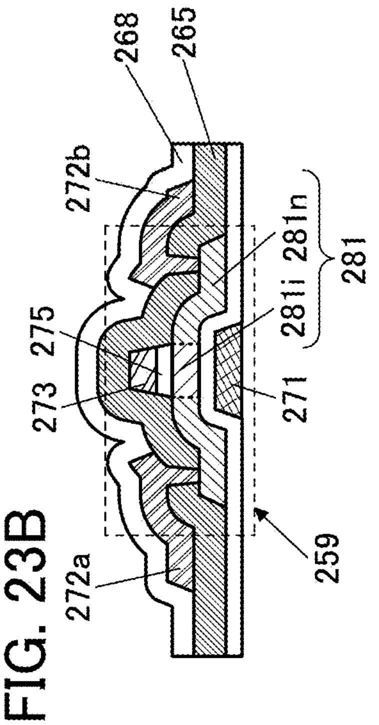
FIG. 23B is a cross-sectional view showing an example of a transistor.

In a transistor 259 illustrated in FIG. 23B, the insulating layer 275 overlaps with the channel formation region 281*i* of the semiconductor layer 281 and does not overlap with the low-resistance regions 281*n*. The structure illustrated in FIG. 23B is obtained by processing the insulating layer 275 with the conductive layer 273 as a mask, for example. In FIG. 23B, the insulating layer 265 is provided to cover the insulating layer 275 and the conductive layer 273, and the conductive layer 272*a* and the conductive layer 272*b* are connected to the low-resistance regions 281*n* through the openings in the insulating layer 265. Furthermore, an insulating layer 268 covering the transistor may be provided.

There is no particular limitation on the structure of the transistors included in the display apparatus of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistors 252, 260, and 258. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used in the semiconductor layer of the transistor, and an amorphous semiconductor, a single crystal semiconductor, or a semiconductor having crystallinity other than single crystal (a microcrystalline semiconductor, a polycrystalline semiconductor, or a semiconductor partly including crystal regions) can be used. It is preferable to use a single crystal semiconductor or a semiconductor having crystallinity, in which case deterioration of the transistor characteristics can be suppressed.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display apparatus of this embodiment.

The band gap of a metal oxide included in the semiconductor layer of the transistor is preferably 2 eV or more, further preferably 2.5 eV or more. The use of such a metal oxide having a wide band gap can reduce the off-state current of the OS transistor.

Alternatively, a semiconductor layer of a transistor may contain silicon. Examples of silicon include amorphous silicon and crystalline silicon (e.g., low-temperature polysilicon or single crystal silicon).

In particular, low-temperature polysilicon has relatively high mobility and can be formed over a glass substrate, and thus can be favorably used for a display apparatus. For example, a transistor including low-temperature polysilicon in a semiconductor layer can be used as the transistor 252 and the like included in the driver circuit, and a transistor including an oxide semiconductor in a semiconductor layer can be used as the transistor 260, the transistor 258, and the like provided for the pixel.

Alternatively, a semiconductor layer of a transistor may include a layered material that functions as a semiconductor. The layered material is a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

The transistor included in the circuit 464 and the transistor included in the display portion 462 may have the same structure or different structures. One structure or two or more kinds of structures may be employed for a plurality of transistors included in the circuit 464. Similarly, one structure or two or more kinds of structures may be employed for a plurality of transistors included in the display portion 462.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display apparatus.

An inorganic insulating film is preferably used as each of the insulating layers 261, 262, 265, 268, and 275. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above inorganic insulating films may also be used.

Here, an organic insulating film often has a lower barrier property than an inorganic insulating film. Therefore, the organic insulating film preferably has an opening in the vicinity of an end portion of the display apparatus 400. This can inhibit entry of impurities from the end portion of the display apparatus 400 through the organic insulating film. Alternatively, the organic insulating film may be formed so that its end portion is positioned on the inner side compared to the end portion of the display apparatus 400, to prevent the organic insulating film from being exposed at the end portion of the display apparatus 400.

An organic insulating film is suitable for the insulating layer 264 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

A light-blocking layer 417 is preferably provided on the surface of the substrate 454 on the substrate 453 side. A variety of optical members can be arranged on the outer surface of the substrate 454. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 454.

FIG. 23A illustrates a connection portion 278. In the connection portion 278, the common electrode 413 is electrically connected to a wiring. FIG. 23A shows an example in which the wiring has the same stacked-layer structure as the pixel electrode.

For each of the substrates 453 and 454, glass, quartz, ceramic, sapphire, a resin, a metal, an alloy, a semiconductor or the like can be used. The substrate on the side from which light from the light-emitting element is extracted is formed using a material which transmits the light. When the substrates 453 and 454 are formed using a flexible material, the flexibility of the display apparatus can be increased. Furthermore, a polarizing plate may be used as the substrate 453 or the substrate 454.

For each of the substrate 453 and the substrate 454, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 453 and the substrate 454.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic resin film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the adhesive layer, an anisotropic conductive film (ACF), an anisotropic conductive paste (ACP), or the like can be used.

As materials for the gates, the source, and the drain of a transistor and conductive layers functioning as wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers.

Examples of insulating materials that can be used for the insulating layers include a resin such as an acrylic resin and an epoxy resin, and an inorganic insulating material such as silicon oxide, silicon oxynitride, silicon nitride oxide, silicon nitride, and aluminum oxide.

At least part of any of the structure examples, the drawings corresponding thereto, and the like described in this embodiment can be implemented in combination with any of the other structure examples, the other drawings, and the like as appropriate.

At least part of this embodiment can be implemented in combination with any of the other embodiments described in this specification, as appropriate.

Embodiment 10

In this embodiment, an example of a display apparatus including the light-receiving device of one embodiment of the present invention or the like will be described.

In the display apparatus of this embodiment, a plurality of kinds of subpixels including light-emitting devices that emit different color light from each other can be included in a pixel. For example, the pixel can include three kinds of subpixels. The three subpixels can be of three colors of red (R), green (G), and blue (B) or of three colors of yellow (Y), cyan (C), and magenta (M), for example. Alternatively, the pixel can include four kinds of subpixels. The four subpixels can be of four colors of R, G, B, and white (W) or of four colors of R, G, B, and Y, for example.

There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting device.

Furthermore, in the case of a display apparatus in which not only a light-emitting device but also a light-receiving device is included in a pixel, the pixel has a light-receiving function and thus can detect a contact or approach of an object while displaying an image. For example, an image can be displayed by using all the subpixels included in a display apparatus; or light can be emitted by some of the subpixels as a light source and an image can be displayed by using the remaining subpixels.

Figure 24A:
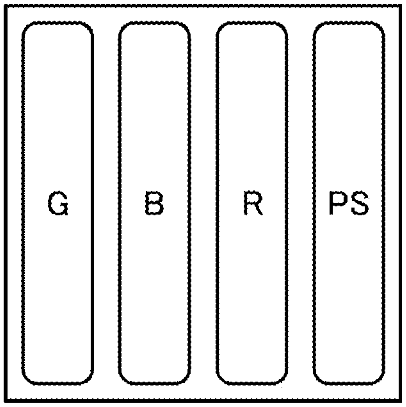
FIGS. 24A to 24D show examples of pixels.
Figure 24B:
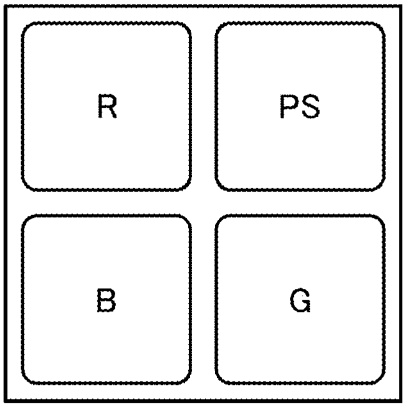
Figure 24C:
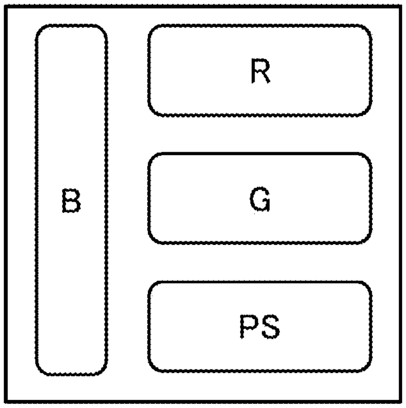

Pixels illustrated in FIGS. 24A to 24C each include a subpixel G, a subpixel B, a subpixel R, and a subpixel PS.

The pixel illustrated in FIG. 24A employs stripe arrangement. The pixel illustrated in FIG. 24B employs matrix arrangement.

The pixel arrangement illustrated in FIG. 24C has a structure in which three subpixels (the subpixels R, G, and PS) are vertically arranged next to one subpixel (the subpixel B).

Figure 24D:
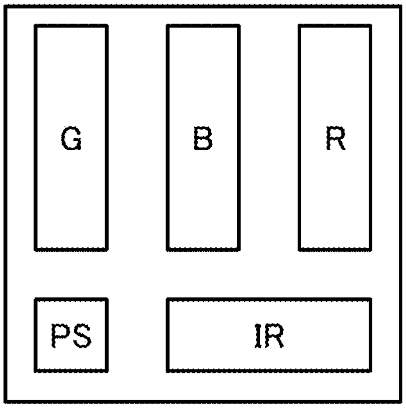

A pixel illustrated in FIG. 24D includes the subpixel G, the subpixel B, the subpixel R, a subpixel IR, and the subpixel PS.

FIG. 24D shows an example in which one pixel is provided in two rows. Three subpixels (the subpixels G, B, and R) are provided in the upper row (first row), and two subpixel (the subpixel PS and the subpixel IR) are provided in the lower row (second row).

Note that the layout of the subpixels is not limited to those in FIGS. 24A to 24D.

The subpixel R includes a light-emitting device that emits red light. The subpixel G includes a light-emitting device that emits green light. The subpixel B includes a light-emitting device that emits blue light. The subpixel IR includes a light-emitting device that emits infrared light. The subpixel PS includes a light-receiving device. The wavelength of light detected by the subpixel PS is not particularly limited; however, the light-receiving device included in the subpixel PS preferably has sensitivity to light emitted by the light-emitting device included in the subpixel R, the subpixel G, the subpixel B, or the subpixel IR. For example, the light-receiving device preferably detects one or more kinds of light in blue, violet, bluish violet, green, yellowish green, yellow, orange, red, and infrared wavelength ranges, for example.

The light-receiving area of the subpixel PS is smaller than the light-emitting areas of the other subpixels. A smaller light-receiving area leads to a narrower image-capturing range, prevents a blur in a captured image, and improves the definition. Thus, by using the subpixel PS, high-resolution or high-definition image capturing is possible. For example, image capturing for personal authentication with the use of a fingerprint, a palm print, the iris, the shape of a blood vessel (including the shape of a vein and the shape of an artery), a face, or the like is possible by using the subpixel PS.

Moreover, the subpixel PS can be used in a touch sensor (also referred to as a direct touch sensor), a near touch sensor (also referred to as a hover sensor, a hover touch sensor, a contactless sensor, or a touchless sensor), or the like. For example, the subpixel PS preferably detects infrared light. Thus, touch sensing is possible even in a dark place.

Here, the touch sensor or the near touch sensor can detect an approach or contact of an object (e.g., a finger, a hand, or a pen). The touch sensor can detect the object when the display apparatus and the object come in direct contact with each other. Furthermore, the near touch sensor can detect the object even when the object is not in contact with the display apparatus. For example, the display apparatus is preferably capable of sensing an object positioned in the range of 0.1 mm to 300 mm inclusive, more preferably 3 mm to 50 mm inclusive from the display apparatus. This structure enables the display apparatus to be operated without direct contact of an object. In other words, the display apparatus can be operated in a contactless (touchless) manner. With the above-described structure, the display apparatus can be controlled with a reduced risk of making the display apparatus dirty or damaging the display apparatus or without the object directly touching a dirt (e.g., dust, bacteria, or a virus) attached to the display apparatus.

Note that the non-contact sensor function can also be referred to as a hover sensor function, a hover touch sensor function, a near-touch sensor function, a touchless sensor function, or the like. The touch sensor function can also be referred to as a direct touch sensor function or the like.

The refresh rate of the display apparatus of one embodiment of the present invention can be variable. For example, the refresh rate is adjusted (in the range from 0.01 Hz to 240 Hz, for example) in accordance with contents displayed on the display apparatus, whereby power consumption can be reduced. Moreover, driving with a lowered refresh rate that enables the power consumption of the display apparatus may be referred to as idling stop (IDS) driving.

In addition, the drive frequency of a touch sensor or a near touch sensor may be changed depending on the above refresh rate. In the case where the refresh rate of the display apparatus is 120 Hz, for example, the drive frequency of a touch sensor or a near touch sensor can be higher than 120 Hz (typically 240 Hz). With this structure, low power consumption can be achieved and the response speed of the touch sensor or the near touch sensor can be increased.

For high-resolution image capturing, the subpixel PS is preferably provided in every pixel included in the display apparatus. Meanwhile, in the case where the subpixel PS is used in a touch sensor, a near touch sensor, or the like, high accuracy is not required as compared to the case of capturing an image of a fingerprint or the like; accordingly, the subpixel PS is provided in some subpixels in the display apparatus. When the number of subpixels PS included in the display apparatus is smaller than the number of subpixels R or the like, higher detection speed can be achieved.

Figure 24E:
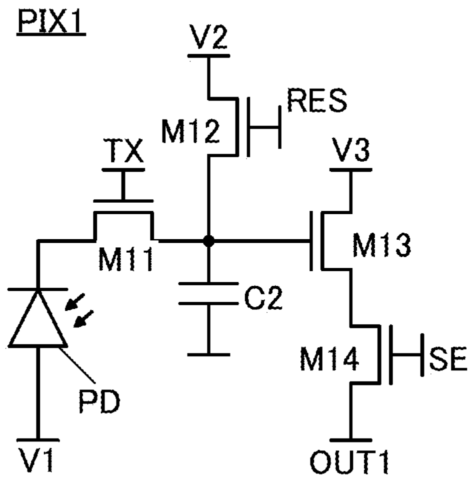
FIGS. 24E and 24F show examples of pixel circuit diagrams.
Figure 24F:
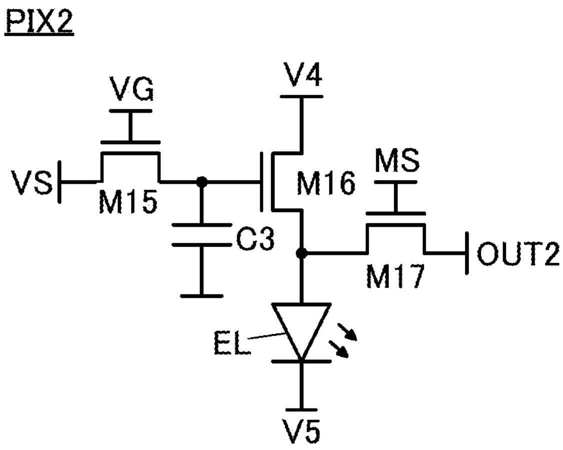

FIG. 24E shows an example of the pixel circuit of the subpixel including a light-receiving device. FIG. 24F shows an example of the pixel circuit of the subpixel including a light-emitting device.

A pixel circuit PIX1 illustrated in FIG. 24E includes a light-receiving device PD, a transistor M11, a transistor M12, a transistor M13, a transistor M14, and a capacitor C2. Here, a photodiode is used as an example of the light-receiving device PD.

An anode of the light-receiving device PD is electrically connected to a wiring V1, and a cathode of the light-receiving device PD is electrically connected to one of a source and a drain of the transistor M11. A gate of the transistor M11 is electrically connected to a wiring TX, and the other of the source and the drain of the transistor M11 is electrically connected to one electrode of the capacitor C2, one of a source and a drain of the transistor M12, and a gate of the transistor M13. A gate of the transistor M12 is electrically connected to a wiring RES, and the other of the source and the drain of the transistor M12 is electrically connected to a wiring V2. One of a source and a drain of the transistor M13 is electrically connected to a wiring V3, and the other of the source and the drain of the transistor M13 is electrically connected to one of a source and a drain of the transistor M14. A gate of the transistor M14 is electrically connected to a wiring SE, and the other of the source and the drain of the transistor M14 is electrically connected to a wiring OUT1.

A constant potential is supplied to the wiring V1, the wiring V2, and the wiring V3. When the light-receiving device PD is driven with a reverse bias, the wiring V2 is supplied with a potential higher than the potential of the wiring V1. The transistor M12 is controlled by a signal supplied to the wiring RES and has a function of resetting the potential of a node connected to the gate of the transistor M13 to a potential supplied to the wiring V2. The transistor M11 is controlled by a signal supplied to the wiring TX and has a function of controlling the timing at which the potential of the node changes, in accordance with a current flowing through the light-receiving device PD. The transistor M13 functions as an amplifier transistor for outputting a signal corresponding to the potential of the node. The transistor M14 is controlled by a signal supplied to the wiring SE and functions as a selection transistor for reading an output corresponding to the potential of the node by an external circuit connected to the wiring OUT1.

A pixel circuit PIX2 illustrated in FIG. 24F includes a light-emitting device EL, a transistor M15, a transistor M16, a transistor M17, and a capacitor C3. Here, a light-emitting diode is used as an example of the light-emitting device EL. In particular, an organic EL element is preferably used as the light-emitting device EL.

A gate of the transistor M15 is electrically connected to a wiring VG, one of a source and a drain of the transistor M15 is electrically connected to a wiring VS, and the other of the source and the drain of the transistor M15 is electrically connected to one electrode of the capacitor C3 and a gate of the transistor M16. One of a source and a drain of the transistor M16 is electrically connected to a wiring V4, and the other of the source and the drain of the transistor M16 is electrically connected to an anode of the light-emitting device EL and one of a source and a drain of the transistor M17. A gate of the transistor M17 is electrically connected to a wiring MS, and the other of the source and the drain of the transistor M17 is electrically connected to a wiring OUT2. A cathode of the light-emitting device EL is electrically connected to a wiring V5.

A constant potential is supplied to the wiring V4 and the wiring V5. The anode of the light-emitting device EL can be set to a high potential, and the cathode can be set to a lower potential than the anode. The transistor M15 is controlled by a signal supplied to the wiring VG and functions as a selection transistor for controlling a selection state of the pixel circuit PIX2. The transistor M16 functions as a driving transistor that controls a current flowing through the light-emitting device EL in accordance with a potential supplied to the gate of the transistor M16. When the transistor M15 is on, a potential supplied to the wiring VS is supplied to the gate of the transistor M16, and the luminance of the light-emitting device EL can be controlled in accordance with the potential. The transistor M17 is controlled by a signal supplied to the wiring MS and has a function of outputting a potential between the transistor M16 and the light-emitting device EL to the outside through the wiring OUT2.

Here, transistors in which a metal oxide (an oxide semiconductor) is used in a semiconductor layer where a channel is formed are preferably used as the transistors M11, M12, M13, and M14 included in the pixel circuit PIX1 and the transistors M15, M16, and M17 included in the pixel circuit PIX2.

A transistor using a metal oxide having a wider band gap and a lower carrier density than silicon achieves an extremely low off-state current. Therefore, owing to the low off-state current, charge accumulated in a capacitor that is connected in series to the transistor can be retained for a long time. Hence, it is particularly preferable to use transistors containing an oxide semiconductor as the transistors M11, M12, and M15 each of which is connected in series with the capacitor C2 or the capacitor C3. When the other transistors also include an oxide semiconductor, the manufacturing cost can be reduced. However, one embodiment of the present invention is not limited thereto. A transistor in which silicon is used in a semiconductor layer (hereinafter, also referred to as a Si transistor) may be used.

Note that the off-state current per micrometer of channel width of an OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude.

Note that the display apparatus of one embodiment of the present invention has a structure including the OS transistor and the light-emitting element having a metal maskless (MML) structure. With this structure, the leakage current that might flow through the transistor and the leakage current that might flow between adjacent light-emitting elements (also referred to as a lateral leakage current, a side leakage current, or the like) can become extremely low. In addition, when an image is displayed on the display apparatus having this structure, the user can notice one or more of crispness, sharpness, and a high contrast ratio of an image. Note that when the leakage current that might flow through a transistor and the side leakage current between light-emitting elements are extremely low, light leakage or the like that might occur in black display can be reduced as much as possible (such display is also referred to as completely black display). In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

To increase the luminance of the light-emitting device included in the pixel circuit, the amount of current fed through the light-emitting device needs to be increased. To increase the current amount, the source-drain voltage of a driving transistor included in the pixel circuit needs to be increased. An OS transistor has a higher withstand voltage between a source and a drain than a Si transistor; hence, high voltage can be applied between the source and the drain of the OS transistor. Thus, with use of an OS transistor as the driving transistor included in the pixel circuit, a high voltage can be applied between a source and a drain of the OS transistor, so that the amount of current flowing through the light-emitting device can be increased and the emission luminance of the light-emitting device can be increased.

When transistors operate in a saturation region, a change in source-drain current relative to a change in gate-source voltage can be smaller in an OS transistor than in a Si transistor. Accordingly, when an OS transistor is used as the driving transistor in the pixel circuit, the amount of current flowing between the source and the drain can be set minutely by a change in gate-source voltage; hence, the amount of current flowing through the light-emitting device can be controlled minutely. Therefore, the emission luminance of the light-emitting device can be controlled minutely (the number of gray levels in the pixel circuit can be increased).

Regarding saturation characteristics of current flowing when transistors operates in a saturation region, even in the case where the source-drain voltage of an OS transistor increases gradually, a more stable constant current (saturation current) can be fed through the OS transistor than through a Si transistor. Thus, by using an OS transistor as the driving transistor, a stable constant current can be fed through light-emitting devices that contain an EL material even when the current-voltage characteristics of the light-emitting devices vary, for example. In other words, when the OS transistor operates in the saturation region, the source-drain current hardly changes with an increase in the source-drain voltage; hence, the luminance of the light-emitting device can be stable.

As described above, by using an OS transistor as the driving transistor included in the pixel circuit, it is possible to prevent black-level degradation, increase the luminance, increase the number of gray levels, and suppress variations in characteristics of light-emitting devices, for example. Therefore, a display apparatus including the pixel circuit can display a clear and smooth image; as a result, any one or more of the image clearness, the image sharpness, and a high contrast ratio can be observed. When the driving transistor included in the pixel circuit has an extremely low off-state current, the display apparatus can perform black display with as little light leakage as possible (completely black display).

Alternatively, transistors using silicon as a semiconductor in which a channel is formed can be used as the transistors M11 to M17. It is particularly preferable to use silicon with high crystallinity, such as single crystal silicon or polycrystalline silicon, because high field-effect mobility can be achieved and higher-speed operation can be performed.

Alternatively, a transistor including an oxide semiconductor (an OS transistor) may be used as at least one of the transistors M11 to M17, and transistors including silicon (Si transistors) may be used as the other transistors. Note that as the Si transistor, a transistor containing low-temperature polysilicon (LTPS) in a semiconductor layer (such a transistor is referred to as an LTPS transistor below) can be used. A structure in which the LTPS transistor and the OS transistor are combined is referred to as LTPO in some cases. By employing LTPO in which an LTPS transistor with a high mobility and an OS transistor with a low off-state current are used, a display panel having high display quality can be provided.

Although n-channel transistors are shown in FIGS. 24E and 24F, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be periodically arranged in one region.

One or more layers including the transistor and/or the capacitor are preferably provided to overlap with the light-receiving device PD or the light-emitting device EL. Thus, the effective area of each pixel circuit can be reduced, and a high-resolution light-receiving portion or display portion can be achieved.

At least part of this embodiment can be implemented in combination with any of the other embodiments described in this specification, as appropriate.

Embodiment 11

Described in this embodiment is a metal oxide (also referred to as an oxide semiconductor) applicable to an OS transistor described in the above embodiment.

A metal oxide used in an OS transistor preferably contains at least indium or zinc, and further preferably contains indium and zinc. A metal oxide preferably contains indium, M (M is one or more of gallium, aluminum, yttrium, tin, copper, silicon, boron, vanadium, beryllium, titanium, iron, nickel, germanium, zirconium, molybdenum, lanthanum, cerium, neodymium, hafnium, tantalum, tungsten, magnesium, and cobalt), and zinc, for example. Specifically, M is preferably one or more selected from gallium, aluminum, yttrium, and tin. Gallium is further preferable.

It is particularly preferable that an oxide containing indium (In), gallium (Ga), and zinc (Zn) (also referred to as IGZO) be used for the semiconductor layer of the transistor. Alternatively, an oxide containing indium (In), aluminum (Al), and zinc (Zn) (also referred to as IAZO) may be used for the semiconductor layer of the transistor. Alternatively, an oxide containing indium (In), aluminum (Al), gallium (Ga), and zinc (Zn) (also referred to as IAGZO) may be used for the semiconductor layer of the transistor.

The metal oxide can be formed by a sputtering method, a CVD method such as a metal organic chemical vapor deposition (MOCVD) method, an ALD method, or the like.

Hereinafter, an oxide containing indium (In), gallium (Ga), and zinc (Zn) is described as an example of a metal oxide. An oxide containing indium (In), gallium (Ga), and zinc (Zn) is sometimes referred to as an In—Ga—Zn oxide.

<Classification of Crystal Structure>

Amorphous (including a completely amorphous structure), c-axis-aligned crystalline (CAAC), nanocrystalline (nc), cloud-aligned composite (CAC), single-crystal, polycrystalline structures, and the like can be given as examples of a crystal structure of an oxide semiconductor.

A crystal structure of a film or a substrate can be analyzed with an X-ray diffraction (XRD) spectrum. For example, evaluation is possible using an XRD spectrum which is obtained by grazing-incidence XRD (GIXD) measurement. Note that a GIXD method is also referred to as a thin film method or a Seemann-Bohlin method. Hereinafter, an XRD spectrum obtained from GIXD measurement is simply referred to as an XRD spectrum in some cases.

For example, the peak of the XRD spectrum of the quartz glass substrate has a bilaterally symmetrical shape. On the other hand, the peak of the XRD spectrum of the In—Ga—Zn oxide film having a crystal structure has a bilaterally asymmetrical shape. The bilaterally asymmetrical peak shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film formed at room temperature. Thus, it is presumed that the In—Ga—Zn oxide film formed at room temperature is in an intermediate state, which is neither a crystal nor polycrystal state nor an amorphous state, and it cannot be concluded that the In—Ga—Zn oxide film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In—Ga—Zn oxide, the CAAC-OS tends to have a layered crystal structure (also referred to as a stacked-layer structure) in which a layer containing indium (In) and oxygen (hereinafter, an In layer) and a layer containing gallium (Ga), zinc (Zn), and oxygen (hereinafter, an (Ga,Zn) layer) are stacked. Indium and gallium can be replaced with each other. Therefore, indium may be contained in the (Ga,Zn) layer. In addition, the gallium may be contained in the In layer. Note that zinc may be contained in the In layer. Such a layered structure is observed as a lattice image in a high-resolution transmission electron microscope (TEM) image, for example.

When the CAAC-OS film is subjected to structural analysis by out-of-plane XRD measurement with an XRD apparatus using θ/2θ scanning, for example, a peak indicating c-axis alignment is detected at or around 2θ=31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Composition of Oxide Semiconductor>>

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that in the following description of a metal oxide, a state in which one or more types of metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

In addition, the CAC-OS has a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region of the CAC-OS in the In—Ga—Zn oxide has [Ga] higher than that in the composition of the CAC-OS film. Alternatively, for example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is intentionally not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas during deposition is preferably as low as possible. For example, the flow-rate proportion of an oxygen gas in the total deposition gas is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a composition in which the regions containing In as a main component (the first regions) and the regions containing Ga as a main component (the second regions) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility (μ) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (on/off function). That is, the CAC-OS has a conducting function in part of the material and has an insulating function in another part of the material; as a whole, the CAC-OS has a function of a semiconductor. Separation of the conducting function and the insulating function can maximize each function. Thus, when the CAC-OS is used for a transistor, high on-state current ($I_{on}$), high field-effect mobility (μ), and excellent switching operation can be achieved.

A transistor including a CAC-OS is highly reliable. Thus, the CAC-OS is suitably used in a variety of semiconductor devices typified by a display apparatus.

An oxide semiconductor can have any of various structures that show various different properties. Two or more of an amorphous oxide semiconductor, a polycrystalline oxide semiconductor, an a-like OS, the CAC-OS, an nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon. Note that an impurity in an oxide semiconductor refers to, for example, elements other than the main components of the oxide semiconductor. For example, an element with a concentration lower than 0.1 atomic % is regarded as an impurity.

<Impurity>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the concentration of hydrogen in the oxide semiconductor, which is measured by SIMS, is controlled to be lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

At least part of this embodiment can be implemented in combination with any of the other embodiments described in this specification, as appropriate.

Embodiment 12

In this embodiment, electronic devices including the display apparatus of one embodiment of the present invention will be described with reference to FIG. 25.

In this embodiment, an example in which the display apparatus described in any one of Embodiments 1 to 3 is provided for a vehicle will be described.

Figure 25:
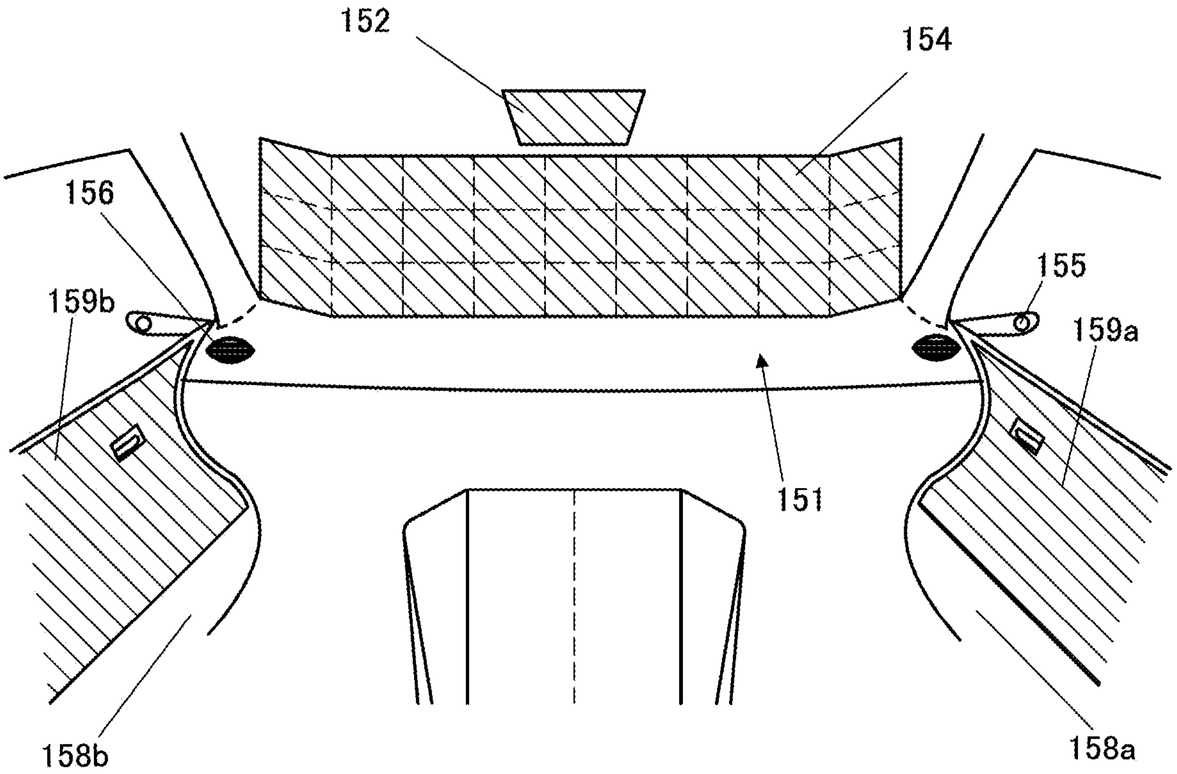
FIG. 25 shows a layout example of the inside of a vehicle.

FIG. 25 shows a structure example of a vehicle. FIG. 25 illustrates a dashboard 151 placed around a driver's seat, a display apparatus 154 fixed in front of the driver's seat, a camera 155, an outlet 156, a door 158*a* on the left side of the driver's seat, a door 158*b* on the right side of the driver's seat, and the like. The display apparatus 154 extends in front of the driver's seat.

As the display apparatus 154 fixed in front of the driver's seat, the display apparatus described in any one of Embodiments 1 to 3 can be used. FIG. 25 shows an example in which the display apparatus 154 is one display surface consisting of light-emitting devices arranged in a matrix of three columns and nine rows, i.e., 27 light-emitting devices in total. Although a boundary between pixel regions is indicated by a dotted line in FIG. 25, the dotted line is not included in an actual display image and a seam is not generated or is less noticeable. Moreover, the display apparatus 154 may have a see-through structure including a light-transmitting region through which the outside can be seen.

The display apparatus 154 is preferably provided with a touch sensor or a non-contact proximity sensor. Alternatively, the display apparatus 154 is preferably operated by gestures with use of a camera or the like that is separately provided.

Although FIG. 25 illustrates a vehicle capable of autonomous driving having no handle (also referred to as steering wheel), the present invention is not limited thereto. A handle may be provided, the handle may be provided with a display apparatus having a curved surface, and the structure described in Embodiment 1 or 2 can be employed.

In addition, a plurality of cameras 155 that capture images of the situations on the rear side may be provided outside the vehicle. Although the camera 155 is set instead of a side mirror in the example in FIG. 25, both the side mirror and the camera may be set. As the cameras 155, a CCD camera, a CMOS camera, or the like can be used. In addition, an infrared camera may be used in combination with such cameras. The infrared camera whose output level increases as the temperature of the object increases can detect or extract a living body such as that of a human or an animal.

An image taken by the camera 155 can be output to the display apparatus 154. The display apparatus 154 is mainly used for drive support. An image of the situation on the rear side is taken at a wide angle of view by the camera 155, and the image is displayed on the display apparatus 154 so that the driver can see a blind area to avoid an accident.

Furthermore, a distance image sensor may be provided, for example, over a roof of the vehicle, and an image obtained by the distance image sensor may be displayed on the display apparatus 154. For the distance image sensor, an image sensor, LIDAR (Light Detection and Ranging), or the like can be used. An image obtained by the image sensor and the image obtained by the distance image sensor are displayed on the display apparatus 154, whereby more information can be provided to the driver to support driving.

In addition, a display apparatus 152 having a curved surface can be provided inside a roof of the vehicle, that is, in a roof portion, for example. In the case where the display apparatus 152 having a curved surface is provided in the roof portion or the like, the display apparatus described in Embodiment 1 or 2 can be used.

The display apparatus 152 and the display apparatus 154 may also have a function of displaying map information, traffic information, television images, DVD images, and the like.

The image displayed on the display apparatus 154 can be freely set to meet the driver's preference. For example, television images, DVD images, or online videos can be displayed on an image region on the left side, map information can be displayed on an image region or the like at the center, and meters such as a speed meter and a tachometer can be displayed on an image region on the right side.

In FIG. 25, a display apparatus 159*a* and a display apparatus 159*b* are provided along a surface of a door 158*a* on the left side and a surface of a door 158*b* on the right side, respectively. The display apparatuses 159*a* and 159*b* can each be formed using one or more light-emitting devices. For example, one display surface is formed using light-emitting devices arranged in one row and three columns.

The display apparatus 159*a* and the display apparatus 159*b* are provided to face each other.

A display apparatus having an image capturing function is preferably used as at least one of the display apparatuses 152, 154, 159*a*, and 159*b*.

For example, when the driver touches an image region of at least one of the display apparatuses 152, 154, 159*a*, and 159*b*, biological authentication such as fingerprint authentication or palm print authentication can be performed. The vehicle may have a function of setting an environment to meet the driver's preference in the case where the driver is authenticated by biological authentication. For example, one or more of adjustment of the position of the driver's seat, adjustment of the position of the handle, adjustment of the position of the camera 155, setting of brightness, setting of an air conditioner, setting of the speed (frequency) of wipers, volume setting of audio, and reading of the playlist of the audio are preferably performed after authentication.

Alternatively, a vehicle can be brought into a state where the vehicle can be driven, e.g., a state where an engine is started or a state where an electric vehicle can be started after the driver is authenticated by biological authentication. This is preferable because a key, which is conventionally necessary, is unnecessary.

Although the display apparatus that surrounds the driver's seat is described here, a display apparatus can be provided to surround also a passenger on a rear seat.

As described above, the structure of one embodiment of the present invention improves flexibility in design of a display apparatus and thus can improve design of the display apparatus. The display apparatus of one embodiment of the present invention can be suitably used in a vehicle or the like.

At least part of this embodiment can be implemented in combination with any of the other embodiments described in this specification, as appropriate.

EXAMPLE

In this example, an experiment was performed in which end portions of display panels were cut by laser light irradiation, and the two display panels were made to overlap with each other and then observed from the above.

Figure 26A:
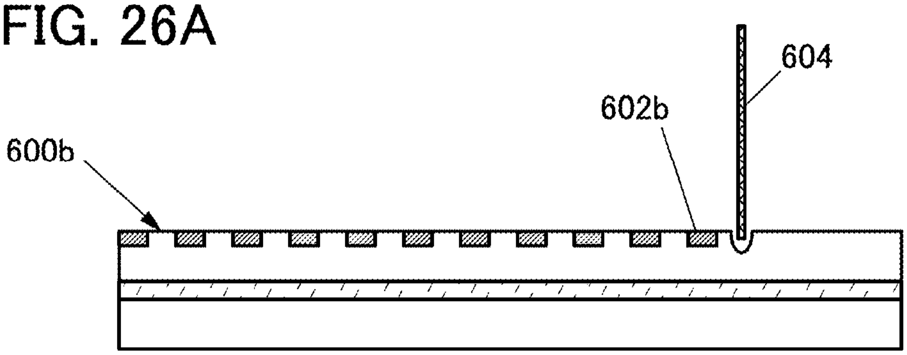
FIGS. 26A to 26D show an example of a manufacturing process in Example 1.

FIG. 26A illustrates the second display panel 600*b* provided with the black matrix 602*b*. FIG. 26A is a cross-sectional view illustrating a state where laser processing is performed. In this example, a YAG laser light with a wavelength of 266 nm was used.

Figure 26B:
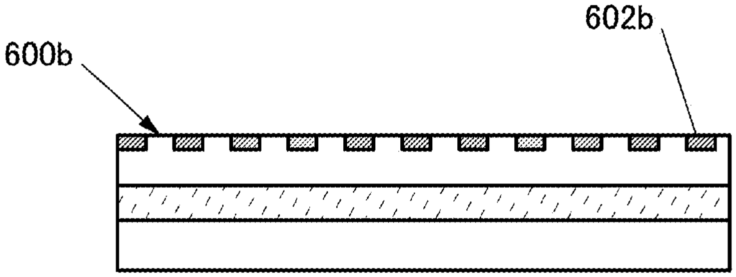

FIG. 26B illustrates the state where the end portion was cut by the laser processing.

Although not illustrated here, an end portion of the first display panel 600*a* provided with the black matrix 602*a* was subjected to laser processing.

Figure 26C:
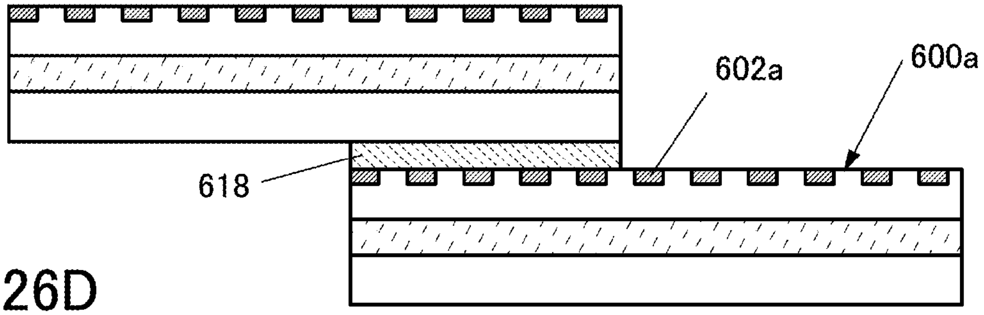

Next, as illustrated in FIG. 26C, the first display panel 600*a* and the second display panel 600*b* are made to overlap with each other while being fixed by a resin 618 for adhesion. A portion where the display panels overlap with each other is a seam. The seam is a region where the display panels overlap with each other, that is, a region having a width. Note that the display panels are fixed so that the black matrix 602*a* of the first display panel 600*a* and the black matrix 602*b* of the second display panel 600*b* overlap with each other when seen from the above.

Figure 26D:
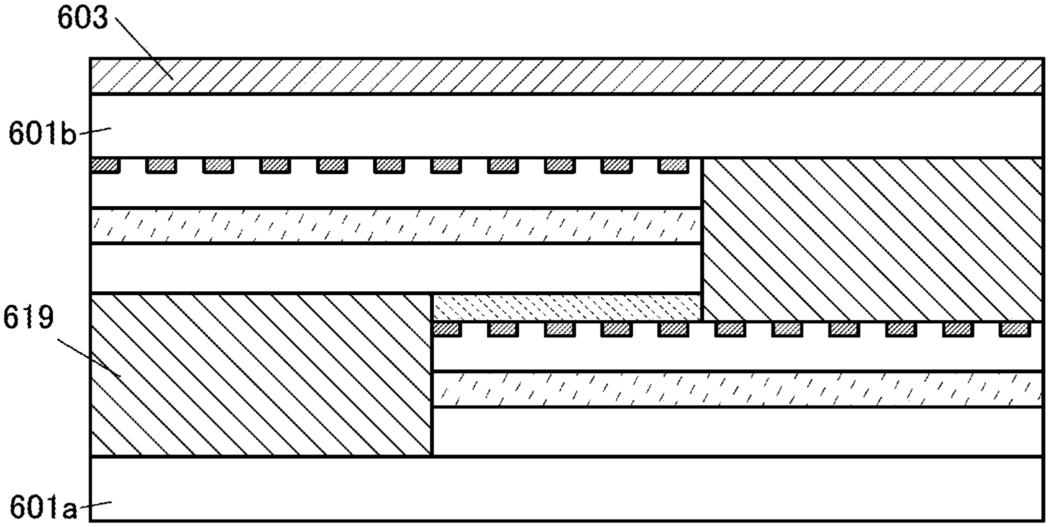

As illustrated in FIG. 26D, a space between the acrylic resin substrate 601*a* and the second display panel 600*b* and a space between the acrylic resin substrate 601*b* and the first display panel 600*a* were filled with a resin 619 for filling. As the resin 618 for adhesion and the resin 619 for filling, an epoxy resin with a refractive index of 1.55 was used.

Figure 27A:
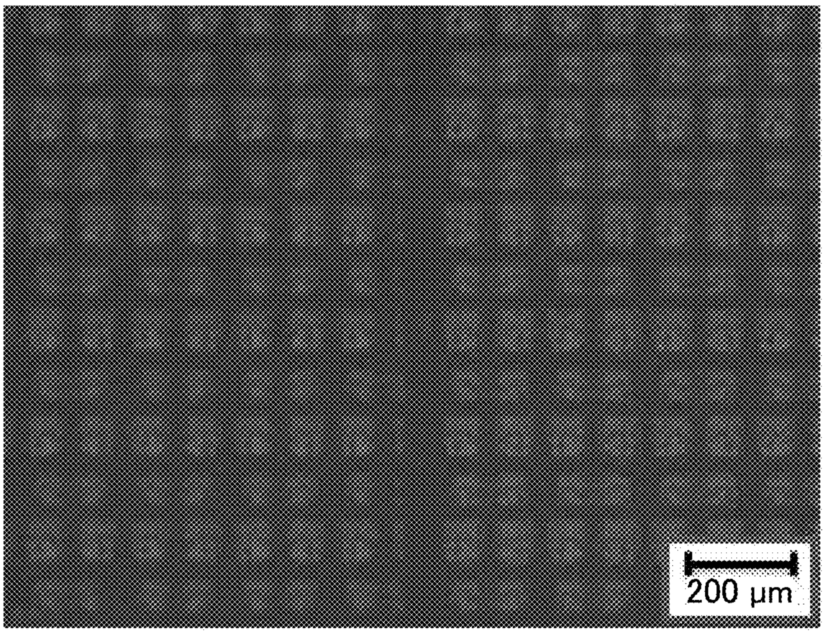
FIG. 27A is a micrograph of the vicinity of a boundary between display panels of Example 1 observed from above.

FIG. 27A is a micrograph of a portion observed from the above, where the first display panel 600*a* and the second display panel 600*b* overlap with each other in the sample obtained through the above-described procedure.

Figure 27B:
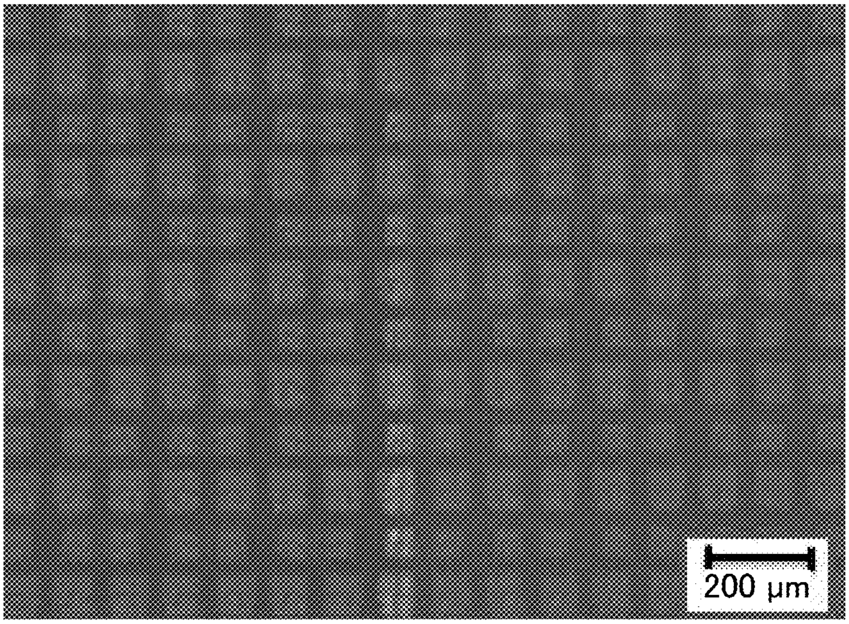
FIG. 27B is a micrograph of a comparative example.

As a comparative example, a sample was fabricated using not laser light but a physical blade (a super cutter). The sample was fabricated through the above-described procedure except for a method for cutting end portions of display panels. FIG. 27B is a micrograph of the comparative sample.

A seam in the micrograph of FIG. 27A was less likely to be seen than that in the comparative example of FIG. 27B.

Figure 28A:
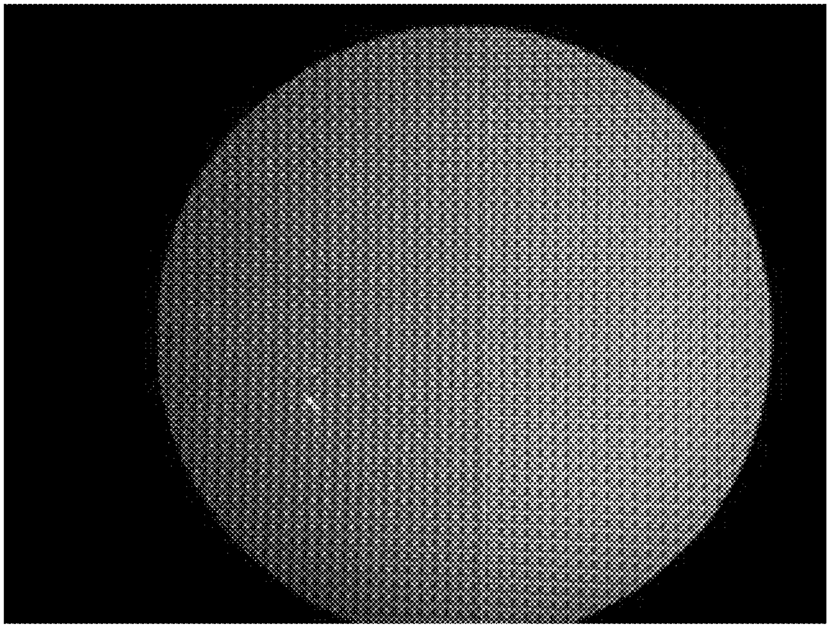
FIG. 28A is a micrograph of the vicinity of a boundary between display panels, with which a circular polarizing plate overlaps, of Example 1 observed from above.
Figure 28B:
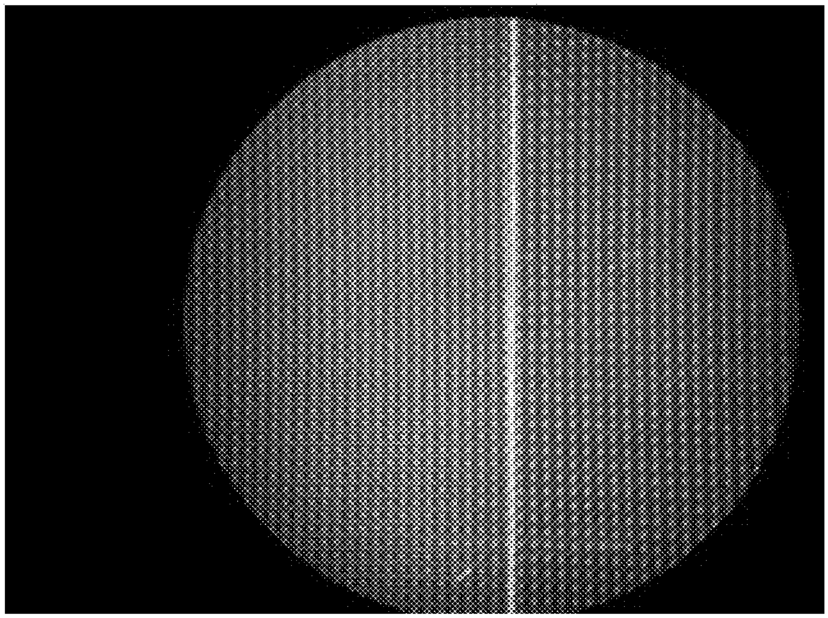
FIG. 28B is a micrograph of a comparative example.

FIG. 28A is a micrograph taken from the above of the sample in which a circular polarizing plate 603 further overlaps with the acrylic resin substrate 601*b*. FIG. 28B is a micrograph taken from the above of the comparative example in which the circular polarizing plate 603 further overlaps with the acrylic resin substrate 601*b*.

A seam in the micrograph of FIG. 28A was hardly seen compared with that in FIG. 28B.

This application is based on Japanese Patent Application Serial No. 2021-089418 filed with Japan Patent Office on May 27, 2021, the entire contents of which are hereby incorporated by reference.

What is claimed is:

1. A display apparatus comprising:

a first element layer;

a first light-emitting element layer over the first element layer;

a second element layer;

a second light-emitting element layer over the second element layer;

a first driver circuit portion in the first element layer; and a second driver circuit portion in an end portion of the first element layer, wherein a boundary surface between the first element layer and the second element layer is a first boundary surface in a depth direction, wherein a boundary surface between the first element layer and the second light-emitting element layer is a second boundary surface in a width direction, wherein the first boundary surface and the second boundary surface are in contact with each other, wherein the display apparatus comprises a first pixel and a second pixel, wherein the first pixel comprises a first light-emitting element in the first light-emitting element layer and a first transistor on the first driver circuit portion, wherein the second pixel comprises a second light-emitting element in the second light-emitting element layer and a second transistor on the second driver circuit portion, wherein the first transistor is electrically connected to the first light-emitting element, wherein the second transistor is electrically connected to the second light-emitting element, and wherein the second light-emitting element and the second driver circuit portion overlap each other.

2. The display apparatus according to claim 1, wherein the first element layer, the second element layer, the first light-emitting element layer, and the second light-emitting element layer are sandwiched between a pair of light-transmitting films.

3. The display apparatus according to claim 1, further comprising a polarizing film overlapping with the first light-emitting element layer and the second light-emitting element layer.

4. The display apparatus according to claim 1, wherein the first light-emitting element layer and the second light-emitting element layer are fixed to a member having a curved surface.

5. An electronic device comprising the display apparatus according to claim 1.

* * * * *